US008443329B2

(12) United States Patent
McConaghy

(10) Patent No.: US 8,443,329 B2
(45) Date of Patent: May 14, 2013

(54) TRUSTWORTHY STRUCTURAL SYNTHESIS AND EXPERT KNOWLEDGE EXTRACTION WITH APPLICATION TO ANALOG CIRCUIT DESIGN

(75) Inventor: Trent Lorne McConaghy, Vancouver (CA)

(73) Assignee: Solido Design Automation Inc., Saskatoon, Saskatchewan (CA)

( * ) Notice: Subject to any disclaimer, the term of this patent is extended or adjusted under 35 U.S.C. 154(b) by 479 days.

(21) Appl. No.: 12/466,894

(22) Filed: May 15, 2009

(65) Prior Publication Data
US 2009/0307638 A1 Dec. 10, 2009

Related U.S. Application Data

(60) Provisional application No. 61/053,925, filed on May 16, 2008, provisional application No. 61/057,229, filed on May 30, 2008.

(51) Int. Cl.
| G06F 17/50 | (2006.01) |
| G06F 11/22 | (2006.01) |
| G06F 9/44 | (2006.01) |
| G06F 9/45 | (2006.01) |

(52) U.S. Cl.
USPC ........... 716/136; 716/101; 716/106; 717/107; 717/108; 703/22

(58) Field of Classification Search .................. None
See application file for complete search history.

(56) References Cited

U.S. PATENT DOCUMENTS

| 6,968,517 B2 * | 11/2005 | McConaghy | 716/102 |
| 7,162,402 B2 * | 1/2007 | Daems et al. | 703/13 |
| 7,703,050 B2 * | 4/2010 | Hershenson et al. | 716/132 |
| 7,707,533 B2 * | 4/2010 | McConaghy et al. | 716/119 |
| 7,761,834 B2 * | 7/2010 | McConaghy et al. | 716/132 |
| 8,134,935 B2 * | 3/2012 | Chambers | 370/254 |

FOREIGN PATENT DOCUMENTS
WO    WO 02103581 A2 * 12/2002

OTHER PUBLICATIONS

G. Gielen et al., Computer-Aided Design of Analog and Mixed-Signal Integrated Circuits, Proceedings of the IEEE, vol. 88, No. 12, Dec. 2000.*
J. Friedman, Stochastic gradient boosting, J. Computational Statistics & Data Analysis, pp. 367-378, 2002.*

(Continued)

*Primary Examiner* — A. M. Thompson
(74) *Attorney, Agent, or Firm* — Louis B. Allard; Borden Ladner Gervais LLP

(57) ABSTRACT

A system and method that does trustworthy multi-objective structural synthesis of analog circuits, and extracts expert analog circuit knowledge from the resulting tradeoffs. The system defines a space of thousands of possible topologies via a hierarchically organized combination of designer-trusted analog building blocks, the resulting topologies are guaranteed trustworthy. The system can perform a search based on a multi-objective evolutionary algorithm that uses an age-layered population structure to balance exploration vs. exploitation, with operators that make the search space a hybrid between vector-based and tree-based representations. A scheme employing average ranking on Pareto fronts is used to handle a high number of objectives. Good initial topology sizings are quickly generated via multi-gate constraint satisfaction. To explicitly capture expert analog design knowledge, data mining is employed on the sized circuits to: automatically generate a decision tree for navigating from performance specifications to topology choice, to do global nonlinear sensitivity analysis, and to generate analytical models of performance tradeoffs.

20 Claims, 44 Drawing Sheets

OTHER PUBLICATIONS

B. De Smedt, G. Gielen, Watson: Design Space Boundary Exploration and Model Generation for Analog and RF IC Design, IEEE Transactions on COmputer-Aided Design of Integrated Circuits and Systems, vol. 22, No. 2, Feb. 2003.*

G. Gielen et al., An Intelligent Design System for Analogue Integrated Circuits, IEEE, pp. 169-173, 1990.*

Lohn et al., "Automated Analog Circuit Synthesis using a Linear Representation", Proc. ICES, 1998, pp. 125-133.

Koza et al., "Automated Synthesis of Analog Integrated Circuits by Means of Genetic Programming", IEEE Trans. Evolutionary Computation 1(2), Jul. 1997, pp. 109-128.

Grimbleby, "Automatic analogue circuit synthesis using genetic algorithms," Proc. IEE—Circuits, Devices, Systems 147(6), Dec. 2000, pp. 319-323.

Zebulum et al., "Variable length representation in evolutionary electronics," Evolutionary Computation, 8 (1), 2000, pp. 93-120.

Sripramong et al. "The Invention of CMOS Amplifiers Using Genetic Programming and Current-Flow Analysis," IEEE Trans. CAD 21(11), 2002, pp. 1237-1252.

Shibata et al., "Automated design of analog circuits using cell-based structure," Proc. Nasa/DoD Conf. Evolvable Hardware, 2002, pp. 85-92.

Ando et al., "Evolving analog circuits by variable length chromosomes," in Advances in evolutionary computing, A. Ghosh and S. Tsutsui, Eds. New York: Springer, 2003, pp. 643-662.

Chang, et al., "Automated passive filter synthesis using a novel tree representation and genetic programming," IEEE Trans. Evolutionary Computation 10 (1), Feb. 2006, pp. 93-100.

Mattiussi et al. "Analog Genetic Encoding for the Evolution of Circuits and Networks," IEEE Trans. Evolutionary Computation 11(5), 2007, pp. 596-607.

Dastidar et al., "A Synthesis System for Analog Circuits Based on Evolutionary Search and Topological Reuse," IEEE Trans. Ev. Comp. 9(2), Apr. 2005, pp. 211-224.

McConaghy et al., "Genetic Programming in Industrial Analog CAD: Applications and Challenges", Genetic Programming Theory and Practice III, T. Yu and B. Worzel, eds., Springer, 2005, chapter 19, pp. 291-306.

Berkcan et al., "Analog Compilation Based on Successive Decompositions," Proc. DAC, 1988, pp. 369-375.

Fung et al., "Knowledge-Based Analog Circuit Synthesis with Flexible Architecture", in Computer Design: Proc. Int. Conf. VLSI Computers and Processors, 1988, pp. 48-51.

El-Turky et al., "BLADES: An Artificial Intelligence Approach to Analog Circuit Design," IEEE Trans. CAD 86, 1989, pp. 680-692.

Koh et al., "OPASYN: A Compiler for CMOS Operational Amplifiers," IEEE Trans. CAD vol. 9, Feb 1990, pp. 113-125.

Toumazou et al., "ISAID—A Methodology for Automated Analog IC Design," Proc. ISCAS, vol. 1, 1990, pp. 531-555.

Harjani et al., "OASYS: A Framework for Analog Circuit Synthesis," IEEE Trans. CAD 8(12), pp. 1247-1266, 1992.

Stoffels et al., "Ampdes: A Program for the Synthesis of High-Performance Amplifiers", in Euro. Conf. Design Automation, 1992, pp. 474-479.

Antao et al., "ARCHGEN: Automated Synthesis of Analog Systems", IEEE Trans. VLSI 3(2), Jun. 1995, pp. 231-244.

Ning et al., "SEAS: A Simulated Evolution Approach for Analog Circuit Synthesis," Proc. CICC, 1991, pp. 5.2.1-4.

Swings et al., "HECTOR: a Hierarchical Topology-Construction Program for Analog Circuits Based on a Declarative Approach to Circuit Modeling," Proc. CICC, 1991, pp. 5.3.1-4.

Horta et al., "Algorithm-Driven Synthesis of Data Conversion Architectures", IEEE Trans. CAD 10(16), Oct. 1997, pp. 1116-1135.

Doboli et al., "Exploration-Based High-Level Synthesis of Linear Analog Systems Operating at Low/Medium Frequencies", IEEE Trans. CAD 22(11), 2003, pp. 1556-1568.

Martens et al., "Top-down heterogeneous synthesis of analog and mixed-signal systems", Proc. DATE, 2006, pp. 275-280.

Kruiskamp et al., "DARWIN: CMOS Opamp Synthesis by Means of a Genetic Algorithm", Proc. DAC, 1995, pp. 433-438.

Maulik et al., "Integer Programming Based Topology Selection of Cell Level Analog Circuits", IEEE Trans. CAD 14(4), Apr. 1995, pp. 401-412.

Francken et al., "DAISY: A Simulation-Based High-Level Synthesis Tool for Delta-Sigma Modulators", in Proc. ICCAD, 2000, pp. 188-192.

Tang et al., "High-Level Synthesis of Delta-Sigma Modulator Topologies Optimized for Complexity, Sensitivity, and Power Consumption," IEEE Trans. CAD 25(3), Mar. 2006, pp. 597-607.

McConaghy et al., "Genetic Programming with Reuse of Known Designs", In Rick L. Riolo et al., editors, Genetic Programming Theory and Practice V, chapter 10, pp. 161-186. Ann Arbor, 2007.

McConaghy et al., "CAFFEINE: Template-Free Symbolic Model Generation of Analog Circuits via Canonical Form Functions and Genetic Programming", Proc. DATE 2005, Mar. 2005, pp. 1082-1087.

McConaghy et al., "Simultaneous Multi-Topology Multi-Objective Sizing Across Thousands of Analog Circuit Topologies", Proc. DAC, 2007, pp. 944-947.

* cited by examiner

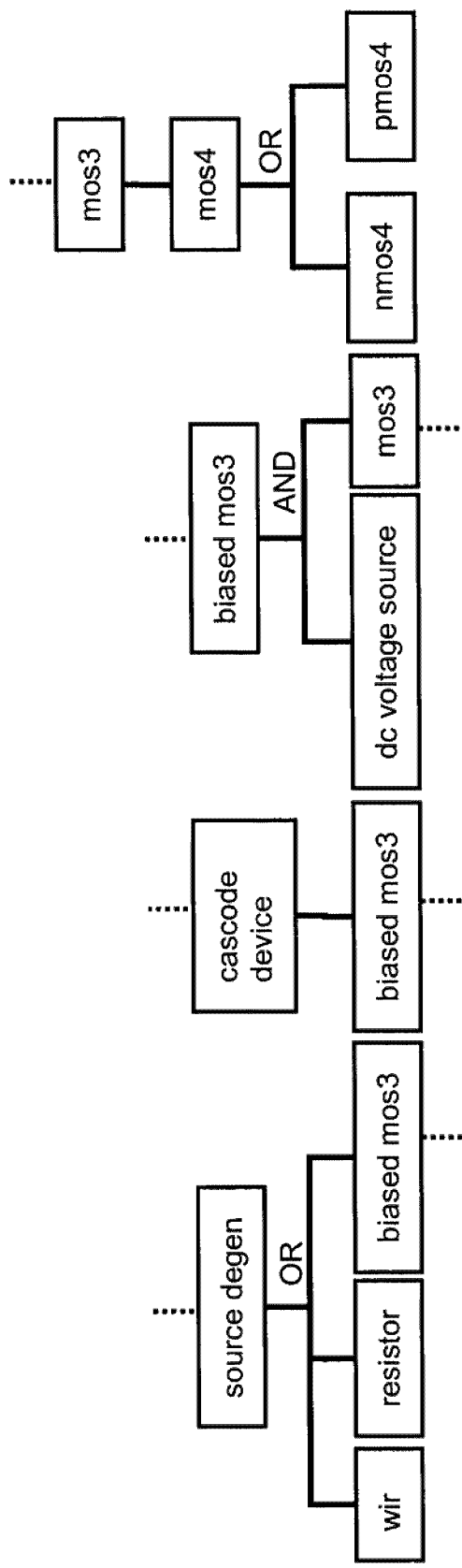

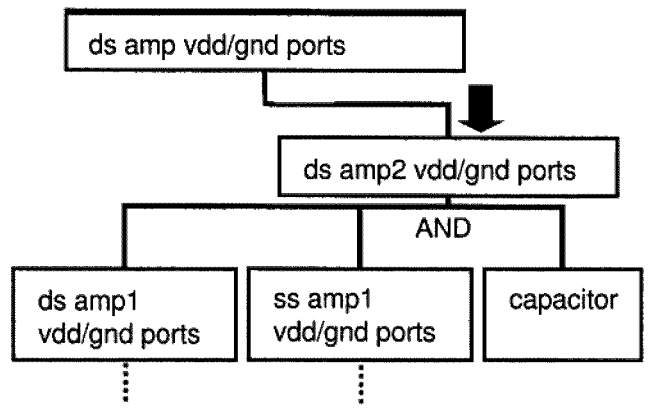
Fig. 11a
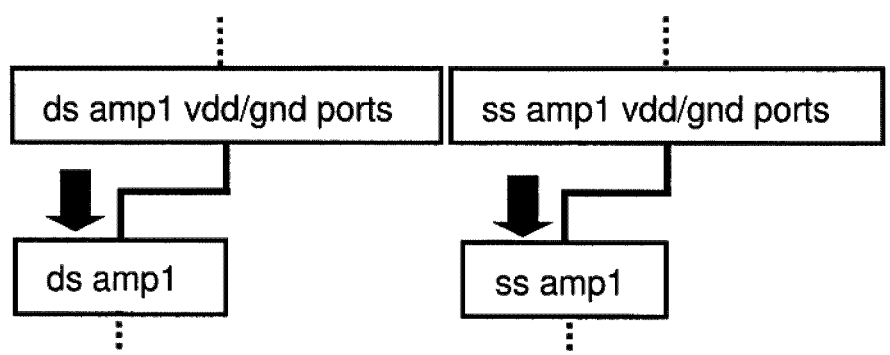
Fig. 11b     Fig. 11c

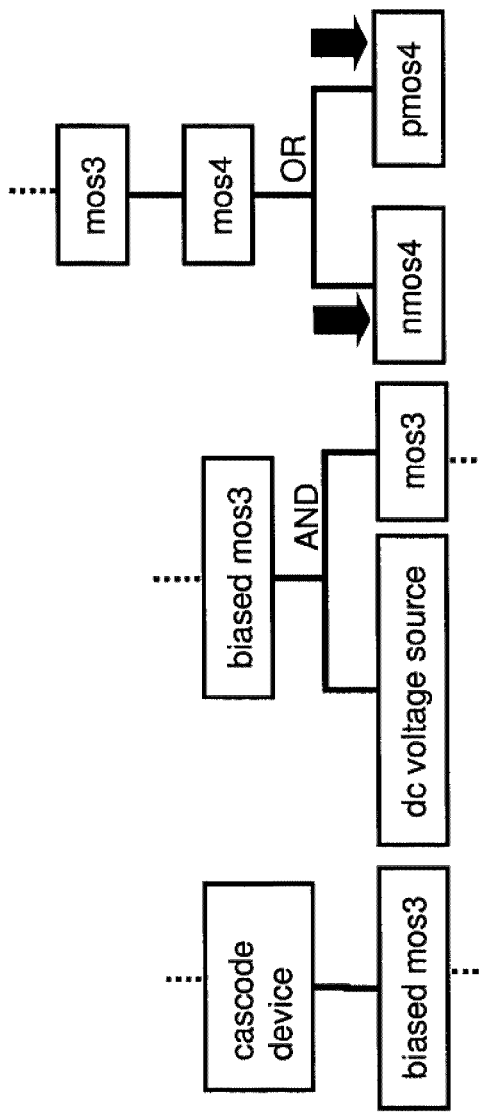

NMOS
amplifier

PMOS
amplifier

NMOS
follower

PMOS
follower

Negative
peak

Positive
peak

Cross-coupled differential pair

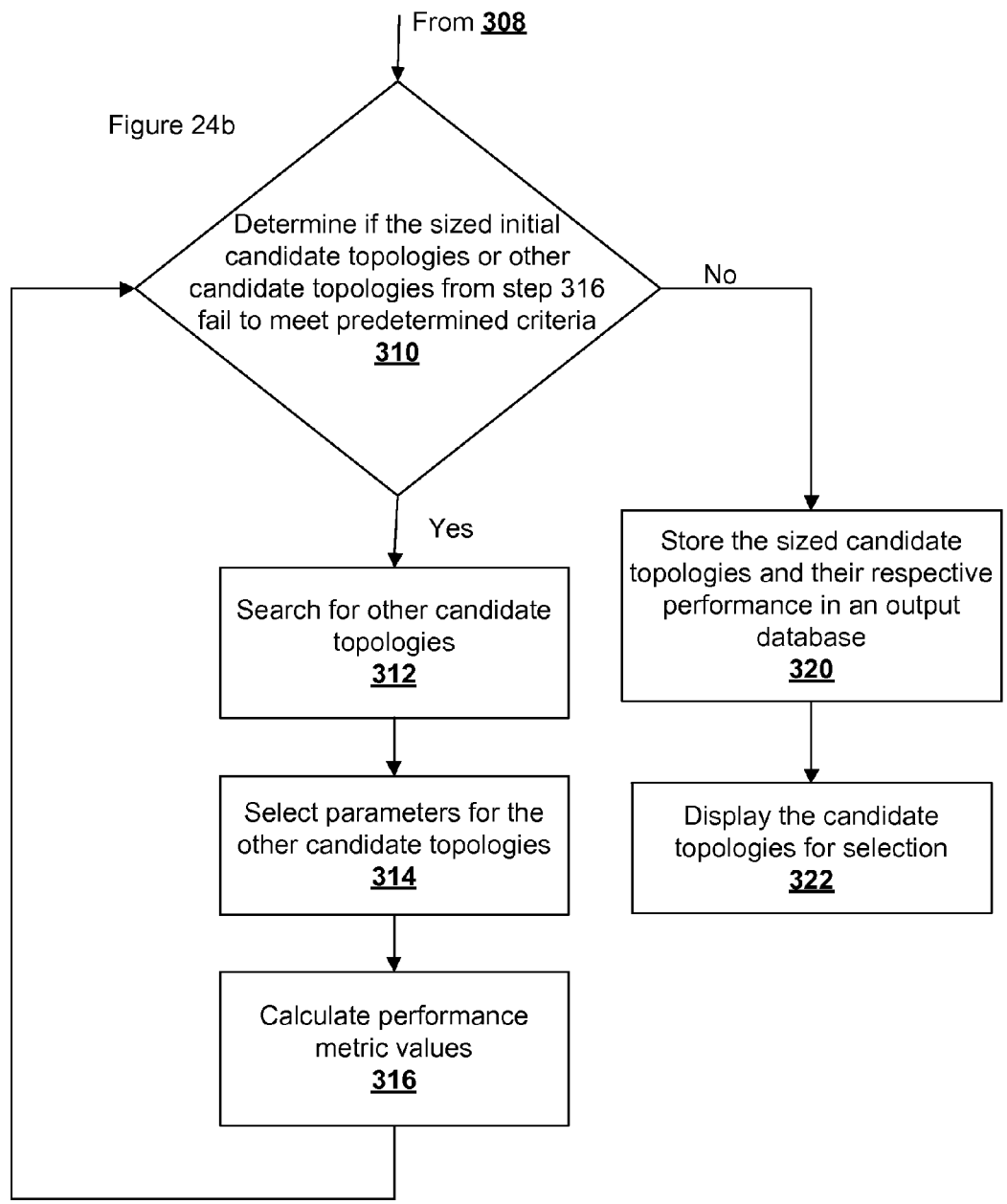

TRUSTWORTHY STRUCTURAL SYNTHESIS AND EXPERT KNOWLEDGE EXTRACTION WITH APPLICATION TO ANALOG CIRCUIT DESIGN

CROSS REFERENCE TO RELATED APPLICATIONS

This application claims the benefit of priority of U.S. Provisional Patent Application No. 61/053,925 filed May 16, 2008, and of U.S. Provisional Patent Application No. 61/057,229 filed May 30, 2008, the contents of which is incorporated herein by reference in their entirety.

FIELD OF THE INVENTION

The applicant acknowledges the participation of K.U. Leuven Research and Development in the development of this invention.

The present invention relates generally to electrical circuit design. More particularly, the present invention relates to analog circuit design using advanced search and optimization techniques and algorithms.

BACKGROUND OF THE INVENTION

The automated design of structures such as robotic structures, car assemblies, and circuit topologies has attracted much attention in the evolutionary computation literature, in part because evolutionary algorithms (EAs) handle non-vector search spaces of structural design problems more naturally than classical optimization algorithms. Of the various possible problems that can be studied through EAs, analog circuit design is an effective "fruitfly" for testing EA synthesis approaches for a number of reasons. First, it has current and future industrial relevance, being a field within the massive semiconductor industry and having a continuous stream of design challenges due to changing semiconductor processes and performance requirements. Second, candidate circuit designs can be evaluated, to an extent, using readily available simulators. Third, there can be several constraints and objectives to which the circuit design is subjected. Also, there may be robustness issues, such as handling environmental factors, manufacturing variation, etc. Further, topology design is considered a creative endeavor: designers refer to themselves as "artists", and new topologies are often published in the scientific literature and/or patented. The combination of these characteristics makes analog circuit design a relevant, challenging application domain for testing EA approaches to structural synthesis.

Many EA approaches of the last decade use variants of genetic programming (GP) to search across unstructured combinations of circuit devices to "invent" circuit structures (i.e., topologies) on the fly, from scratch. Unfortunately, they have to reinvent every circuit structure, despite there being a large set of well-known analog circuit building blocks. If this were automotive design, every run would be literally reinventing the wheels, the transmission, the pistons, the chassis, etc. Furthermore, even if well-known building blocks are appropriate, there is no guarantee that those blocks will be used in order to solve the problem at hand because they will all have to be reinvented on the fly. The authors T. R. Dastidar et al, in "A Synthesis System for Analog Circuits Based on Evolutionary Search and Topological Reuse," IEEE Trans. Ev. Comp. 9(2), April 2005, pp. 211-224 partially overcome this by supplying loosely grouped building blocks for possible use by the system. Unfortunately, this and other past EAs has a tendency to exploit missing goals to return circuits with odd structures or behavior. This is a major issue because one must trust the topology sufficiently to commit millions of dollars to fabricate and test the design. Up-front constraints such as current-mode analysis and Kirchoff's-Law constraints can be added, but plugging such "holes in goals" is tedious and provides no guarantee that the circuit returned to the designer will be trustworthy enough to send for fabrication.

Furthermore, open-ended approach makes EAs extremely computationally intensive, taking weeks or more CPU time to produce an output. Faster CPUs may not solve this because the problem itself is "Anti-Mooreware". That is, as Moore's Law progresses, more issues, such as process variation must be handled, causing higher simulation effort.

The computer-aided design (CAD) literature has approached the analog synthesis problem in different ways. Some approaches such as, for example, BLADES, OASYS, and ISAID pre-define rule-based reasoning or abstract models having transforms to well-known structural descriptions to give trusted topologies, but unfortunately require an up-front setup effort of weeks to months, which must be repeated for each circuit type and each new process node. Other approaches such as, for example, DARWIN and MINLP also give trustworthy circuits by predefining a space of designer-known circuit topologies within a fixed-length vector, where variables enable/disable/choose components. Unfortunately the approaches rely on a sneaky definition of the search space specific to the circuit type. These methods cannot be generalized are restricted to few topologies (e.g., less than 100 topologies).

In addition to the synthesis problems of trust, runtime, setup effort, and generality, past approaches had little emphasis on giving insight back to the designer. While some expert knowledge transfers easily (e.g., building blocks), more specific knowledge such as how topologies relate to specific performance values is hard to keep up-to-date due to changing fabrication processes, requirements, etc. By relying too much on a synthesis tool, the designer could end up poorly equipped when problems arise, such as, for example a previously unseen process issue, e.g., proximity effects.

Further, as Moore's Law captures, the minimum size of transistors in integrated circuits has been decreasing at an exponential rate for several decades. For digital design, the incentive to shrink geometries is high: it means simultaneously smaller area, higher speed, and lower power. However, scaling is less beneficial to analog circuits because mismatch, which limits performance of many analog circuits, worsens as geometries shrink. To cope with mismatch, analog designers can increase device area, use many circuit-level techniques like feedback and differential design, and more recently, shift functionality to digital, and apply calibration. But these approaches only partially scale with Moore's Law because large analog-sized transistors must form the core signal path. As a result, the analog portion of mixed-signal chips risks dominating area. There is a further concern: these approaches all start with a circuit that performs well nominally, then adapt, tune or average out the variation caused by mismatch. While this is reasonable, some fear that analog design will hit a brick wall when there is simply too much process variation to tune around. To illustrate, one can take an example of a gate oxide layer having a thickness of three atoms: one or a few atoms out of place can significantly affect performance.

The design/choice of a cell-level analog circuit topology can have a giant impact on the performance of a system. Currently, industrial topology design is done almost exclusively by hand. A longtime goal has been to automate the design or choice of topology, and there has been significant progress towards the goal via the fields of evolvable hardware (EH) and analog computer-aided design (CAD), but it has not been fully realized because either the synthesized topology has not been sufficiently trustworthy, or the approach does not allow novel functionality and topologies.

Table A shows synthesis approaches, by capability. "Novel functionality" is to be understood as meaning that the approach can be set to a new problem just by changing testbenches, which allows for new types of analog circuit functionality. "Novel structures" is to be understood as meaning that the approach may invent new structures. "Trustworthy" is to be understood as meaning that the results are either designer-trusted by construction, or the new structural novelty is easily identifiable by a designer. "Topology variety" is to be understood as meaning that a set of possible topologies is sufficiently rich that it contains appropriate solution(s) to the target functionality, including problem variants with different objectives and constraint settings. "Reasonable CPU effort" is to be understood in the context of industrial use by a tool user (e.g., a semiconductor company).

Earlier EH research (row 1, Table A) focused on fully open-ended structural synthesis. However, the CPU effort was prohibitive in those approaches, and the results were not only untrustworthy—they often look strange. More recent efforts (row 2, Table A) added domain knowledge to improve efficiency and trustworthiness, but there is still no guarantee of trustworthy results or of trackable novelty.

Early CAD research (row 3, Table A) focused on searching through sets of known topologies, which gave both speed and trustworthy results; unfortunately the number of possible topologies was extremely limited and there was no clear way to generalize the approaches to more problem types. More recent research (rows 4 and 5, Table A) has attempted to merge ideas from both fields: multi-topology and multi-objective searches through combinations of hierarchically-organized designer-specified analog building blocks, thus giving a large set of topologies that can be readily applied to common analog design problems. The entry at row 5, allows for more open-ended structural novelty, but tracking the novelty explicitly and only rewarding novel individuals that actually improve performance. However, both the entries of rows 4 and 5 are constrained to problems that analog designers have attacked; they do not address problems with novel functionality.

TABLE A

| | Topology Synthesis Approach | | | | |
|---|---|---|---|---|---|
| Approach | Novel functionality? | Novel structures? | Trustworthy? | Topology variety? | Reasonable CPU effort? |
| J. R. Koza et al. Genetic Programming IV: Routine Human-Competitive Machine Intelligence. Kluwer (2003) Lohn, J. D, Colombano, S. P. Automated Analog Circuit Synthesis using a Linear Representation. Proc. ICES (1998) 125-133 Shibata, H. et al.: Automated design of analog circuits using cell-based structure. Proc. Nasa/DoD Conf. Evolv. Hardware (2002) | yes | yes | no | yes | no |
| Sripramong, T., Toumazou, C.: The Invention of CMOS Amplifiers Using Genetic Programming and Current-Flow Analysis. IEEE Trans. CAD 21(11) (2002) 1237-1252 Dastidar, T. R. Chakrabarti, P. P., Ray, P.: A Synthesis System for Analog Circuits Based on Evolutionary Search and Topological Reuse. IEEE Trans. EC 9(2) (April 2005) 211-224 Mattiussi, C., Floreano, D.: Analog Genetic Encoding for the Evolution of Circuits and Networks. IEEE Trans. EC 11(5) (2007) 596-607 | yes | yes | no | yes | borderline |
| Kruiskamp, W., Leenaerts, D.: DARWIN: CMOS Opamp Synthesis by Means of a Genetic Algorithm. Proc. DAC (1995) 433-438 Maulik, P., Carley, L., Rutenbar, R. A.: Integer Programming Based Topology Selection of Cell Level Analog Circuits. IEEE Trans. CAD 14(4) (April 1995) 401-412 | no | no | yes | no | yes |
| McConaghy, T., Palmers, P., Gielen, G., and Steyaert, M.: Simultaneous multi-topology multi-objective sizing across thousands of analog circuit topologies. Proc. DAC (2007) 944-947 | no | no | yes | yes | yes |
| McConaghy, T., Palmers, P., Gielen, G., and Steyaert, M.: Genetic programming with design reuse for industrially scalable, novel circuit design. GP Theory and Practice V, Springer (2007) 159-184 | no | yes | yes | yes | yes |

Therefore, it is desirable to provide a method of designing analog circuits that is naturally robust to variations without needing tuning and yet scales with Moore's Law, i.e., uses the smallest possible transistors. It is also desirable to provide a method of designing analog circuits that have trustworthy topologies and to provide a method of extracting knowledge from the trustworthy topologies in order to provide insight to the designer.

SUMMARY OF THE INVENTION

In a first aspect, the present disclosure provides a method of selecting a structure and parameters of an electrical circuit component (ECC), the ECC having design variables, the ECC further having performance metrics, each performance metric being a function of at least one design variable. The method comprises the following steps. (a) Storing an arrangement of pre-defined, hierarchically interconnected building blocks of the ECC into a building block database, each building block representing a sub-circuit of the ECC, each building block having respective input parameters, the building blocks including atomic blocks, compound blocks, and flexible blocks, each individual compound block having at least one of a first atomic block, a first compound block and a first flexible block, each individual flexible block having alternative building blocks selectable through a choice parameter of each individual flexible block, each alternative block including at least one of an second atomic block, a second compound block and a second flexible block, the arrangement of pre-defined, hierarchically interconnected building blocks representing candidate topologies of the ECC; (b) Selecting candidate topologies from the building block database to obtain initial candidate topologies; (c) Selecting initial parameters for the initial topologies to obtained sized initial candidate topologies; (d) Calculating performance metric values for the sized initial candidate topologies to obtain calculated performance metric values; (e) In accordance with the calculated performance metric values, determining if the sized initial candidate topologies fail to meet pre-determined criteria; (f) While the sized initial candidate topologies fail to meet a pre-determined criteria, in accordance with a search algorithm: (i) searching the candidate topologies for other candidate topologies; (ii) selecting parameters for the other candidate topologies to obtain sized other candidate topologies; (iii) calculating performance metric values for the sized other candidate topologies to obtain other calculated performance metric values; and (iv) in accordance with the other calculated performance metric values, determining if the sized other candidate topologies fail to meet the pre-determined criteria; (g) Storing, in an output database, sized candidate topologies, and their respective performance values, that do meet the pre-determined criteria; and (h) Displaying, for selection, the sized candidate topologies that meet the pre-determined criteria.

In second aspect, the present disclosure provides, for an electrical circuit design (ECD) having associated thereto design variables, performance metrics, and a set of training data, each member of the set including a design vector associated with a corresponding training performance metric value, each design vector having components, each component corresponding to a respective design variable value, a computer-implemented method to calculate sensitivities of a performance metric with respect to the design variables. The method comprises the following steps. (A) In accordance with the training data, automatically generating a nonlinear regression model of the performance metric as a function of the design variables; (B) For each design variable, (i) generating N copies of the set of training data, N being a positive integer; (ii) for each copy, randomly interchanging values associated with the respective design variable, to obtain N modified copies, each of the N modified copies including modified design vectors; (iii) for each modified design vector, calculating a modified performance metric value; and (iv) for each modified design vector, calculating a performance metric error value in accordance the modified performance metric value and the respective training performance metric value; and, (C) In accordance with the performance metric error values, determining a relative sensitivity of the performance metric with respect to the design variables.

In a third aspect, the present invention provides a method of selecting a structure and parameters of an electrical circuit component (ECC), the ECC having design variables, the ECC further having a target analog response. The method comprises the following steps: (A) Storing an arrangement of pre-defined, hierarchically interconnected building blocks of the ECC into a building block database, each building block representing a sub-circuit of the ECC, each building block having respective input parameters, the building blocks including atomic blocks, compound blocks, and flexible blocks, each individual compound block having at least one of a first atomic block, a first compound block and a first flexible block, each individual flexible block having alternative building blocks selectable through a choice parameter of each individual flexible block, each alternative block including at least one of an second atomic block, a second compound block and a second flexible block, the arrangement of pre-defined, hierarchically interconnected building blocks representing candidate topologies of the ECC; (B) Selecting a candidate topology from the building block database to obtain a selected candidate topology; (C) Selecting initial parameters for the selected candidate topology to obtain a sized candidate topology; (D) Calculating an analog response of the sized candidate topology to obtain a sized candidate topology analog response; (E) determining a relation between the sized candidate topology analog response and the target analog response, to obtain a relation value; (F) If the relation value is greater than a pre-determined relation value: (i) multiplying the sized selected candidate topology by a learning rate to obtain a scaled candidate topology; (ii) adding the scaled candidate topology to an ensemble of topologies; and (ii) modifying the target analog behavior in accordance with the ensemble of topologies, to obtain a modified target analog behavior; (G) While the relation value is lower that a target relation value, iteratively performing steps of: (i) selecting an additional candidate topology from the building block database to obtain an additional selected candidate topology; (ii) selecting initial parameters for the additional selected candidate topology to obtain an additional sized candidate topology; (iii) calculating an analog response of the additional sized candidate topology to obtain an additional sized candidate topology analog response; (iv) determining the relation between the additional sized candidate topology analog response and the modified target analog response, to obtain an additional relation value; and (v) if the additional relation value is greater than a pre-defined relation value: (a) multiplying the additional sized selected candidate topology by the learning rate to obtain an additional scaled candidate topology; (b) adding the additional scaled candidate topology to the ensemble of topologies; and (c) modifying the modified target analog behavior in accordance with the ensemble of topologies, to obtain a further modified, modified target analog behavior; and (H) Writing the ensemble of topologies to an output database. The relation can be a correlation. The step of modifying the target analog behavior in accordance with the ensemble of topologies can include modifying the target analog behavior by subtracting therefrom an analog behavior of the ensemble of topologies.

In a fourth aspect, the present disclosure provides a computer-readable memory having recorded thereon statement and instructions for execution by a computer to carry out a method of selecting a structure and parameters of an electrical circuit component (ECC), the ECC having design variables, the ECC further having performance metrics, each performance metric being a function of at least one design variable. The method comprises the following steps. (a) Storing an arrangement of pre-defined, hierarchically interconnected building blocks of the ECC into a building block database, each building block representing a sub-circuit of the ECC, each building block having respective input parameters, the building blocks including atomic blocks, compound blocks, and flexible blocks, each individual compound block having at least one of a first atomic block, a first compound block and a first flexible block, each individual flexible block having alternative building blocks selectable through a choice parameter of each individual flexible block, each alternative block including at least one of an second atomic block, a second compound block and a second flexible block, the arrangement of pre-defined, hierarchically interconnected building blocks representing candidate topologies of the ECC; (b) Selecting candidate topologies from the building block database to obtain initial candidate topologies; (c) Selecting initial parameters for the initial topologies to obtained sized initial candidate topologies; (d) Calculating performance metric values for the sized initial candidate topologies to obtain calculated performance metric values; (e) In accordance with the calculated performance metric values, determining if the sized initial candidate topologies fail to meet pre-determined criteria; (f) While the sized initial candidate topologies fail to meet a pre-determined criteria, in accordance with a search algorithm: (i) searching the candidate topologies for other candidate topologies; (ii) selecting parameters for the other candidate topologies to obtain sized other candidate topologies; (iii) calculating performance metric values for the sized other candidate topologies to obtain other calculated performance metric values; and (iv) in accordance with the other calculated performance metric values, determining if the sized other candidate topologies fail to meet the pre-determined criteria; (g) Storing, in an output database, sized candidate topologies, and their respective performance values, that do meet the pre-determined criteria; and (h) Displaying, for selection, the sized candidate topologies that meet the pre-determined criteria.

In a fifth aspect, the present disclosure provides a computer-readable memory having recorded thereon statement and instructions for execution by a computer to carry out, for an electrical circuit design (ECD) having associated thereto design variables, performance metrics, and a set of training data, each member of the set including a design vector associated with a corresponding training performance metric value, each design vector having components, each component corresponding to a respective design variable value, a computer-implemented method to calculate sensitivities of a performance metric with respect to the design variables. The method comprises the following steps. (A) In accordance with the training data, automatically generating a nonlinear regression model of the performance metric as a function of the design variables; (B) For each design variable, (i) generating N copies of the set of training data, N being a positive integer; (ii) for each copy, randomly interchanging values associated with the respective design variable, to obtain N modified copies, each of the N modified copies including modified design vectors; (iii) for each modified design vector, calculating a modified performance metric value; and (iv) for each modified design vector, calculating a performance metric error value in accordance the modified performance metric value and the respective training performance metric value; and, (C) In accordance with the performance metric error values, determining a relative sensitivity of the performance metric with respect to the design variables.

In a sixth aspect, the present disclosure provides a computer-readable memory having recorded thereon statement and instructions for execution by a computer to carry out a method of selecting a structure and parameters of an electrical circuit component (ECC), the ECC having design variables, the ECC further having a target analog response. The method comprises the following steps: (A) Storing an arrangement of pre-defined, hierarchically interconnected building blocks of the ECC into a building block database, each building block representing a sub-circuit of the ECC, each building block having respective input parameters, the building blocks including atomic blocks, compound blocks, and flexible blocks, each individual compound block having at least one of a first atomic block, a first compound block and a first flexible block, each individual flexible block having alternative building blocks selectable through a choice parameter of each individual flexible block, each alternative block including at least one of an second atomic block, a second compound block and a second flexible block, the arrangement of pre-defined, hierarchically interconnected building blocks representing candidate topologies of the ECC; (B) Selecting a candidate topology from the building block database to obtain a selected candidate topology; (C) Selecting initial parameters for the selected candidate topology to obtain a sized candidate topology; (D) Calculating an analog response of the sized candidate topology to obtain a sized candidate topology analog response; (E) determining a relation between the sized candidate topology analog response and the target analog response, to obtain a relation value; (F) If the relation value is greater than a pre-determined relation value: (i) multiplying the sized selected candidate topology by a learning rate to obtain a scaled candidate topology; (ii) adding the scaled candidate topology to an ensemble of topologies; and (ii) modifying the target analog behavior in accordance with the ensemble of topologies, to obtain a modified target analog behavior; (G) While the relation value is lower that a target relation value, iteratively performing steps of: (i) selecting an additional candidate topology from the building block database to obtain an additional selected candidate topology; (ii) selecting initial parameters for the additional selected candidate topology to obtain an additional sized candidate topology; (iii) calculating an analog response of the additional sized candidate topology to obtain an additional sized candidate topology analog response; (iv) determining the relation between the additional sized candidate topology analog response and the modified target analog response, to obtain an additional relation value; and (v) if the additional relation value is greater than a pre-defined relation value: (a) multiplying the additional sized selected candidate topology by the learning rate to obtain an additional scaled candidate topology; (b) adding the additional scaled candidate topology to the ensemble of topologies; and (c) modifying the modified target analog behavior in accordance with the ensemble of topologies, to obtain a further modified, modified target analog behavior; and (H) Writing the ensemble of topologies to an output database. The relation can be a correlation. The step of modifying the target analog behavior in accordance with the ensemble of topologies can include modifying the target analog behavior by subtracting therefrom an analog behavior of the ensemble of topologies.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 9a-9i show an exemplary embodiment of an op-amp building blocks library;

FIG. 24a-24b shows an exemplary flowchart of a method of selecting a structure and parameters of an electrical circuit component.

DETAILED DESCRIPTION

The present disclosure provides a system and method for multi-objective and multi-topology (MOJITO) sizing of multi-variable designs (MVDs), such as, for example, electrical circuit designs (ECDs), or any other suitable design field. The present disclosure also provides a system and method for single-objective and multi-topology sizing of MVDs. Additionally, the present disclosure provides an analog circuit design method that can produce an analog circuit design which is naturally robust to variations without requiring tuning and yet, scales with Moore's Law, i.e., uses the smallest possible transistors.

Figure 1:
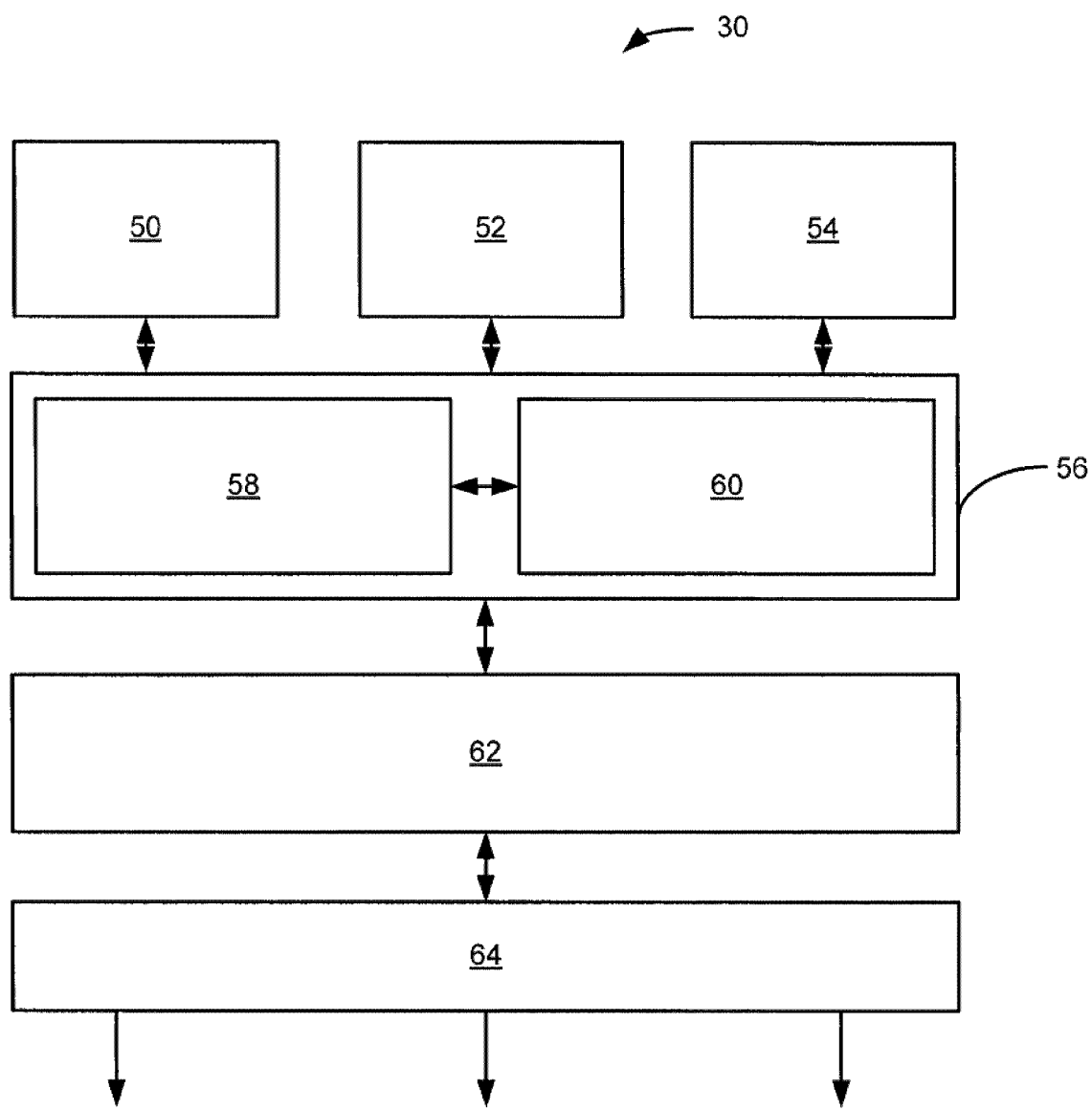
FIG. 1 shows an exemplary embodiment of a system of the present invention.

FIG. 1 shows an exemplary embodiment of a MOJITO system 30 having as input a building blocks database (BBD) 50 containing a pre-determined set of possible topologies representative of an MVD to be optimized and sized by the system 30. As will be described in detail below, the BBD 50 includes designer-specified, hierarchically organized, building blocks. The building blocks are known from the domain knowledge of the MVD in question. For example, it the MVD to be optimized and sized by the system 30 is an ECD, then the domain knowledge is that of electrical circuits and, as such, the building blocks will include, for example, resistors, transistors, MOS devices etc. A test benches, objectives and constraints (TBOC) database 52 and a simulator model files (SMF) database 54, containing respectively test benches, objectives and constraints of the MVD, and simulator model files for the MVD, also act as inputs of the system 30. For example, for ECDs, test benches specify the circuit analysis and test harness to measure performance; objectives and constraints specify the targets of each performance metric; and simulator model files describe how transistors and other electrical components behave for a particular semiconductor process.

The system 30 includes a module 56 that contains a MOJITO engine 58 and a simulator engine 60. The module 56 gathers various inputs from the BBD 50, the TBOC database 52 and the SMF database 54, and passes the inputs to the MOJITO engine 58 and the simulator engine 60 as required. Details on the workings of the MOJITO engine 58 and of the simulator engine 60 will be described below.

The module 60 outputs sized topologies and performance tradeoff data of the MVD to an output database 62 to which is connected an automated knowledge extraction (AKE) engine 64. The AKE engine 64 can output, such as through a display module (not shown), a specification to topology decision tree, a global nonlinear sensitivities of performances, analytical tradeoffs models, and any other suitable extracted knowledge from the output database 62.

As mentioned, in the case where the MVD is an ECD, the BBD 50 includes a a hierarchically organized set of designer-specified building blocks, which can be found in analog circuit textbooks such as, amongst others, K. Laker, W. Sansen, Design of Analog Integrated Circuits and Systems, McGraw-Hill, 1994; D. Johns, K. Martin, Analog Integrated Circuit Design, 1997; B. Razavi, Design of Analog CMOS Integrated Circuits. McGraw-Hill, 2000; and W. Sansen, Analog Design Essentials, Springer, 2006. The building blocks are organized via a grammar to define the set of possible topologies of the MVD. Accordingly, any topology (sentence) drawn randomly from the grammar will be trustworthy by construction. Note that the MOJITO engine 58 needs only structural information; it does not need a special decision rule base, nor does it need abstract models with mappings to refined structures. This makes it straightforward to switch technologies, or even add new building blocks to the library.

As will be understood by the skilled worker, a MOJITO search faces many challenges: enormous search space, long simulation times, any number of objectives, and any number of constraints. As described below, the MOJITO EA meets these challenges through a series of innovations.

MOJITO's combined multi-objective and multi-topology nature means that it generates a new type of data, which is output to the output database 62. This data includes, in the case of ECDs, a Pareto-optimal set of sized circuits with many different topologies. Once the output database 62 is populated at a given process node, it can be reused for an immediate-turnaround "specs-in, sized-topology-out" designer flow. As will be described below, the output database 62 also opens up the opportunity for new circuit design insights via data-mining.

The present disclosure provides a multi-objective analog topology synthesis approach having industrially palatable accuracy, setup requirements, runtime, generality, and results. The present invention further provides a framework that defines a structural synthesis search space that is (a) trustworthy, (b) flexible, (c) specified by structural information only, and (d) leverages readily transferable building-block domain knowledge. The present invention further provides an EA-based search algorithm to generate the Pareto-optimal set of sized topologies. It combines: (a) A multi-objective EA that avoids premature convergence by grouping individuals by age (ALPS); (b) handling of many objectives via average ranking on a Pareto front (ARF); (c) high-quality starting designs via tree-oriented random sampling and multi-gate constraint satisfaction; (d) an operating-point driven formulation with model lookup tables to enhance search locality, (e) parallel computing; and (f) special search operators to exploit the nature of the search space: including a hybrid vector-based and tree-based search. The crossover operator respects the parameters that should be held together within building blocks, yet still allows sibling building blocks to share parameters (i.e., there is a mix between vector and tree search spaces). The mutation operator has tactics to avoid stealth mutations on "turned-off" building blocks.

Additionally, the present disclosure provides a data-mining perspective on the Pareto-optimal set of sized topologies to extract the following expert knowledge: (a) a decision tree for navigating from specs to topology, (b) global nonlinear sensitivities on topology and sizing variables, via stochastic gradient boosting, and (c) analytical performance-tradeoff models, via a variant of genetic programming (GP)-based symbolic regression. The present disclosure provides an example amplifier topology space that has been implemented using the framework, which is qualitatively richer because it is fifty times larger than past trustworthy structural-only spaces.

Described below is a topology space that is: specified by structural information only, searchable, trustworthy, and flexible. Its flexibility is due to a hierarchical description having parameter mappings, where the parameter mappings can choose sub-block implementations. This can be viewed as a parameterized grammar. Also described is an exemplary cell-level library for op amp synthesis.

The following describes a library using hierarchically organized building blocks. The library can be stored in the BBD 50. Each building block has external ports and parameters for interfacing to other building blocks. Some building blocks can have sub-blocks, in which case sub-block parameters are a function of the parameters of the higher-level building block. In the case of an ECD, in order to generate a netlist for a given building block, the only information needed is a value for each parameter of the block.

Only three building block types are needed to define a whole topology library: (a) Atomic Blocks: these are the leaf nodes in the building block hierarchy. Therefore, they do not contain any sub-blocks. In the case of ECDs, it is only Atomic Blocks that appear on an implemented netlist; (b) Compound Blocks: these hold a composition of sub-blocks that can have internal connections between themselves and to the parent Compound Block's external ports; and (c) Flexible Blocks: these have the special topological choice parameter (choice_i) and hold two or more alternative sub-blocks, where, in the case of ECDs, only one alternative is chosen during netlisting, based on the value of the Flexible Block's choice_i parameter. Each sub-block has its own choice of wiring as well. The alternative building block possibilities in Flexible Blocks enables the above-mentioned library. Each block has its own parameters, such as, in the case of ECDs, transistor widths or branch currents, which fully describe how to implement and size a given block and its respective sub-blocks.

Figure 2:
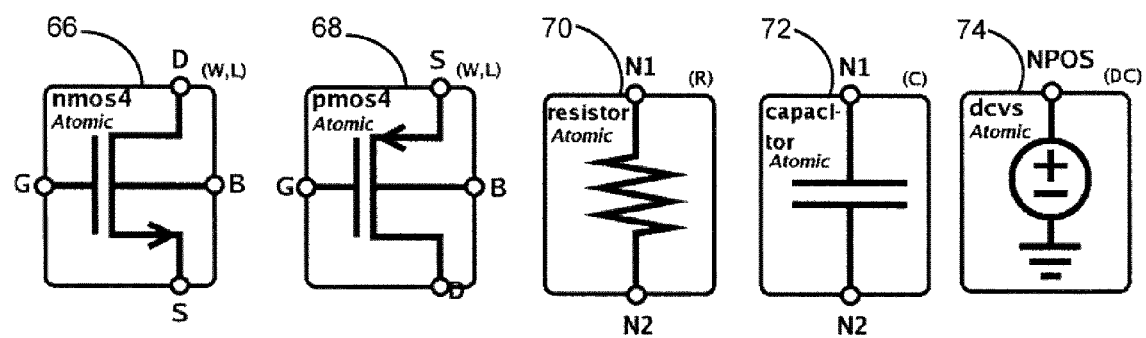
FIG. 2 shows exemplary embodiments of atomic blocks.
Figure 3:
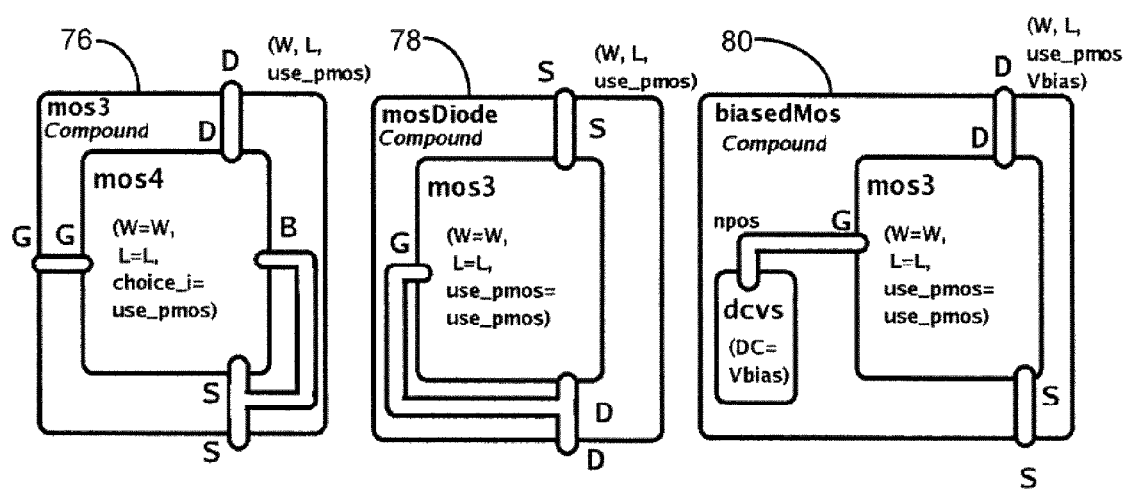
FIG. 3 shows exemplary embodiments of compound blocks.
Figure 4:
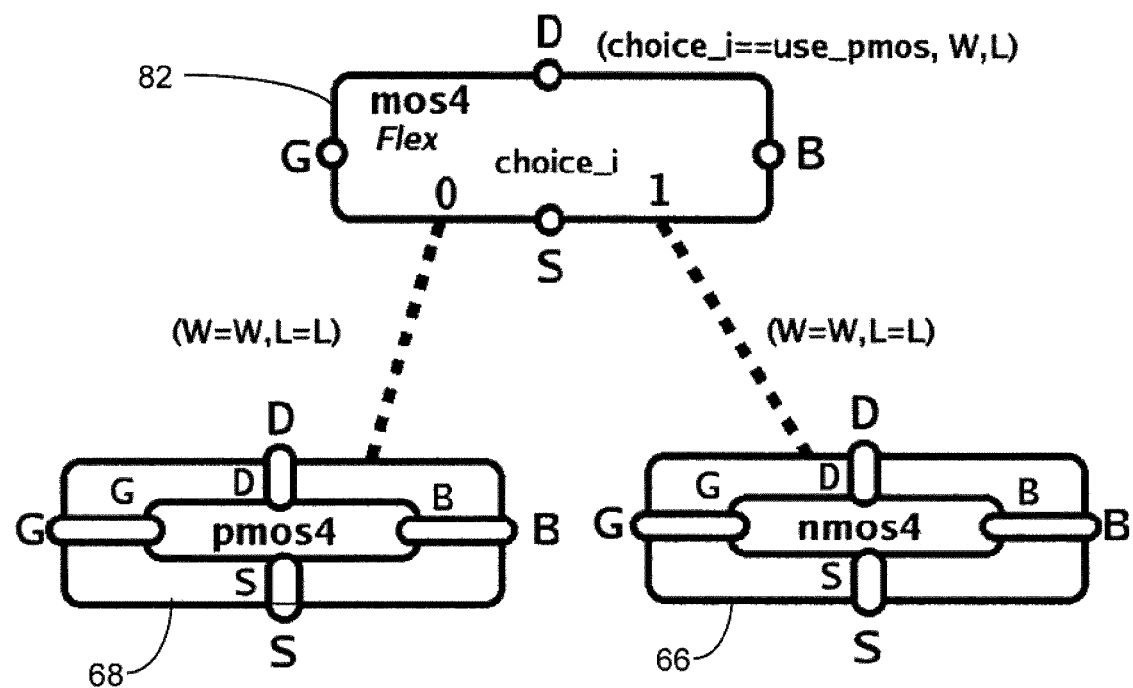
FIG. 4 shows an exemplary embodiment of a flexible block.
Figure 5:
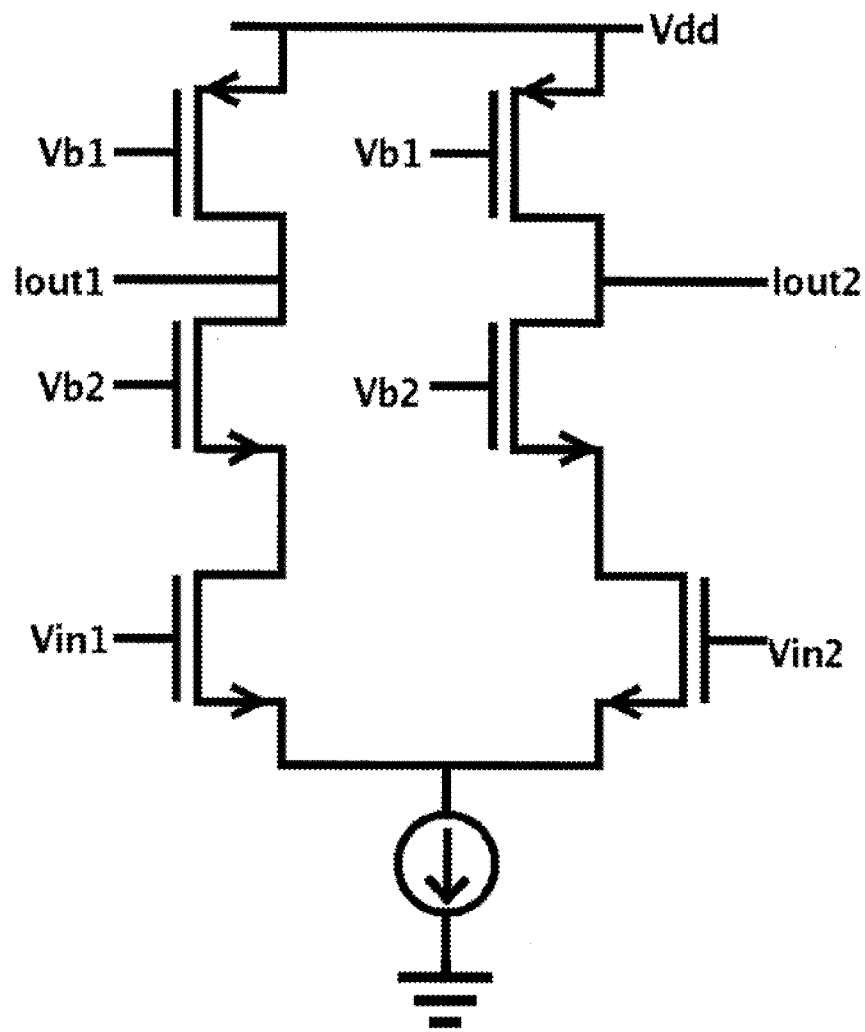
FIG. 5 shows a first exemplary circuit schematic.
Figure 6:
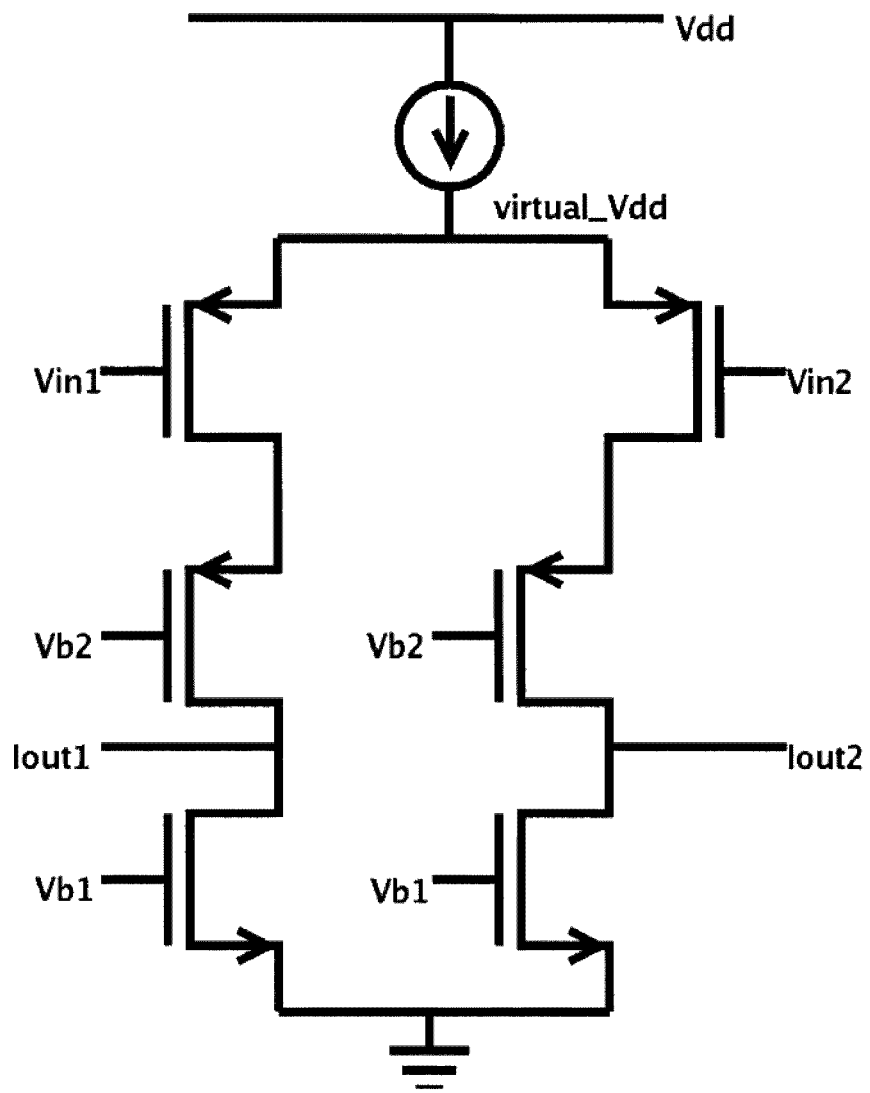
FIG. 6 shows a second exemplary circuit schematic.
Figure 7:
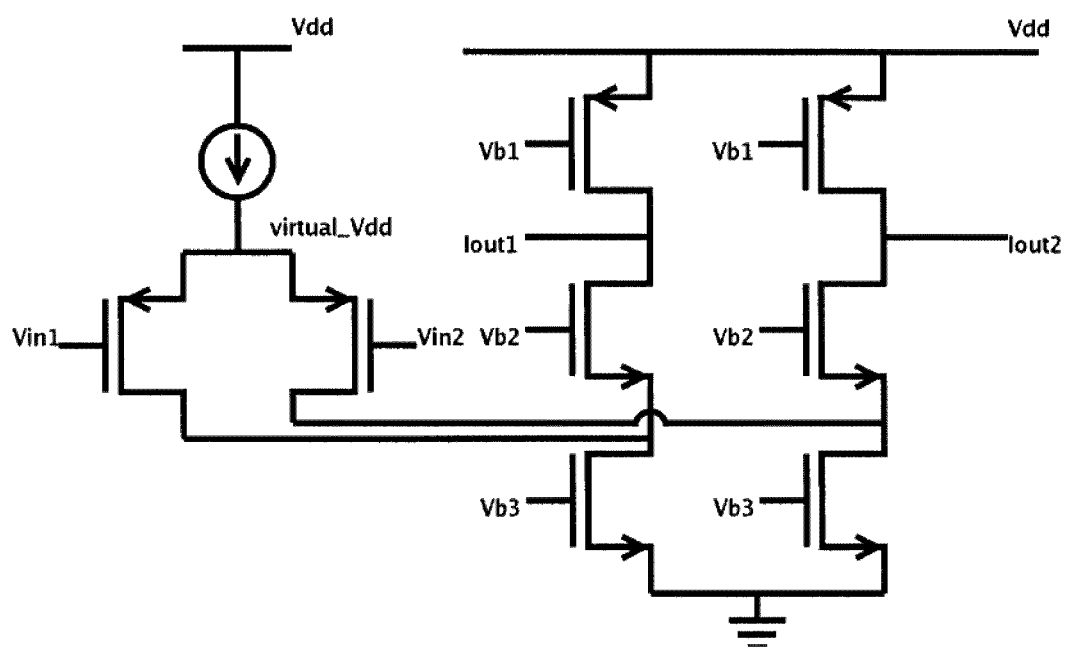
FIG. 7 shows a third exemplary circuit schematic.
Figure 8:
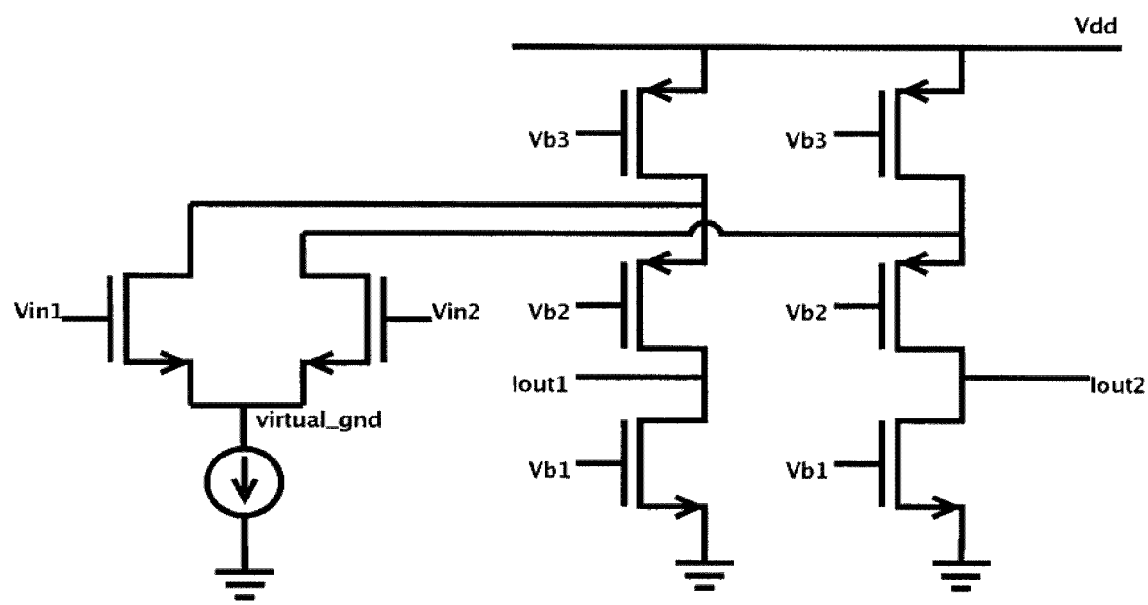
FIG. 8 shows a fourth exemplary circuit schematic.

FIG. 2, FIG. 3, and FIG. 4 give examples for Atomic, Compound, and Flexible Blocks respectively. In FIG. 2, an exemplary nmos4 block 66 is shown. The nmos4 block 66 has four external ports: G (ground), D (drain), S (source), and B (base). It has two input parameters, W (width) and L (length), as indicated by the (W, L) annotation at the top right portion of the nmos4. As will be clear to the skilled worker, the appellation nmos4 simply describes a four-port NMOS device. FIG. 2 also shows an exemplary pmos4 device (PMOS, four-port device) also having four external ports G, D, S and B, together with W and L parameters. FIG. 2 further shows a resistor atomic block 70 having two external ports and a resistance parameter R; a capacitor atomic block 72 having two external ports and a capacitance parameter C; and a direct current voltage source (dcvs) 74 that has only one external port; the other port ties directly to ground. The dcvs 74 makes it convenient to parameterize the biases of other building blocks. The dcvs 74 has a DC current as a parameter. As will be understood by the skilled worker, any number of suitable atomic blocks can be used.

FIG. 3 shows three example of Compound Blocks: mos3 76, mosDiode 78, and biasedMos 80. mos3 76 only contains one sub-part, a mos4, but it hides the mos4's B terminal by tying it to the mos4's S terminal, reflecting the fact that designers commonly conceptually work with transistors having three terminals, not four. The mosDiode 78 has a similar arrangement where the G terminal and the D terminal of the mos3 contained in the mosDiode 78 are tied together. The biasedMos 80 reflects the common designer approach of deferring work on biasing circuitry to focus on signal circuitry.

FIG. 4 shows a mos4 82 Flexible Block, which instantiates into pmos4 if choice_i is 0, or nmos4 if choice_i is 1. Note that the mos3 (76) W and L sizing parameters propagate directly to nmos4's and pmos4's W and L parameters in a unity mapping. As will be understood by the skilled worker, more complex mappings can be used; for example, higher-level blocks set a "is_pmos" variable depending on the block's context in the hierarchy, which will propagate to the bottom to use nmos4 or pmos4.

As such, larger blocks (e.g., compound, flexible) can be built up from smaller blocks (e.g., atomic). To make a whole library, the construction of sub-circuits using pre-defined building blocks continues to eventually reach the level of the target circuit, such as an operational amplifier (op amp). Despite the simplicity of the pre-defined building blocks, the combination of block types, especially Flexible Blocks, mean that a given block defines its own library of possible topologies. A building block's search space is merely the possible values that each parameter in the block can take. An exemplary library for op amps, is disclosed below. Any such library can readily be specified in an analog HDL such as VHDL-AMS or Verilog-AMS, through a circuit schematic editor, or by using a programming language such as, for example, Python.

As will be understood by the skilled worker, when a designer makes a small conceptual change to a circuit that corresponds to a small change in performance, there may be a drastic change in the netlist. This is illustrated in the examples shown at FIGS. 5 to 8, which show circuit schematics with similar behavior and only small conceptual differences, yet, as shown, have very different schematics/netlists/phenotypes. The framework of the present disclosure, with its Atomic, Compound, and Flexible blocks can handle such challenges by leveraging the Flexible Block's choice_i parameter, which can be a function of one or more higher-level parameters, and choose between sub-blocks that are identical except in the way those sub-blocks are wired to their parent block.

In the examples shown at FIGS. 5 to 8, only two parameters are changed to produce circuits with similar behavior and only small conceptual differences. These parameters are loadrail_is_vdd ("is the load's rail attached to Vdd, not Vss?"), and input_is_pmos ("are the input devices pmos, not nmos?"). Those values propagate down the hierarchy until a choice for folded vs. cascode must be made: is_folded= (input_is_PMOS==loadrail_is_vdd). FIG. 5 to FIG. 8 show how the two top-level parameters of input_is_pmos and loadrail_is_vdd translate into four different schematics. At FIG. 5, input_is_pmos=false and load_rail_vdd=true. At FIG. 6, input_is_pmos=true and load_rail_vdd=false. At FIG. 7, input_is_pmos=true and load_rail_vdd=true. At FIG. 8, input_is_pmos=false and load_rail_vdd=false.

Other situations that can be handled by the framework of the present disclosure include the folding of an input and the flipping all NMOS transistors to PMOS. Myriad examples can be found in any analog textbook such as those mentioned above. Past trustworthy synthesis approaches only cover some of the examples, and do not generalize. These prior art approaches complicate the design of an appropriate search representation, i.e., one where small conceptual changes lead to small changes in performance, yet possibly large changes in genotype (netlist).

FIGS. 9a-9i show, by way of example, how a the above-noted Atomic, Compound and Flexible blocks can be arranged in to a library describing all possible candidate topologies of an op amp. In the present example, approximately 30 building blocks combine to allow approximately 3500 different topologies. It allows for: one- and two-stage amplifiers, PMOS vs. NMOS loads, PMOS vs. NMOS inputs, stacked vs. folded cascode vs. non-cascode inputs, cascode vs. non-cascode vs. resistor loads, level shifting, different current mirrors, and single-ended and differential inputs.

Each box in FIGS. 9a-9i represents a building block. Flexible Blocks get expanded via OR operators, Compound Blocks get expanded via AND operators, leaf blocks with a dangling dotted line are defined elsewhere in diagram, and Atomic Blocks comprise the remaining leaf blocks.

Figure 9A:
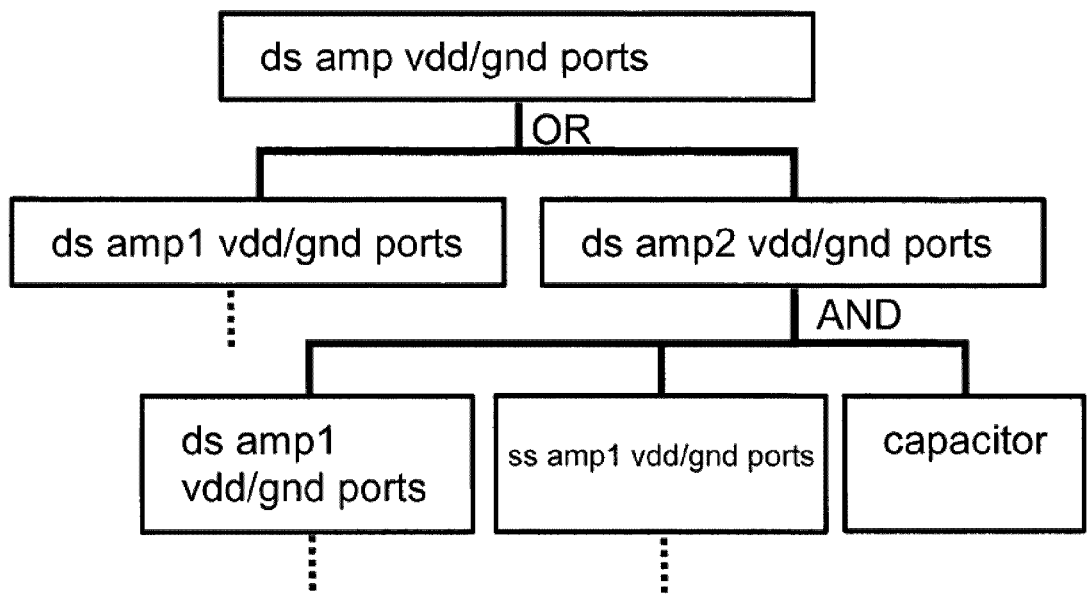

The root node representing the op amp is shown at FIG. 9a and is labeled "ds amp vdd/gnd ports". "ds" means differential-input, single-ended output. The root node can expand into either a "ds amp1 vdd/gnd ports" part, or a "ds amp2 vdd/gnd ports" part, i.e., respectively either a 1-stage (amp1) or 2-stage (amp2) ds amplifier. The "ds amp2 vdd/gnd ports" part holds a 1-stage ds amp (for the first stage), a 1-stage ss amp (for the second stage), and a capacitor (for feedback). "ss" means single-ended input, single-ended outptut. The phrase "vdd/gnd ports" means that the rails have been resolved to connect to Vdd and ground; they all have a load-rail_is_vdd parameter as described above.

Figures 9B, 9C:
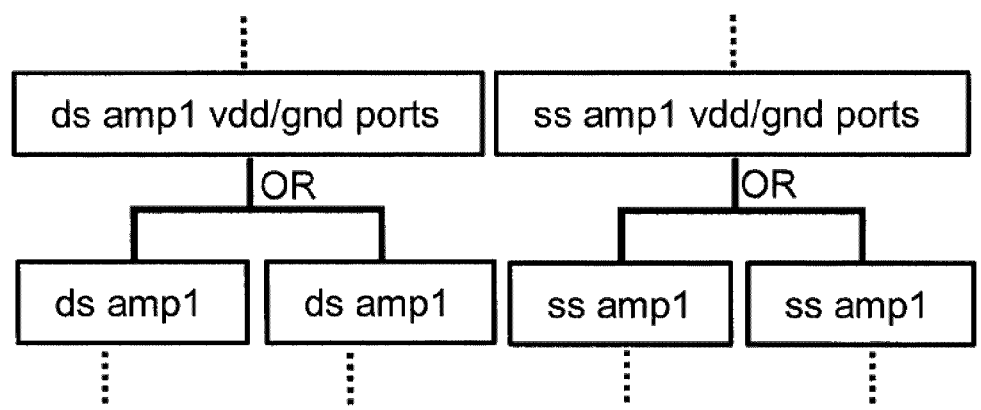
Figure 9D:
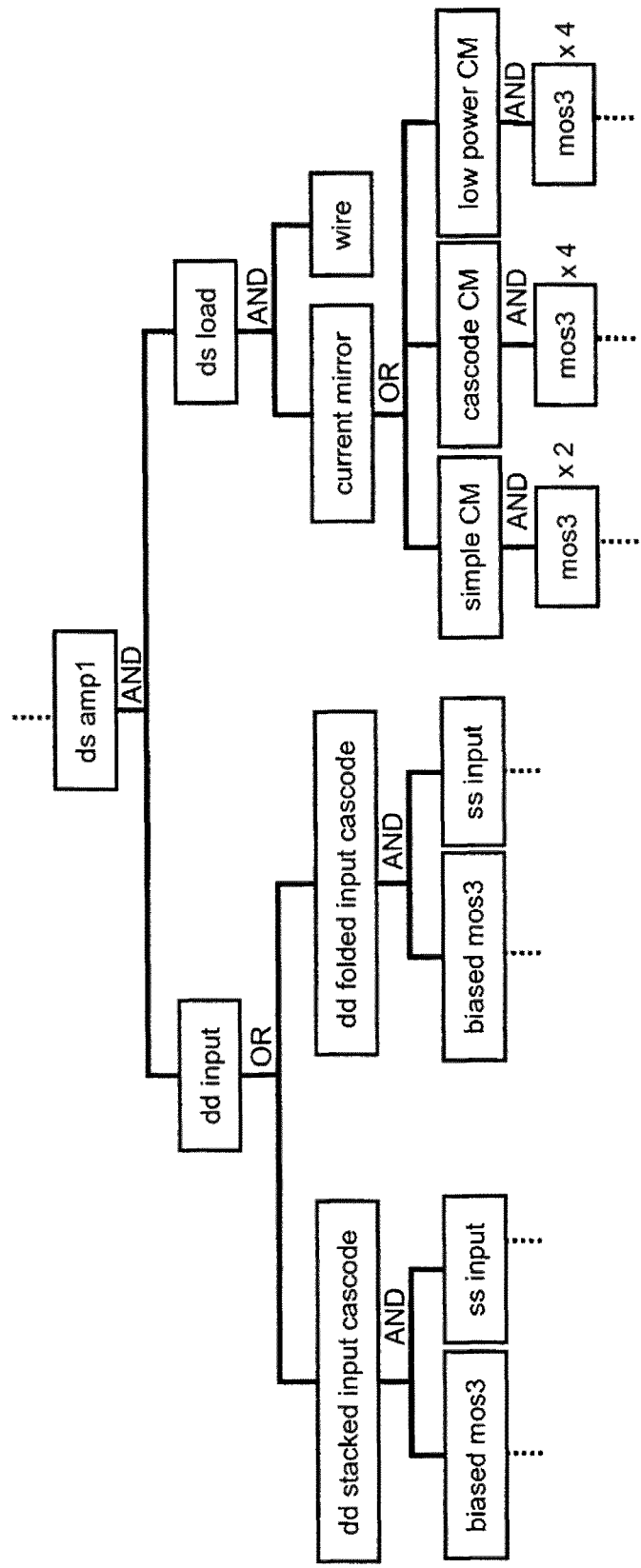
Figure 9E:
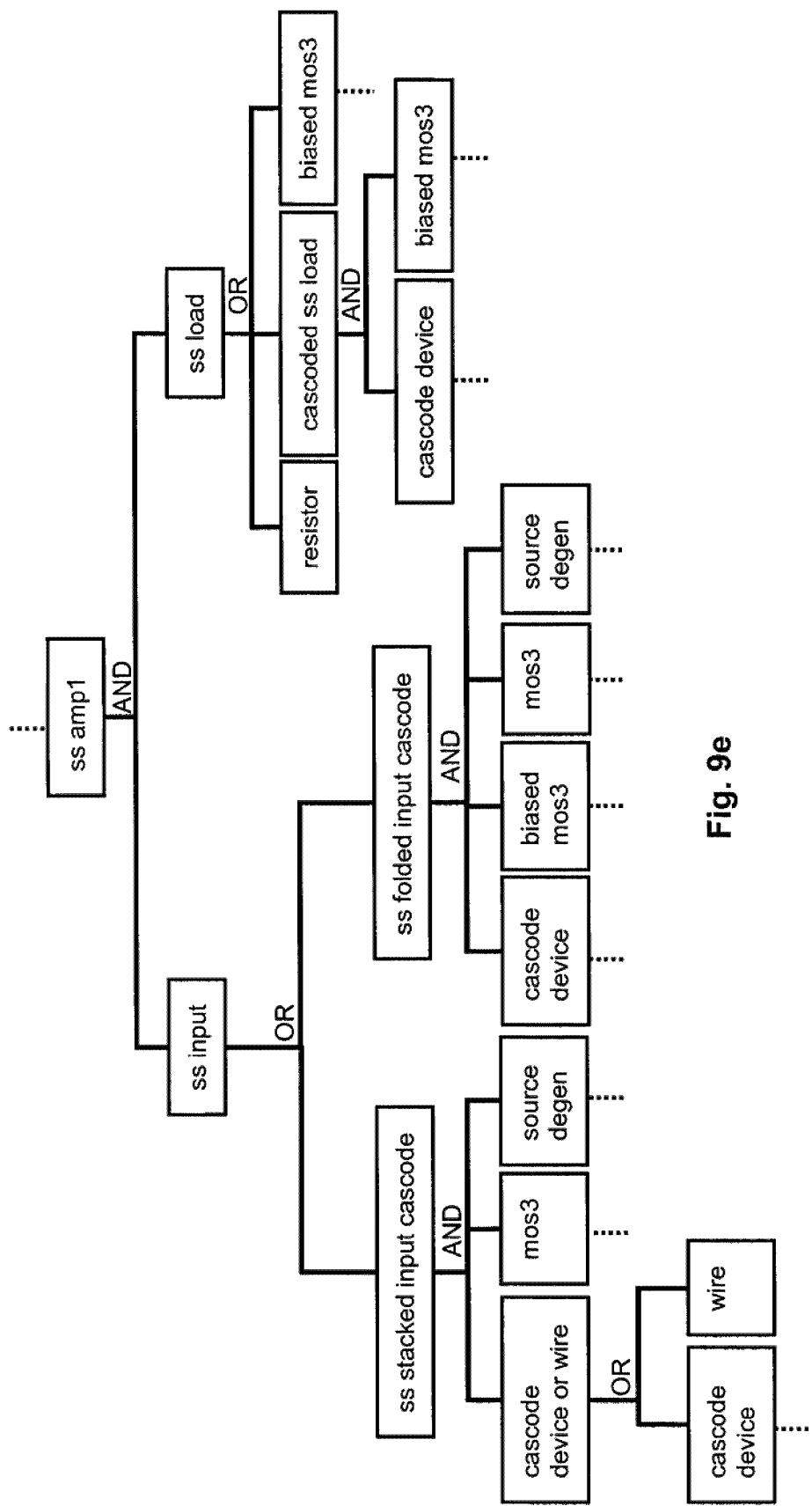

Correspondingly, as shown at FIG. 9b, the part "ds amp1 vdd/gnd ports" can expand into a "ds amp1" in one of two ways: with its load rail connected to Vdd, or with its load rail connected to Gnd. The part "ss amp1 vdd/gnd ports" expands similarly, as shown at FIG. 9c. The "ds amp1" block expands as shown at FIG. 9d; the block "ss amp1" expands as shown at FIG. 9e.

The library shown at FIGS. 9a-9i includes: 3 current mirror (CM) choices: simple CM; cascade CM; and low power CM. The library also includes, 2 level shifter choices (one choice is a wire); 2 choices of how to allocate Vdd/Gnd ports for a 1-stage amplifier and 4 for a 2-stage amplifier; 3 source-degeneration choices (FIG. 9f); 3 single-ended load choices (FIG. 9e); and more. Instantiation into nmos vs. pmos devices is deferred until the very leaf blocks (FIG. 9i), based on the parameters that flow through the hierarchy from root node to leaf nodes. This flexibility allows for a large number of possible topologies, without having an excess number of building blocks. It also means that many parameters are shared in the conversion from one block to sub-blocks, which keeps the overall variable count lower than it might have been; this is crucial to the locality of the space and thus the ultimate success of the search algorithm.

The search space, as shown in the example of FIGS. 9a-9i, is a library of circuit building blocks, and is equivalently a parameterized grammar. Therefore, a point in the search space is a circuit, and equivalently is a sentence. In EA terms, it is an individual. The following illustrates the different ways one can view an individual, with emphasis on the individual's structure.

Figure 10:
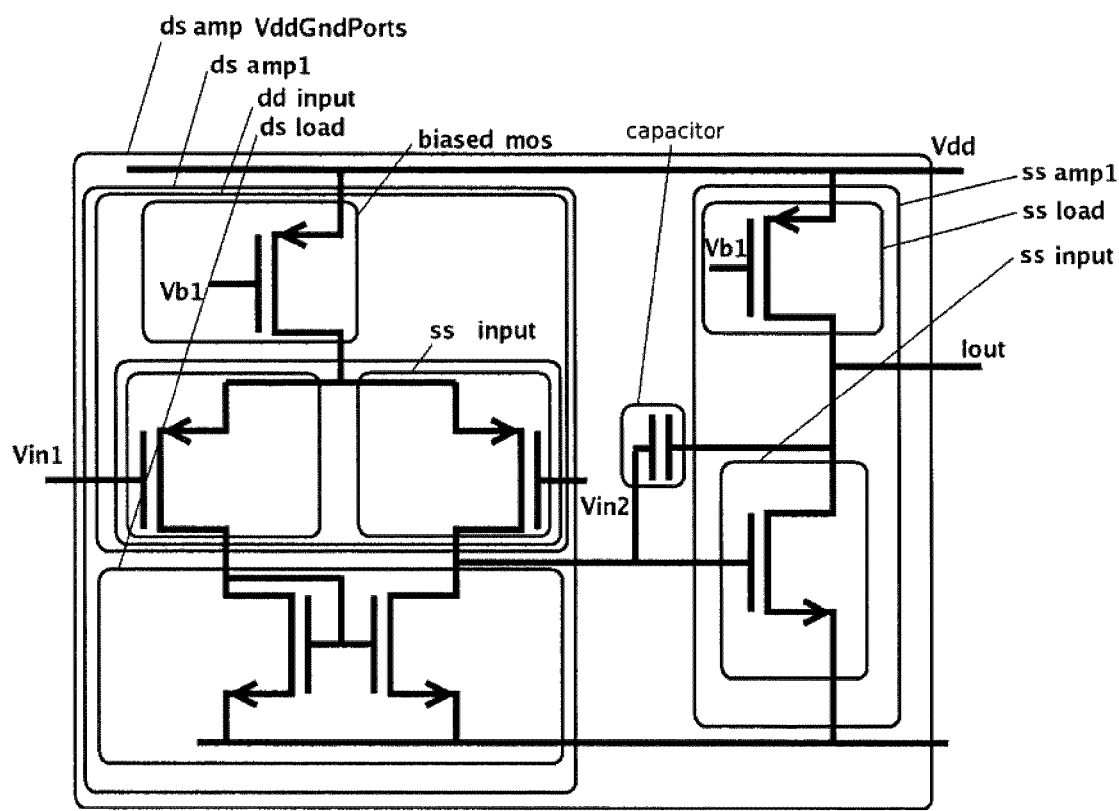
FIG. 10 shows an exemplary PMOS-input Miller op-amp.

A first way that is both concrete and intuitive, is seeing an individual as a schematic. This is the way that is most natural to analog designers. FIG. 10 is an exemplary individual shown in schematic form, the individual in question can be found in the library shown at FIGS. 9a-9i. From an analog designer perspective, the individual of FIG. 10 is a "PMOS-input Miller OTA" with the following characteristics: It is a two-stage amp, using a simple capacitor for feedback/Miller compensation; The first amplification stage has differential input and single-ended output; The input devices are PMOS and there is no cascode-folding or source degeneration; A simple current mirror, attached to the ground rail, reflects the signal and serves as load; The second stage has single-ended input and output; The input device is NMOS; A single PMOS device serves as load; and there is no source degeneration or cascading.

The schematic of FIG. 10 is annotated to illustrate its relation to the building blocks library of FIGS. 9a-9i. Each box that outlines a set of devices is an instantiation of a building block. The whole design is the grammar's root node "ds amp VddGndPorts", as indicated in the schematic's top left corner. "ds amp VddGndPorts" is composed of three sub-blocks: "ds amp1", "capacitor", and "ss amp1", which are all labeled on the schematic. In analog design terms, the OTA is composed of: a differential-in, single-ended-out input stage ("dsamp1"), a single-ended-in, single-ended-out output stage ("ss amp 1"), and a Miller feedback capacitor.

The "capacitor" block is a non-divisible Atomic Block, but the other two sub-blocks do subdivide further as stages 1 and 2 of the amp. The "ds amp1" subdivides into "dd input" and "ds load" blocks, and those keep subdividing until eventually they hit "nmos4" and "pmos4" Atomic Blocks. The "ss amp1" block on the right subdivides into an "ss load" and "ss input" block, which also keep subdividing until they eventually hit "nmos4" and "pmos4" Atomic Blocks. (Note: For ease of understanding, not all intermediate subblocks are highlighted.)

The subdivision of the individual of FIG. 10 was described above from a schematic-centric view. One can also take a view that is centered around the library/grammar itself, as shown at FIGS. 11a-11i for the same individual. This view contains a subset of the library of FIGS. 9a-9i where at each Flexible Block's "OR" option, a single choice is made and the non-chosen options are not shown. Arrows indicate where choices were made.

Starting at the root node (FIG. 11a) "ds amp vdd/gnd ports", the first choice was to "ds amp2 vdd/gnd ports" (and not to "ds amp1 vdd/gnd ports", which is not shown). That is, a two-stage OTA was chosen over a single-stage OTA.

Then, the "ds amp2 vdd/gnd ports" block expands into three sub-blocks: "ds amp1", "capacitor", and "ss amp1", just like the expansion shown in the schematic of FIG. 10. "ds amp1 vdd/gnd ports" makes the choice "ds amp1", as shown at FIG. 11b. Its alternative was actually also "ds amp1", but the difference between the choices is how the vdd and gnd ports are allocated—specifically, whether the load goes to the vdd or the gnd rail, as explained. From the schematic of FIG. 10, it is apparent that the input stage's load goes to the gnd rail, therefore the stage's value loadrail is vdd will be False. Similarly, as shown at FIG. 11c, "ss amp1 vdd/gnd ports" takes one of the "ss amp1" choices, with its difference based on the allocation of vdd and gnd ports. In this case, loadrail is vdd will be True.

Figure 11D:
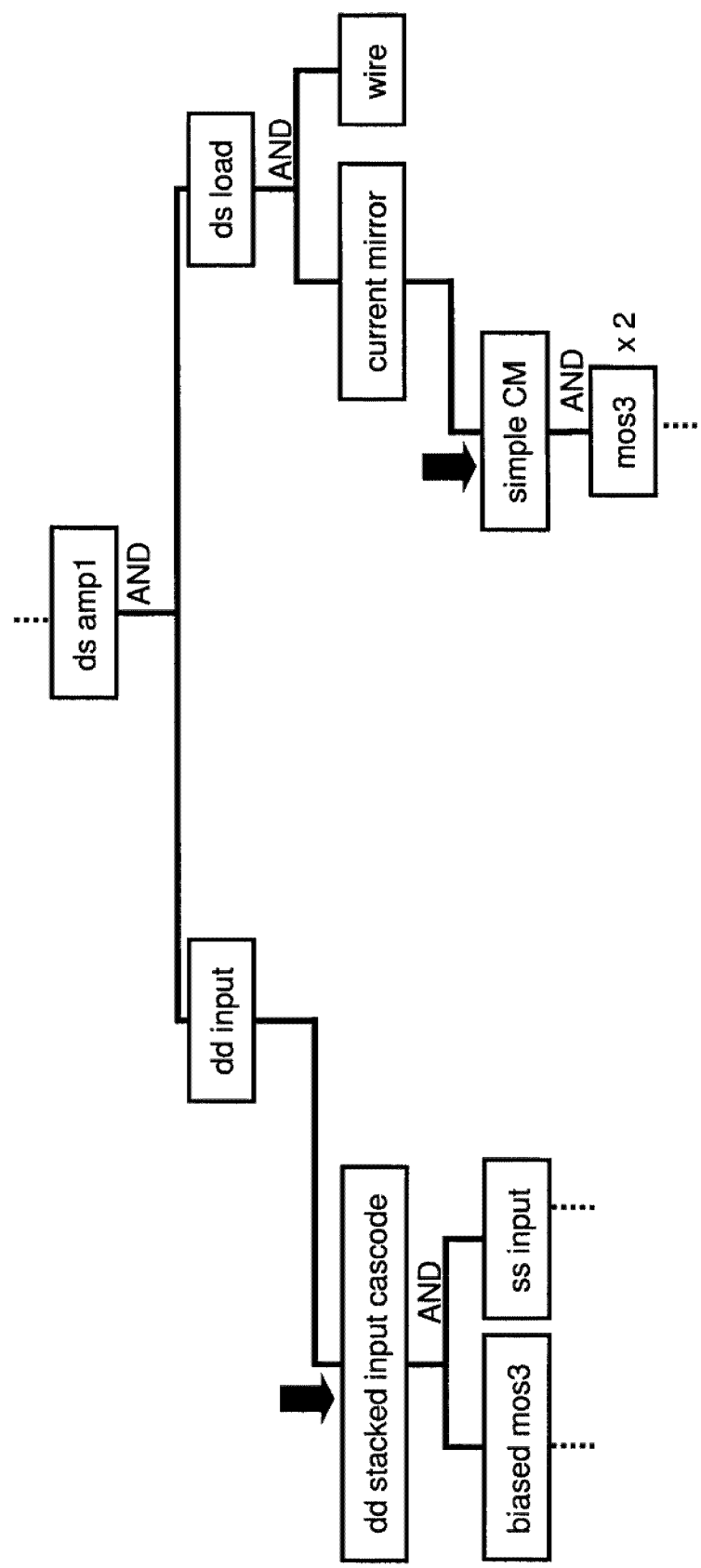
FIG. 11 shows a structure selected from the library of FIGS. 9a-9i for the op-amp of FIG. 10.

At FIG. 11d, the "ds amp1" block subdivides into the "dd input" and "ds load" blocks, akin to what we saw in the schematic's input stage (FIG. 10). In middle-left of FIG. 11d, "dd input" takes the further choice "dd stacked input cascode" (vs. "dd folded input cascode"), which subdivides into "biased mos3" and "ss input" blocks. The "ds load" block subdivides into a "current mirror" and "wire" block. In middle-right of FIG. 11d, the "current mirror" takes the choice "simple CM" (vs. "cascode CM" or "low power CM"). This is the current mirror in the bottom left of the schematic of FIG. 10. The "simple CM" subdivides into two "mos3" Blocks.

Figure 11E:
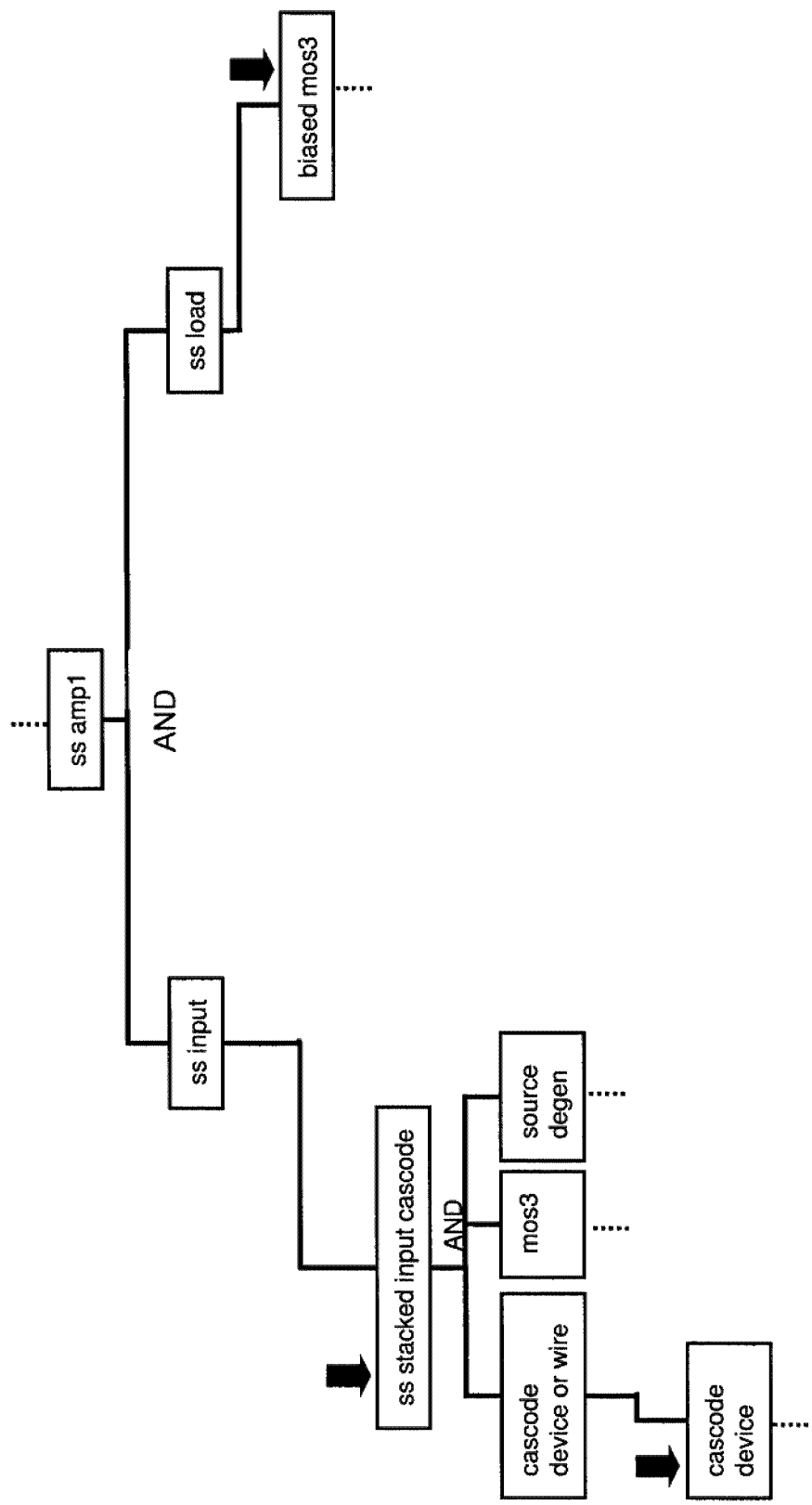

The individual's "ss amp1" block subdivides further, as shown at FIG. 11e, corresponding to the output stage of the schematic in FIG. 10. "ss amp1" divides into "ss input" and "ss load". The specific "ss input" chosen is "ss stacked input cascode" (vs. "ss folded input cascode"), which itself is composed of "cascode device or wire", "mos 3", and "source degen".

The block subdivisions continue via "AND" combinations and "OR" arrow choices, until finally Atomic Block leaf nodes are reached. Since this individual has both NMOS and PMOS devices, then the arrows for "nmos4" and "pmos4" are both shown in FIG. 11i.

An individual is represented within the synthesis engine's code in a vector-valued fashion. This is its genotype; all the other representations can be computed from the genotype. Specifically, the vector representation is an unordered mapping from variable names to corresponding chosen value. The variables are the variables needed to instantiate the root block, "ds amp vdd/gnd ports". Some variables are for topology choices (choice index), and others are for setting specific device values (I's and V's which translate to W's and L's). Tables 1 and 2 give example individual's topology choice values and device-setting values, respectively.

TABLE 1

| Variable Name | Value |
| --- | --- |
| chosen part index | 1 |
| stage1 input is pmos | 1 |
| stage1 inputcascode is wire | 1 |
| stage1 load chosen part | 1 |
| stage2 load part index | 0 |
| stage2 loadrail is vdd | 1 |
| stage2 degen choice | 0 |

TABLE 1-continued

| Variable Name | Value |
| --- | --- |
| stage1 loadrail is vdd | 0 |
| stage1 degen choice | 0 |
| stage1 inputcascode | 0 |
| stage2 loadcascode | 0 |
| stage2 inputcascode is | 1 |
| stage2 input is pmos | 0 |
| stage2 inputcascode | 0 |

TABLE 2

| Variable Name | Value |
| --- | --- |
| feedback C | 1.1883e−11 |
| stage1 Ibias2 | 0.015746 |
| stage1 Vout | 1.6830 |
| stage1 degen fracDeg | 0.86943 |
| stage1 folder Vgs | 1.2074 |
| stage1 fracVgnd | 0.47741 |
| stage1 inputbias Vgs | 1.3419 |
| stage1 inputcascode Vgs | 1.5280 |
| stage1 load cascode L | 4.0927e−05 |
| stage1 load fracIn | 0.70442 |
| stage2 Ibias | 0.0087295 |
| stage2 ampmos L | 3.8062e−05 |
| stage2 ampmos fracAmp | 0.54704 |
| stage2 inputbias L | 4.4781e−05 |
| stage2 inputcascode L | 2.2396e−05 |
| stage2 loadL | 9.7247e−06 |
| stage2 load fracLoad | 0.19648 |
| stage2 loadcascode Vgs | 0.92834 |
| stage1 Ibias | 0.016297 |
| stage1 Vds internal | 1.4584 |
| stage1 ampmos L | 2.1885e−06 |
| stage1 folder L | 3.5032e−05 |
| stage1 fracAmp | 0.52026 |
| stage1 inputbias L | 3.9621e−05 |
| stage1 inputcascode L | 2.7729e−05 |
| stage1 load L | 1.9609e−05 |
| stage1 load cascode Vgs | 1.2094 |
| stage1 load fracOut | 0.03599 |
| stage2 Ibias2 | 0.0 1206 |
| stage2 ampmos Vgs | 1.2756 |
| stage2 degen fracDeg | 0.05280 |
| stage2 inputbias Vgs | 1.1022 |
| stage2 inputcascode Vgs | 1.4486 |
| stage2 load Vgs | 1.5154 |
| stage2 loadcascode L | 6.1258e−06 |

Each parameter in Table 1 relates to one of the Flexible Block "OR" choices in the library of FIGS. 9a-9l and each specific parameter value reflects the specific "OR" choice made as shown at FIG. 11. The parameter chosen part index decides between one and two stages. A value of 1 means two stages were chosen, confirmed by the two-stage schematic at FIG. 10. "stage1 loadrail is vdd=0" means that stage 1's loadrail is not set to vdd, but to gnd instead, as was already see. "stage1 input is pmos=1" means that stage 1's input is PMOS, not NMOS, as was previously seen. And so on. It is to be noted that some variables may be ignored, depending on values of other variables. For example, if "chosen part index=0" to choose a one-stage topology, then all variables related to the second stage will be ignored.

Table 2 gives example device-setting values. These are all parameters that do not affect the topology. Because an operating-point driven formulation is utilized, the parameters are I's and V's, not W's and L's. As discussed below, the I's and V's get translated into W's and L's at the level of NMOS4 and PMOS4 netlisting, using a lookup table.

A final view of an individual is the SPICE netlist, which is merely a text-based listing of each device's connections, type, and parameters in a line-by-line fashion. This is the form used as input to SPICE simulation, to estimate the individual's performance values.

The library of FIGS. 9a-9i can be readily modified for other problems by building up different blocks and/or using a different block as the root node. For example, search of a single-ended input, single-stage opamp would use "ss amp1" (FIG. 9e) as the root node; or search for a digital cell might use a library that builds off "mos3" blocks (FIG. 9i).

As mentioned above, open-ended search spaces have a vast number of possible topologies, but results are hard to understand and "cheat" by exploiting unmeasured goals; i.e. are not trustworthy. Previous non-rule-based, structured search spaces for op amps are flat, restricting their options.

As Table 3 illustrates, with respect to the op amp design example shown in previous figures, MOJITO's flexible hierarchical nature increases the number of possible trustworthy op amp topologies by 50×. This is computed by the following rules: the count for an Atomic Part is one; for a Flexible Part, it is the sum of the counts of each choice block; for a Compound Part, it is the product of the counts of each of its sub-blocks; but there are subtleties. Subtlety: for a given choice of flexible block, other choice parameters at that level may not matter. Example: if a one-stage amplifier is chosen, choices related to second stage are not counted. Subtlety: one higher-level choice might govern >1 lower-level choices. As such, one must ensure not to overcount. Example: a two-transistor current mirror should have two choices (nmos vs. pmos), not four (nmos vs. pmos×2).

TABLE 3

SIZE OF OP AMP TOPOLOGY SPACES

| Technique | number of topologies | Trustworthy? |
|---|---|---|
| Open-ended GP [a] | billions | NO |
| DARWIN [b] | 24 | YES |
| MINLP [c] | 64 | YES |
| MOJITO (present disclosure) | 3528 | YES |

[a] J. D. Lohn and S. P. Colombano, "Automated Analog Circuit Synthesis using a Linear Representation", Proc. ICES, 1998, pp. 125-133; J. R. Koza et al, "Automated Synthesis of Analog Integrated Circuits by Means of Genetic Programming", IEEE Trans. Evolutionary Computation 1(2), July 1997, pp. 109-128; J. R. Koza et al. Genetic Programming III: Darwinian Invention and Problem-Solving. Kluwer, 1999; J. B. Grimbleby, "Automatic analogue circuit synthesis using genetic algorithms," Proc. IEE—Circuits, Devices, Systems 147(6), December 2000, pp. 319-323; R. Zebulum, M. Vellasco, and M. Pacheco, "Variable length representation in evolutionary electronics," Evolutionary Computation, 8 (1), 2000, pp. 93-120; T. Sripramong and C. Toumazou, "The Invention of CMOS Amplifiers Using Genetic Programming and Current-Flow Analysis," IEEE Trans. CAD 21(11), 2002, pp. 1237-1252; H. Shibata et al, "Automated design of analog circuits using cell-based structure," Proc. Nasa/DoD Conf. Evolvable Hardware, 2002; J. R. Koza et al. Genetic Programming IV: Routine Human-Competitive Machine Intelligence. Kluwer, 2003; S. Ando, M. Ishizuka, and H. Iba, "Evolving analog circuits by variable length chromosomes," in Advances in evolutionary computing, A. Ghosh and S. Tsutsui, Eds. New York: Springer, 2003, pp. 643-662; S.-J. Chang, H.-S. Hou, and Y.-K. Su, "Automated passive filter synthesis using a novel tree representation and genetic programming," IEEE Trans. Evolutionary Computation 10 (1), February 2006, pp. 93-100; and C. Mattiussi, D. Floreano, "Analog Genetic Encoding for the Evolution of Circuits and Networks," IEEE Trans. Evolutionary Computation 11(5), 2007, pp. 596-607. [b] W. Kruiskamp and D. Leenaerts, "DARWIN: CMOS Opamp Synthesis by Means of a Genetic Algorithm", Proc. DAC, 1995. [c] P. C. Maulik et al., "Integer Programming Based Topology Selection of Cell Level Analog Circuits", IEEE Trans. CAD 14(4), April 1995.

It is also possible to expand the above-noted library to include symmetrical operational transconductance amplifiers (OTAs) in addition to folded OTAs, which are already present in the library. This increases the number of topologies from 3528 to 101904.

In the present disclosure, having such a rich set of options can qualitatively change the designer's perception of the process. That is, rather than doing "selection" from a few dozen topologies, the tool is "synthesizing" the optimal combination of building blocks from a huge set of possibilities. The number of topologies is sufficiently rich that the designer will feel less of a need to intervene in a typical design problem. Since the library only needs to be defined once for a given problem type (e.g., op amp, or any other suitable electrical circuit component), the designer no longer needs to view it as an input, even if the process node changes. Furthermore, once a MOJITO run is complete for a given process node, that database of sized results can be queried for the solution to a given set of specs. This therefore supports a designer workflow "specs-in sized-topology-out" with immediate turnaround.

The present disclosure uses an operating-point driven formulation in which current (I) or voltage (V), and transistor length (L), are independent variables, rather than transistor width (W) and L. The advantages of the operating-point driven formulation are that designable variables have less nonlinear coupling than a W/L formulation; and that one can have "function device operating constraints (DOCs)" in which the DOCs can be measured by simple function calculations on design variable values without need for circuit simulation. To implement it, it is required to compute W from device biases (Currents and biases: Is and Vs respectively), for each device of each candidate design. First- or second-order equations are too inaccurate, and SPICE in the loop, per device, is too slow. Accordingly, in the following examples, 350,000 points were sampled in the {L, Ids, Vbs, Vds, Vgs} space, SPICE simulated each point once on an NMOS and once on a PMOS BSIM model, then stored all the points in a lookup table (LUT). Therefore, during a MOJITO run we can directly compute W's from biases, accurately and with no extra simulations.

An algorithm that does constrained multiobjective synthesis can be expressed as follows:

$$\begin{aligned} \text{minimize} \quad & f_i(\phi) \quad i = 1 \ldots N_f \\ \text{such that} \quad & g_j(\phi) \quad j = 1 \ldots N_g \\ & h_k(\phi) \quad k = 1 \ldots N_h \\ & \phi \in \Phi \end{aligned} \quad (1)$$

The algorithm of equation (1) traverses the space of possible topologies and sizings, $\Phi$, to return a Pareto-Optimal Set $Z = \{\phi_1^*, \phi_2^*, \ldots, \phi_{N_{ND}}^*\}$ on $N_f$ objectives, $N_g$ inequality constraints, and $N_h$. equality constraints.

Without loss of generality, it is possible to minimize all objectives and have inequality constraints with aim $\leq 0$. By definition, a design $\phi$ is feasible if it meets all constraints: $\{g_j(\phi) \leq 0\} \forall j$, $\{h_k(\phi)=0\} \forall k$, $\phi \in \Phi$. By definition, all the designs in Z are nondominated, i.e. no design $\phi$ in Z dominates any other design in Z. A feasible design $\phi_a$ dominates another feasible design $\phi_b$ if $\{f_i(\phi_a) \leq f_i(\phi_b)\} \forall i$, and $\{f_i(\phi_a) < f_i(\phi_b)\} \exists i$. The present disclosure follow the known dominance rules set out in K. Deb et al., "A Fast and Elitist Multi-Objective Genetic Algorithm: NSGA-II," IEEE Trans. Ev. Comp. 6(2), April 2002, pp. 182-197. That is, a feasible design always dominates an infeasible design, and if two designs are infeasible, then the one with smallest constraint violation is considered dominant.

The present disclosure uses an evolutionary algorithm (EA) as the base of a search algorithm because EAs can readily incorporate the present hybrid tree/vector representation, perform constrained multi-objective optimization, naturally support parallel processing, and offer flexibility in overall algorithm design.

A key issue with most EAs is premature convergence. This is certainly an issue in multi-topology optimization because some sub-blocks may get little chance to size properly before being filtered out via selection. We need to ensure an adequate supply of building blocks. Tactics include massive populations, restarting, or diversity measures like crowding; all these tactics are difficult or inadequate. Random injection of individuals might help because fresh building blocks can enter, except they get killed off too quickly during selection. To give random individuals a chance, the technique of hierarchical fair competition (HFC) segregates individuals into fitness layers, and restricts competition to within layers. Unfortunately near-stagnation can occur at some fitness levels because the best individuals per level have no competition. Also, it is unclear what each layer's fitness should be.

To overcome this issue, the present disclosure uses the known age-layered population structure (ALPS), which segregates by genetic age instead of fitness. The structure and behavior of the present approach, referred to as MojitoSynthesis( ), are shown at FIG. 12 and Table 4, respectively.

Figure 12:
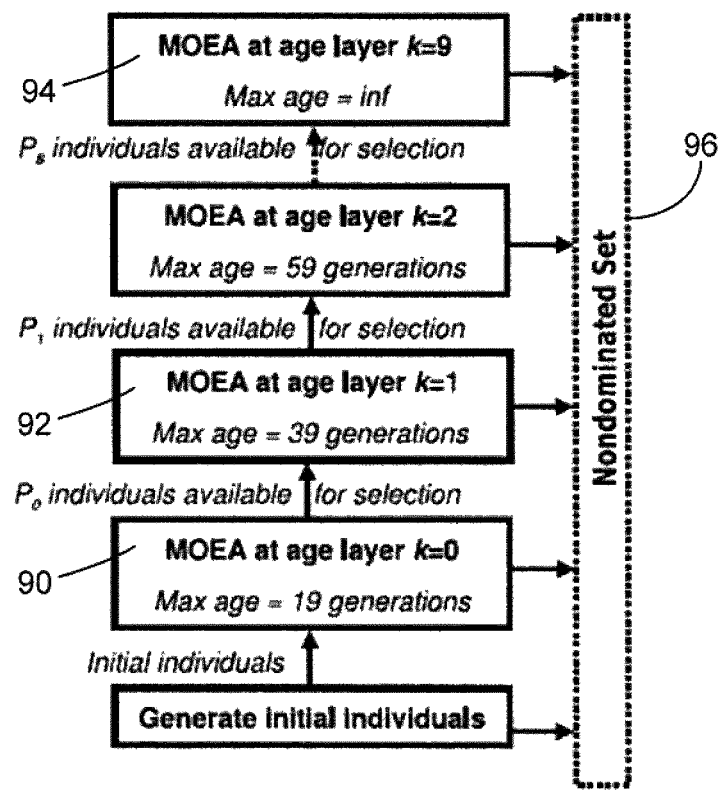
FIG. 12 shows an exemplary flow chart of a structure synthesis method of the present invention.

With respect to FIG. 12, each age layer $P_k$ holds $N_L$ individuals. By way of example, $P_1$ (90) might allow individuals with age 0-19; $P_2$ (92) allows age 0-39, and so on; the top level $P_K$ (94) allows age 0-$\infty$. If an individual gets too old for a fitness layer, it gets removed from that layer. Genetic age is how many generations an individual's oldest genetic material has been around: the age of an initial individual is 0; the age of a child is the maximum of its parents' ages; age is incremented by 1 each generation. Selection at an age layer k uses the individuals at layers k and k−1 as candidates. With respect to table 4, every $N_a$ ("age gap") generations, a new age layer may be added (lines 5-6), and initial individuals enter layer k=0 as either random individuals or "tuned" random individuals (line 7; InitialCircuit( ) details are given below). In this fashion, younger high-fitness individuals can propagate to higher layers.

TABLE 4

Procedure MojitoSynthesis( )

Inputs: $\Phi$, $N_a$, K, $N_L$
Output: Z
1. $N_{gen} = 0$; Z = $\emptyset$; P = $\emptyset$
2. while stop( ) ≠ True:
3.   if $(N_g \% N_a)=0$;
4.     if $\|P\| < K$:
5.       $P_{\|P\|+1} = \emptyset$ TABLE 4-continued Procedure MojitoSynthesis( )

6.       $P_{0,i}$ = InitialCircuit($\Phi$), i=1..$N_L$
7.   For k = 1 to $\|P\|$:
8.     $(P_k, Z)$ = OneMOEAGeneration($P_k$, $P_{k-1}$, Z)
9.   $N_{gen}$ = $N_{gen}$+1
10. Return Z Table 5 shows an exemplary algorithm for a multi-objective EA (OneMOEAGenration( ) denoted in Table 4). The present disclosure uses a multi-objective version of ALPS. The approach is to have a multi-objective EA (MOEA) at each age layer k, running one generation at a time. Whereas a canonical MOEA would select at just layer k, in the present disclosure, the MOEA selection also considers layer k−1 individuals. An external archive holding the Pareto Optimal Set Z (96) is always maintained. Stopping conditions (line 2) can include a maximum number of individuals $N_{i,max}$ or a maximum number of generations $N_{g,max}$. A master-slave configuration is used for parallel processing.

Table 5 shows the algorithm for the MOEA at each age layer, for one generation. Note how individuals from the lower layer are imported for selection. Key steps are MOEA-specific selection (line 1) and evolutionary operators (line 2), which the next two sections elaborate on, respectively.

TABLE 5

PROCEDURE ONEMOEAGENERATION ( )

Input: $P_k$, $P_{k-1}$, Z
Output: $P_k'$, Z'
1. $P_{sel}$ = selectParents($P_k \cup P_{k-1}$)
2. $P_{ch}$ = applyOperators(S)
3. $P_{ch}$ = evaluate(C)
4. $P_k'$ = $P_{sel} \cup P_{ch}$
5. Z' = nondominatedFilter(Z $\cup$ $P_{ch}$)
6. Return ($P_k'$, Z')

The following section describes the MOEA used in MOJITO for a first round of experiments, and the MOEA in a second round of experiments, which overcame issues uncovered in the first round.

In the first round of experiments having two objectives, the known algorithm NSGA-II was used (K. Deb et al., "A Fast and Elitist Multi-Objective Genetic Algorithm: NSGA-II," IEEE Trans. Ev. Comp. 6(2), April 2002, pp. 182-197), because it is relatively simple and reliable, is well-studied, and can readily incorporate constraints. A key part is how to choose the $N_L$ selected parents $P_{sel}$. NSGA-II sorts the candidate parents into nondomination layers $F_i$, i=1 . . . $N_{ND}$ where $F_1$ is the nondominated set, $F_2$ is what would be nondominated if $F_1$ was removed, etc. F contains all the candidates with no duplicates $F_1 \cup F_2 \cup \ldots \cup F_{ND} = P_k \cup P_{k-1}$; $F_1 \cap F_2 \cap \ldots \cap F_{ND} = \emptyset$. $P_{sel}$ is filled by first adding all individuals from $F_1$ if they all fit, i.e. if $\|S\|+\|F_1\| \leq N_L$; then adding all individuals from $F_2$ if they all fit; and so on. Once the $P_{sel}$-filling step reaches an $F_i$ where all of $F_i$'s individuals cannot fit, then a subset of $F_i$'s individuals is chosen: the subset with the highest distance from other $F_i$ individuals in performance space ("crowding").

The second round of experiments had five objectives, which more closely resembles analog circuit design goals (B. Razavi, Design of Analog CMOS Integrated Circuits. McGraw-Hill, 2000). Unfortunately, most MOEAs including NSGA-II do poorly when there are more than two or three objectives (D. Come, J. Knowles, "Techniques for Highly Multiobjective Optimization Some Nondominated Points are Better Than Others", *Proc. Genetic and Evolutionary Computation Conference,* 2007, pp. 773-780). To improve NSGA-II, we need to understand why it does poorly. The problem is that with many objectives, most or all of the population is nondominated, i.e. there is just one nondomination layer $F_1=P_k \cup P_{k-1}$. Therefore NSGA-II uses crowding to filter down the nondominated individuals. Crowding biases towards the corners of the performance space that are the farthest apart; and not the center points which are close to all designs. That is, it focuses on designs that are excellent on one or two objectives yet terrible at the rest. In a high number of objectives, canonical NSGA-II degenerates into near-random search.

To solve this, we use Adaptive Ranking on Pareto Front (ARF) (D. Corne, J. Knowles, "Techniques for Highly Multiobjective Optimization: Some Nondominated Points are Better Than Others", *Proc. Genetic and Evolutionary Computation Conference,* 2007, pp. 773-780), which does not bias to the corners of the performance space, but instead to individuals that do relatively well on each objective. We modify NSGA-II to use ARF conditionally: if $\|S\|+\|F_1\| \geqq N_L$, then use the average rank measure AR for selection, instead of the crowding distance. AR is defined as:

$$AR(\phi) = \sum_{i=1}^{N_f} \mathrm{rank}(f_i, \phi, Z) \quad (2)$$

where rank($f_i$, $\phi$, Z) is the rank of individual $\phi$ with reference to the Pareto-Optimal Set Z, for objective $f_i$. At a given objective, the best individual has a rank value of 1, the second-best has rank 2, etc.

As will be understood by the worker skilled in the art, the search space can be viewed as a vector of possible values that each of the top-level building block's continuous, discrete, or integer parameters can take. But since a vector-oriented view does not recognize the hierarchy, operations on it have issues. One issue is that a change to variable(s) may not change the resulting netlist at all, because those variables are in sub-blocks that are turned off. This means that there can be vast neutral regions in the search space. That is, the representation is non-uniformly redundant and runs the risk of stealth mutations. For EAs, another issue is that an n-point or uniform crossover operator could readily disrupt the values of the building blocks in the hierarchy. For example, the sizes of some sub-blocks' transistors change while others stay the same, thereby hurting the resulting topology's likelihood of having decent behavior. From an EA perspective this means that the "building block mixing" is poor. This cannot be reconciled by applying a hierarchical design methodology because there are no goals on the sub-blocks, just the highest-level blocks. It would be possible, however, to still apply a hierarchical methodology to the results. Neither is it possible to treat it as a tree induction problem, for example, by solving with grammar-based GP because some sibling sub-blocks share the same parent blocks' parameters.

Accordingly, the search algorithm's perspective of the space has both tree-based and vector-based aspects. The present disclosure presents EA operators that reconcile both aspects.

First, the mutation operator chooses one or more parameters to mutate, and mutates them. Continuous-valued parameters follow Cauchy mutation which balances tuning with exploration. Integer-valued choice_i parameters follow a discrete uniform distribution. Other integer and discrete parameters follow discretized Cauchy mutations. To avoid stealth mutations (i.e., neutral wandering), mutations are only kept if the netlist changes; mutation is repeated until this happens. Though "neutral wanderings" of the space has been shown to help exploration in some applications, results are mixed and in general make performance more unpredictable.

The second operator is crossover. It works as follows: given two parent individuals, randomly choose a sub-block in parent A, identify all the parameters associated with that sub-block, and swap those parameters between parent A and parent B. This will preserve the parameters in the sub-blocks. There will still be some crosstalk because sibling blocks may use those parameters as well, but the crosstalk is relatively small compared to the 100% crosstalk that we'd have if we used standard vector-based crossover. This effectively makes the search a hybrid between tree-based and string-based search.

Interestingly, the MOJITO space can be viewed as generative representation such as L-systems or GENRE, but MOJITO has more ability to refine results during search because each subblock is parameterized in a more general way.

This section describes how initial individuals were generated for the above-mentioned first round of experiments (vector-oriented random sampling), the issues it presented, and how those issues were overcome for the second round of experiments by using tree-oriented random sampling and multi-gate constraint satisfaction.

In the first round of experiments, each initial individual was generated with uniform random sampling per variable (Table 6). Specifically: recall from above that a design at the top block of the library hierarchy can be fully specified by a set of $N_d$ variables (line 1). So, a vector d can define a point $\phi$ (and correspondingly, $R^{N_d}$ can define $\Phi$). A random $\phi$ is generated by: for each variable i (line 3), either draw a value from a continuous uniform random distribution (lines 4-5) or a discrete set of values with equal bias (lines 6-7).

TABLE 6

| Procedure InitialCircuit( ) (First Implementation) |
|---|
| Input: $\Phi$ |
| Output: $\phi \in \Phi$ |
| 1. d = topLevelVariables($\Phi$) |
| 2. $\phi = \emptyset$ |
| 3. for i = 1 to $\|d\|$ |
| 4.   if $d_i$ is continuous |
| 5.     $\phi_i \sim U([d_{i,min}, d_{i,max}])$ |
| 6.   else: #discrete |
| 7.     $\phi_i \sim U(\{d_{i,1}, d_{i,2}, ..., d_{i,max}\})$ |
| 8. Return $\phi$ |

This approach had issues: uneven sampling of topology types, and difficulty in maintaining diversity of topologies. Specifically, it was observed that the algorithm of Table 6 was generating single-stage amplifiers just as often as two-stage amplifiers, despite the fact that there are many more possible two-stage topologies. This is because the approach views the space "flat", randomly picking a value for each of the topology choice parameters, with equal bias. To fix this, equal bias is given to each possible topology, which is akin to representative sampling of sentences in a grammar. When synthesis begins, a one-time computation of the number of possible topologies for each part is made, using the rules described above. The counts c are used as a bias on corresponding Flexible Part choice_i values on the top-level part. Table 7 gives the procedure, called RandomDrawCircuit( ). The key difference compared to Table 6 is the introduction of lines 4-5, where each choice variable i's value is chosen according to a discrete density function (ddf) having a probability $p_{i,j}$ for each possible value $v_{i,j}$;

$$p_{i,j} = c_{i,j} \Big/ \sum_{j=1}^{jmax} c_{i,j}; \sum_{j=1}^{jmax} p_{i,j} = 1;$$

$c_{i,j}$ is the number of sub-topologies if the $j^{th}$ value is used for variable i.

TABLE 7

Procedure RandomDrawCircuit( )

Input: Φ
Output: φ∈ Φ
1. d = topLevelVariables(Φ)
2. φ = ∅
3. for i = 1 to ||d||
4.   if $d_i$ is a choice parameter
5.     $\chi_i$ ~ ddf({$p_{i,1}$ for $d_{i,1}$, $p_{i,2}$ for $d_{i,2}$, ...})
6.   else if $d_i$ is continuous
7.     $\chi_i$ ~ U([$d_{i,min}$, $d_{i,max}$])
8.   else: #non-choice discrete
9.     $\chi_i$ ~ U({$d_{i,1}$, $d_{i,2}$, ..., $d_{i,max}$})
10. Return φ

With further runs, it was found that most randomly generated higher-complexity amplifiers (e.g. folding topologies, 2-stage amplifiers) would die out within a few generations of being generated. While ALPS generated more topologies in later random injection phases, those would die out too. Upon investigation, it was found that the randomly-generated complex amplifiers' performances were much worse than simple ones, and that they did not improve as quickly. This is because the more complex amplifiers have more sizing and biasing variables to set reasonably in order to reach a minimal performance bar. It was also found that the first feasible topology found would overtake other topologies, further hurting diversity. This is because of NSGA-II's constraint-handling: it lumps all constraints into one overall violation measure, and always prefers feasible individuals over infeasible individuals. It effectively does single-objective search until the feasible individual is found (killing some topology diversity then), and then emphasizes the first feasible individual excessively (because no other topology gets there quite as fast).

The following guideline led to a resolution: do not make topologies compete strongly against each other until they are at least nearly feasible. It is acceptable to have them competing once they are past feasible, because each topology will occupy its own niche in the performance space and will therefore be maintained. From this guideline, a series of constraint-satisfaction "gates" was designed, where the first earlier gates are cheaper to can prune out many poor sizes/biases quickly; and upon exiting the final gate, the topology can be assured to be competitive with other topologies.

Table 8 describes the algorithm for this improved InitialCircuit( ) routine. For the first/fastest gate (lines 2-5), function device operating constraints (DOCs) were use. These leverage the operating-point driven formulation as described above. The second gate (lines 6-9) is simulation-based DOCs. The third gate (lines 10-13) is performance constraints. In all three gates, the mutateSizings( ) operator is as described above, except only non-topology parameters get changed.

TABLE 8

Procedure InitialCircuit( ) (Improved Implementation)

nput: Φ
Output: φ∈ Φ
1. φ = randomDrawCircuit(Φ)
2. while meetsFuncDOCs(φ) ≠ True:
3.   φ' = mutateSizings(φ)
4.   if funcDOCsCost(φ') < funcDOCsCost(φ)
5.     φ = φ'
6. while meetsSimDOCs(φ) ≠ True:
7.   φ' = mutateSizings(φ)
8.   if simDOCsCost(φ') < simDOCsCost(φ)
9.     φ = φ'
10. while meetsPerfConstraints(φ) ≠ True:
11.   φ' = mutateSizings(φ)
12.   if perfCost(φ') < perfCost(φ)
13.     φ = φ'

In the experiments described in the present disclosure, it was found that the first gate would take about 1000-3000 designs to pass (very cheap because no simulation), step 3 would take 100-300 designs, and step 4 would take 300-1000 designs. Overall runtime for the procedure was typically less than 10 minutes on a single 2.5-GHz machine. This compares favorably with other recent single-topology circuit sizers, e.g., see G. Stehr, H. Graeb, K. Antreich, "Analog Performance Space Exploration by Normal-Boundary Intersection and Fourier-Motzkin Elimination," IEEE Trans. CAD 26(10), October 2007. The aim of reliably generating complex topologies which could compete against simple topologies for multi-objective search, ensuring topology diversity, was achieved.

In the section below, MOJITO's ability to find targeted topologies is validated.

The complete search space had $N_v$=50 variables which include both topology selection variables and sizing variables; there were 3528 possible topologies.

MOJITO's library and search algorithm were implemented in about 25000 lines of Python code ("Python Programming Language"), which used the libraries Pyro ("PYRO—Python Remote Objects") for parallel processing and Numeric v24.2 ("Python Numeric") for matrix computations. Table 9 gives other setup parameters.

TABLE 9

| EXPERIMENTAL SETUP PARAMETERS | |
|---|---|
| Technology | 0.18 μm CMOS |
| Load capacitance | 1 pF |
| Supply voltage | 1.8 V |
| Output DC voltage | 0.9 V |
| Simulator | HSPICE ™ |
| EA settings | K = 10, $N_L$ = 100, $N_A$ = 20 $N_I$ = 100,000 for Set I, $N_I$ = 180,000 for Set II |

TABLE 9-continued

EXPERIMENTAL SETUP PARAMETERS

| | |
|---|---|
| Constraints | Phase margin > 65°, DC Gain >= 30 dB, GBW >= 1 GHz, power <= 100 mW, dynamic range > 0.1 V, slew rate >= 1e6 V/s, dozens of device operating constraints |
| Objectives Experiment Set I | Maximize GBW, minimize power |
| Objectives Experiment Set II | Maximize GBW, minimize power, maximize gain, maximize dynamic range, maximize slew rate |

Specific Experimental Setup (Set I). Three runs were done, the only difference between them being the common-mode voltage ($V_{cmm,in}$) at the input. It is knows that for $V_{dd}$=1.8V and $V_{cmm,in}$=1.5V, topologies must have an NMOS input pair. For $V_{cmm,in}$=0.3V, topologies must have PMOS inputs. At $V_{cmm,in}$=0.9V, there is no restriction between NMOS and PMOS inputs.

Figure 13:
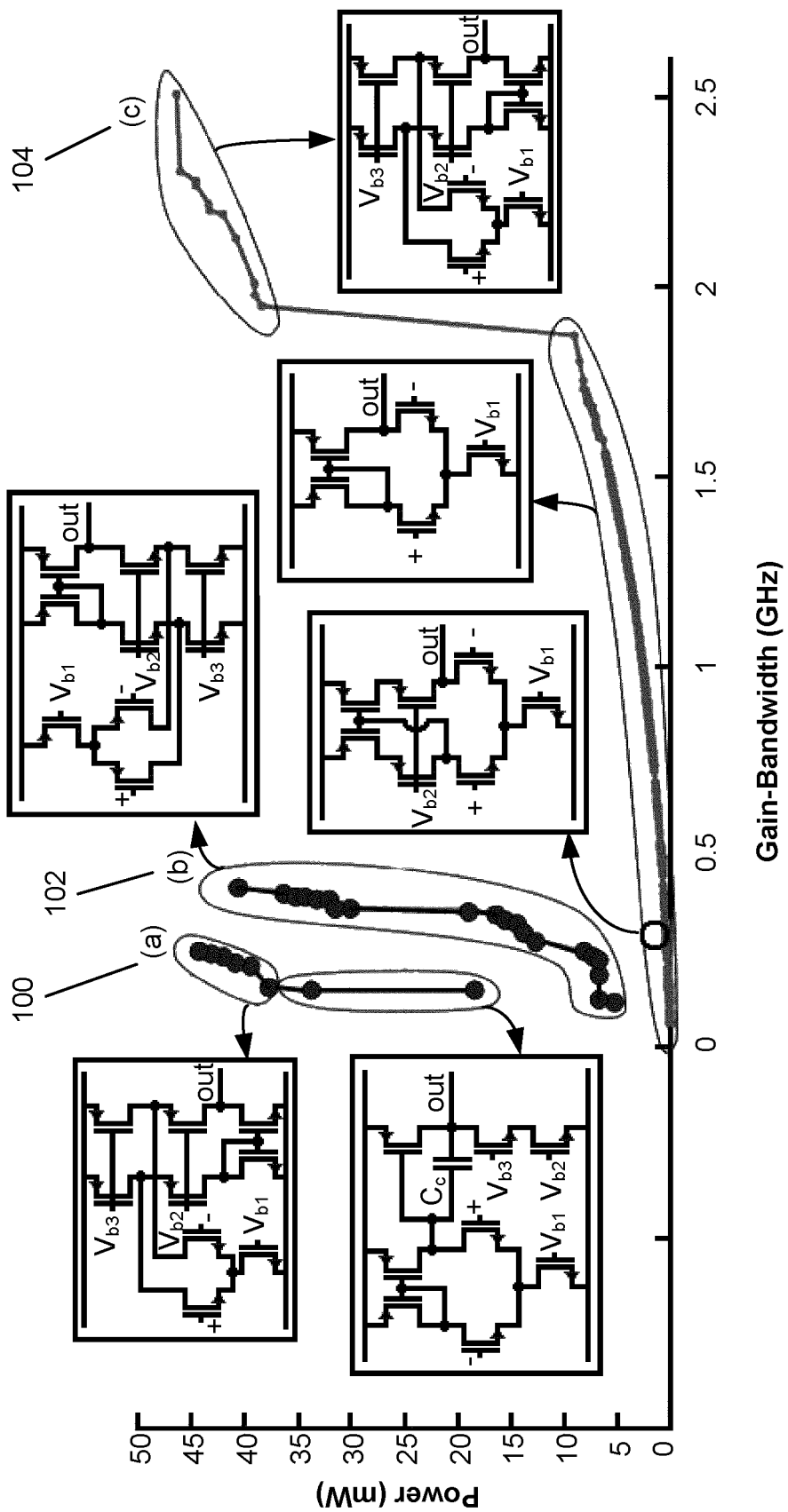
FIG. 13 shows a graph of Power vs. Gain-bandwidth for three different operating conditions of an op-amp structured and sized in accordance with a method of the present invention.

Experiment Set I Results. Each run took approximately 5 days on a single-core 2.0 GHz Linux machine. FIG. 13 illustrates the outcome of the experiments. It contains the combined results of three optimization runs. Result (a) (100) has $V_{cmm,in}$=1.5V, and has only topologies with NMOS inputs. MOJITO chose to use 1-stage and 2-stage amplifiers, depending on the power-GBW tradeoff. Result (b) (102) has $V_{cmm,in}$=0.3V, and MOJITO only returns PMOS input pairs. For result (c) (104) a $V_{cmm,in}$=0.9V has been specified. Though both NMOS and PMOS input pairs might have arisen, the optimization preferred NMOS inputs. The curve clearly shows the switch in topology around GBW=1.9 GHz, moving from a folded cascode input to a simple current-mirror amp. Interestingly, the search retained a stacked current-mirror load for about 250 MHz GBW. All in all, Experiment 1 validated that MOJITO did find the topologies that we had expected a priori.

Experiment Set II: Extraction of Expert Domain Knowledge Across Several Objectives. Whereas a single-objective multi-topology optimization can only return one topology, the more objectives that one has in a multi-topology search, the more opportunity there is for many topologies to be returned, because different topologies naturally lie in different regions of the performance space. Accordingly, the second set of experiments aimed to verify that MOJITO could get a broad set of topologies across several (five) objectives.

Furthermore, the experiments aim to automatically extract what has traditionally been tacit analog design knowledge about the relation among topologies, performances, and design variables. This knowledge is implicitly carried by analog designers based on their experience, but it has also been explicitly and tediously hand-coded in several topology-searching CAD tools. In contrast, the present disclosure aims to automatically extract knowledge via data mining on MOJITO results—to confirm, refine, and build on the designers' tacit knowledge without tedious manual effort. The data-mining is performed on sized topology data contained in the output database 64 shown at FIG. 1.

In the following experiment, a single run was performed, having five objectives. Other setup parameters were as described above. The run took approximately 12 hours on a Linux cluster having 30 cores of 2.5 GHz each (which is acceptable for an industrial setting). 180 generations were covered, traversing 3528 possible topologies and their associated sizings. It returned a database of 1576 Pareto-Optimal sized topologies.

Figure 14A:
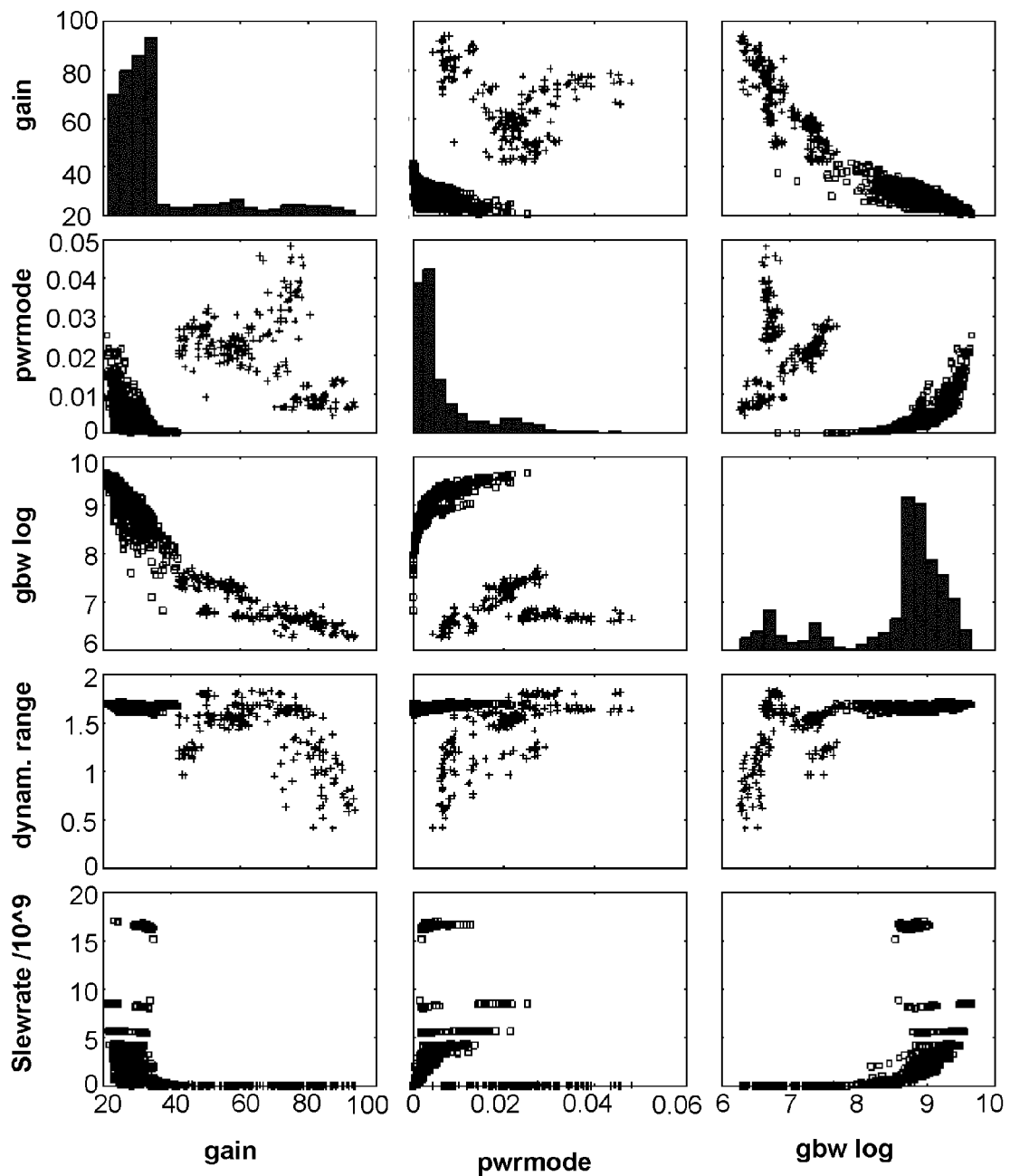
FIG. 14 shows a grid representing a Pareto-optimal front for an exemplary op-amp.
Figure 14B:
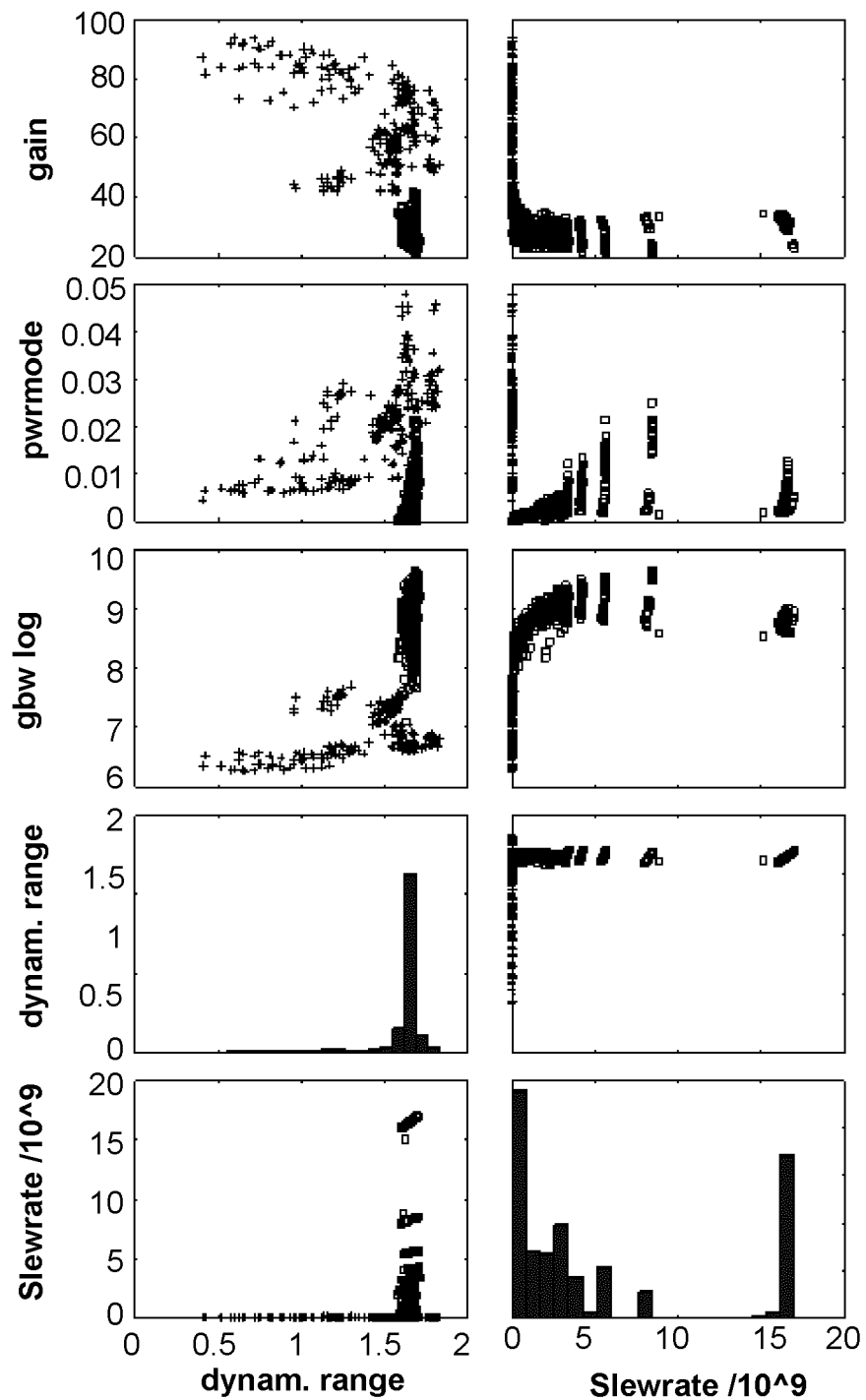

To become oriented with the raw results data, FIGS. 14a-14b shows a grid of 2D scatterplots and histograms for the five performance objectives. The performance objectives (also referred to as performance metrics) are gain, power (pwr-mode), gain bandwidth log (gbw log), dynamic range, and slewrate/$10^9$. From the histograms, shown on the diagonal plots in FIGS. 14a-14b, a quick picture of the distribution and bounds of performances is obtained. From the scatterplots (non-diagonal plots) it is possible to understand the performance bounds and note trends. For exampled, it is notable how the one-stage topologies (marked as squared) occupy a different region of performance space and follow a markedly different performance trend than the two-stage topologies (marked as +'s). The two-stage topologies have several sub-clusters of performances, hinting at further decomposition of topology types.

The following describes the automatic extraction of decision (CART) trees that map from performance values to topology choice. Decision trees have a double use: they can directly suggest a choice based on inputs, and also expose a series of steps underlying the decision. CART trees are in widespread use, such as medicine where there are numerous situations where a caregiver has to decide effectively and reliably. Decision trees have not gone unnoticed in analog CAD either, as they have been proposed as the centerpiece of topology-choosing "expert systems", e.g., see H.Y. Koh et al., "OPASYN: A Compiler for CMOS Operational Amplifiers," IEEE Trans. CAD vol. 9, February 1990, pp. 113-125. Unfortunately, these trees had to be manually constructed which took weeks to months of effort, and were based on rules of thumb that became obsolete as soon as the process node changed. In contrast, the present disclosure constructs the specs-to-topology decision tree automatically from data. This is only possible now, because a prerequisite to get the data was a competent multi-topology multi-objective sizer that could output a diverse set of topologies, as the present disclosure teaches.

Figures 15A, 15B:
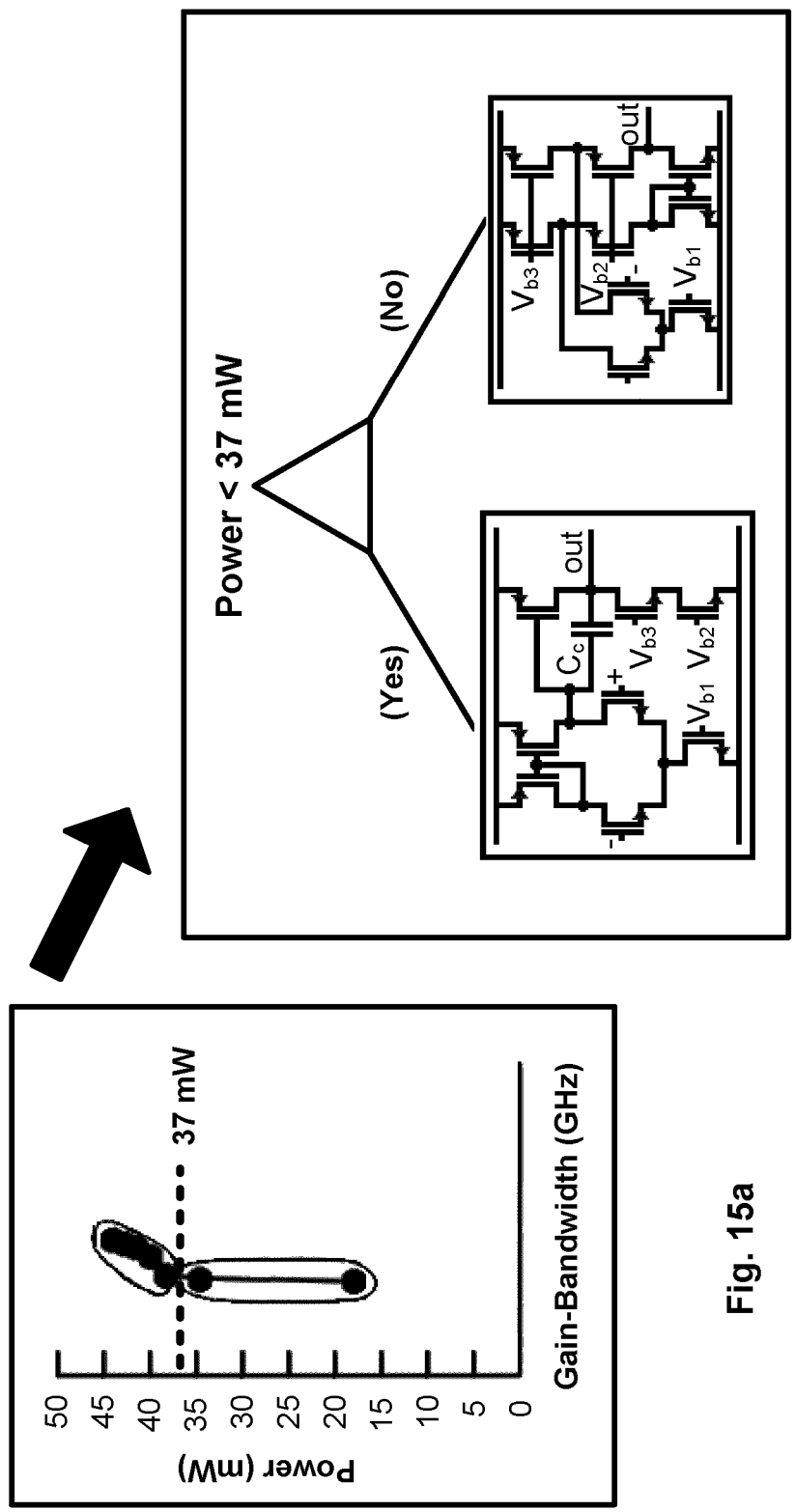
FIGS. 15a-15b shows how performance metric values can be classified in a CART tree.

The motivation for decision trees can be motivated with the following simple example having two objectives: minimize power and maximize GBW. FIG. 15a shows the power-GBW tradeoff results from a MOJITO run described above. Each point is a different sized topology; the eight sized topologies (eight points) have two unique topologies, as indicated by the two ellipses grouping the points.

It is apparent through inspection that the division between the ellipses (topology choice) is best done at a power between 34 and 38 mW. In this case, 37 mW is chosen. An algorithmic way to choose such a division is to sweep all possible values of power, and all possible values of GBW, and to choose the value and output that gives the best split. That single split to choose between the two topologies is embodied in the decision tree of FIG. 15b. That is, if a power <37 mW is chosen, the two-stage amplifier is chosen (Yes branch), otherwise a one-stage amplifier with folded-cascode inputs is chosen (No branch).

Making a topology decision based on inspecting the two-dimensional tradeoff is easy. But when there are more dimensions, such as the five dimensions as in the example described above, it becomes dramatically harder. Decision trees encapsulate and illustrate the relevant decisions in a high-dimensional space.

The following formulates a specs-to-topology decision tree induction as a classification problem from a Pareto Optimal Set $Z=\{\phi_1^*, \phi_2^*, \ldots, \phi_j^*, \ldots, \phi_{N_z}^*\}$ resulting from a MOJITO run. Within Z, there are $N_T$ unique topologies ($N_T \leq N_{ND}$) with corresponding class labels $L=\{1, 2, \ldots, N_T\}$. For individual $\phi_i^*$, let $t_j$ be its topology class label; $t_j \in L$. Let $f_j$ be the objective function values corresponding to $t_j$: $f_j=\{f_1(\phi_1^*), f_2(\phi_2^*), \ldots, f_{N_j}(\phi_j^*)\}$, an $N_j$-dimensional vector. Tree induction constructs a classifier C that maps $f_j$ to $t_j$, $\forall j=1 \ldots N_{ND}$. C can be viewed as a collection of M disjoint rectangular regions $R_b$, $b=1 \ldots B$; where each region b has an associated class $s_b \in L$.

Tree construction starts with just a root node holding all data points $\{f_j, t_j\}$, $j=1 \ldots N_{ND}$ and therefore is represented by a single region $R_1$ covering all of input f space. Each objective i is a possible split variable, and the values $f_{i,j}$ for that objective comprise the possible split values (with duplicates removed). From among all possible {split_variable, split_value} tuples in the data, the algorithm chooses the tuple with the highest information gain according to the chosen split criterion. That split creates a left and right child, where left child is assigned data points and region meeting split_variable≦split_value, and the right child is assigned the other points and region. The algorithm recurses, splitting each leaf node until a leaf node has too few points to split further. The final set of regions is defined by the leaf nodes' regions only. The tree-constructing implementation example of the present disclosure was made using Matlab™ (The Mathworks, Inc., "classregtree( ) routine", Matlab 7.5, http://www.mathworks.com). The "gini" splitting criterion was used; it selects the {variable, value} that splits off the most data points (e.g., see L. Breiman et al, Classification and Regression Trees, Chapman & Hall, New York, 1984). The minimum number of points per leaf node was 10 so that a compact tree would be generated.

Figure 16:
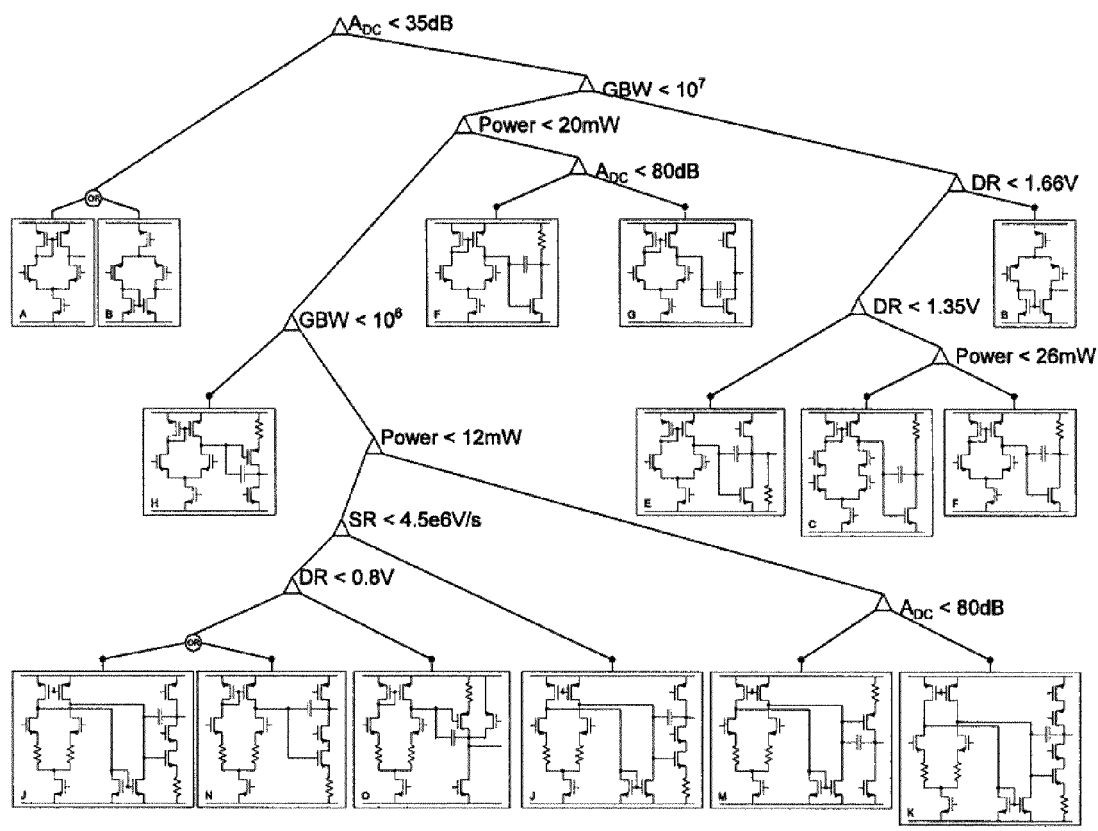
FIG. 16 shows an exemplary decision tree from specifications to topology.

FIG. 16 shows the tree that was automatically generated for the 5 objective problem described above. The tree provides insight into what topologies are appropriate for which performance ranges, and actually even gives a suggested topology from a set of input specs.

We see that the low-frequency gain (ADC) is the first variable selected on, and following through the tree, we see that all specifications play a role for selecting some topologies: gain-bandwidth (GBW), power, slew rate (SR), and dynamic range (DR). When the specifications require low gain, the tree suggests single-stage topologies; and two-stage topologies when a higher gain is required. In cases where a very large gain is required with a limited power budget, a two-stage amplifier with large degrees of cascading is suggested. If power is less of an issue, one can also use a non-cascoded two-stage amplifier. Since only Pareto-optimal individuals are used to generate the tree, the choice for the more power-efficient variant implies lower performance for one or more other metrics (in this case e.g. dynamic range). Also reassuring is that while there were thousands of possible topologies, just 15 were returned. This is in line with many analog designers' expectation that just a couple dozen opamp topologies serve most purposes. The challenge, of course, is which topologies those are, and for what specs they are appropriate.

It is important to remember that the tree is a classifier at its core, so one must avoid reading too much into it, such as the meaning of the exact values of the performance split values. In many cases the split value could increase or decrease by a few percent with no effect on classification. There are CART extensions to capture sensitivities to split values, but this is at a cost of additional complexity in the reported tree. Another extension is to let the user give preference to choosing certain split variables first, which may result in interesting alternative trees. We leave both to future work.

An additional benefit of tree extraction is based on there being more than 2-3 objectives, which means the raw data is difficult to visualize; the tree gives alternate perspective among 5 objectives, highlighting which topologies cover which performance regions.

The following addresses the problem of Global Nonlinear Sensitivity Analysis. The aim here is to address questions such as: "how much does each topology choice matter?" Should the topology or device sizes be changed? Which block or variables should be changed?" There may even be more specific questions, such as "how much does cascoding affect gain?" The approach of the present disclosure to handle such questions is to perform global nonlinear sensitivity analysis. The analysis should to be global—across the range of variables—because there are thousands of training points, and one cannot do small perturbations on integer-valued design variables such as topology-choice variables. Further, linear behavior cannot be assumed because not being local means a Taylor approximation does not apply; topology-choice variables are categorical; and small ad-hoc tests showed that linear models fit poorly.

The sensitivity extraction flow follow by the present disclosure for each performance metric y is as follows
1. Given: a MOJITO-generated Pareto Optimal Set $Z=\{\phi_1^*, \phi_2^*, \ldots, \phi_{N_z}^*\}$. Let $X=\{x_j\}$, $j=1 \ldots N_z$, where $x_j$ is an $N_d$-dimensional design vector corresponding to design point $\phi_j$. Let $y=\{y_j\}$ where $y_j$ is the corresponding scalar performance value of $\phi_j$ for the target objective (e.g. GBW)
2. Build a nonlinear regression model $\psi$ that maps X to y.
3. From $\psi$, compute global sensitivities $\zeta=\{\zeta_i\}$, $i=1 \ldots N_d$
4. Return $\zeta$ Steps 2 and 3 have specific challenges. Step 2, regressor construction, needs to handle numerical and categorical input variables. (Categorical variables are those which have discrete values and no relation among the discrete values, such as topology choice variables). This prevents usage of polynomials, splines/piecewise polynomials. support vector machines, kriging, and neural networks. CAFFEINE (T. McConaghy, T. Eeckelaert, G. Gielen, "CAFFEINE: Template-Free Symbolic Model Generation of Analog Circuits via Canonical Form Functions and Genetic Programming", Proc. DATE 2005, March 2005) handles categorical variables, but it would run very slowly on 50 input variables and 1500 training samples. A CART tree is not appropriate because the model needs to do regression, not classification. However, a relatively recent technology achieves the effect of regression on CART trees by boosting them: stochastic gradient boosting (SGB) (J. Friedman, "Stochastic Gradient Boosting," J. Computational Statistics & Data Analysis 38(4), 2002, pp. 367-378). SGB also has acceptable scaling and prediction properties, so we employ it here.

Step 3 above needs to compute sensitivities from the model, yet be global, nonlinear, and ideally, nonparametric. The proposed solution defines global nonlinear sensitivity (impact) for a variable $v_i$ as the relative error that a scrambled input variable $v_i$ will give in predicting, compared to other variables $\{v_j\}$, $j=1 \ldots d$, $j \neq i$ when they are scrambled. Table 10 gives an exemplary algorithm ModelSensitivities( ) that uses this concept to extract impacts. For each variable (line 1, Table 10), The algorithm does repeated scrambling (lines 3-4, Table 10) and keeps track of the resulting model error (lines 5-6, Table 10). The algorithm normalizes the results (line 6-7, Table 10) and returns. Ns is number of scrambles; nmse is normalized mean-squared error.

TABLE 10

Procedure ModelSensitivities( )

| | |
|---|---|
| Input: | $\Phi, y, N_d, \psi, N_{scr}$ |
| Output: | $\zeta$ |
| 1. | For i = 1 to $N_d$: |
| 2. | $\zeta_i = 0$ |
| 3. | Repeat $N_{scr}$ times: |
| 4. | $X_{scr}$ = X except randomly permute row i (for $d_i$) |
| 5. | $y_{scr} = \psi(X_{scr})$ #simulate model |
| 6. | $\psi_i = \psi_i + \text{nmse}(y, y_{scr})$ |
| 7. | $\zeta_{sum} = \sum_{i=1}^{d} \zeta_i$ |
| 8. | $\zeta_i = \dfrac{\zeta_i}{\zeta_{sum}}, i = 1 \ldots N_v$ |
| 9. | return $\zeta = \{\zeta_i\}, i = 1 \ldots N_d$ |

With above-proposed flow, global nonlinear sensitivities for each performance were extracted for the exemplary problem represented at FIGS. 9a-9i. SGB and CART were coded in about 500 lines of Python. SGB parameters were: learning rate $\alpha=0.10$, minimum tree depth=2, maximum tree depth=7, target training error 5%. $N_S$=500. Build time for the SGB on modeling the objective GBW was about 15 s on a 2.0 GHz Linux machine, returning a model containing 282 CARTs. Impact extraction from the model took about 25 s.

Figure 17:
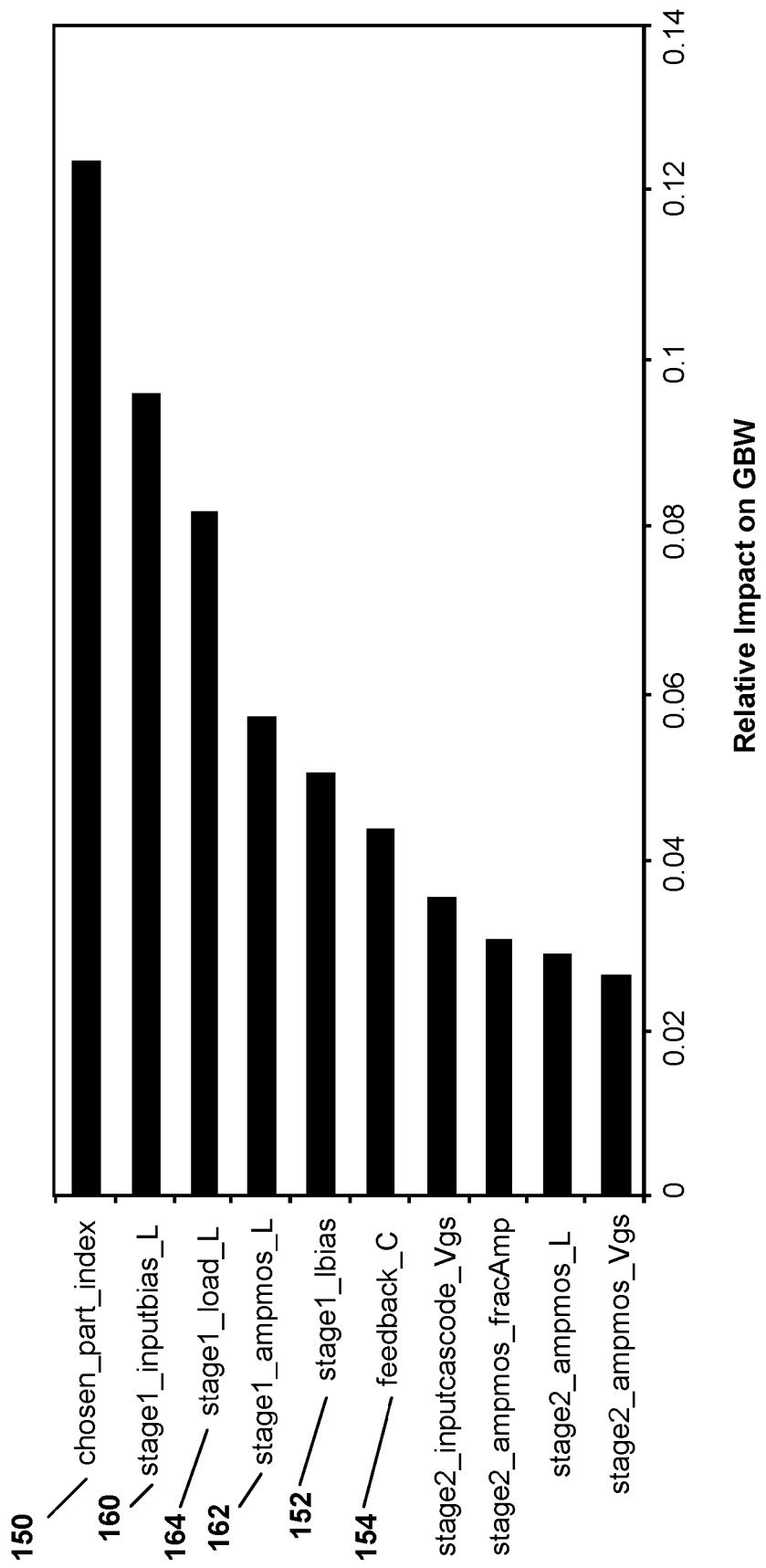
FIG. 17 shows chart representing global nonlinear sensitivities of a gain-bandwidth performance metric.

FIG. 17 illustrates results of the ten variables that impact GBW most. It can be noted that the most important variable is chosen_part_index 150, which selects one vs. two stages. The variables that are commonly associated with the GBW of opamps—the bias current of the first stage 152 and the size of the compensation capacitance 154—also appear. Interestingly, FIG. 17 indicates a large influence of the length of the transistors in the first stage (input 160, folding 162 and load 164). This can be readily explained: these lengths directly influence the impedance on the internal nodes, and hence the location of the non-dominant pole. The phase margin requirement (in this case, >65°) translates into the requirement that this non-dominant pole frequency is sufficiently higher than the GBW (approx 2x) (see: W. Sansen, Analog Design Essentials, Springer, 2006). It is also interesting to see that for GBW, only one topology parameter (150) made it into the top ten variables; sizing parameters comprise the other nine. This means that once one vs. two stages is chosen, changing the right sizing variables will make the biggest difference to GBW. Of course, the most sensitive variables can be different for different performance metrics, and the designer must consider all metrics.

The following relates to Extraction of Analytical Performance Tradeoffs. Designers often they manually manipulate equations that relate performance tradeoffs. Equations facilitate understanding because a direct relationship is expressed and the model can be manipulated to change the output variable. The problem is that hand-derived analytical expressions are based on $1^{st}$ or $2^{nd}$ order approximations and may have little relation to the process technology, therefore possibly having error of 20% or 50% or more. Some recent work has hinted towards automation. The authors B. De Smedt and G. Gielen, in "WATSON: Design Space Boundary Exploration and Model Generation for Analog and RFIC Design," *IEEE Trans. CAD* 22(2), 2003, pp. 213-224 did a single-topology multi-objective optimization run, then generated blackbox model of performance tradeoffs; but unfortunately the model is blackbox (giving no insight to the designer) and that only a single topology does not adequately describe the capabilities of the process technology. The authors M. Vogels, G. Gielen, in "Architectural selection of A/D converters," in *Proc. DAC*, 2003, pp. 974-977 conducted a thorough manual search of A/D converter technical publications to get Pareto Front data across many topologies, then created a whitebox model the performance tradeoffs. This, of course, was highly time-consuming, is already obsolete due to new process technology, and the models themselves were restricted to a fixed template.

The present disclosure aims to (1) automatically extract analytical performance-tradeoff equations that are (2) in agreement with process technology, (3) span a huge set of possible topologies, (4) are not restricted to a predefined functional template, and (5) can be automatically generated with each new process.

To meet the aims, we propose the following exemplary approach is used:

1. Given: a MOJITO-generated Pareto Optimal Set $Z=\{\phi_1^*, \phi_2^*, \ldots, \phi_{N_z}^*\}$. Let Y be a matrix describing its corresponding Pareto front, with one row per objective. Specifically, $Y=\{y_j\}$ $j=1 \ldots N_z$, where $y_j=f_j(\phi_j)=\{f_1(\phi_j^*), f_2(\phi_j^*), \ldots, f_{N_f}(\phi_j^*)\}$. Y is an $N_f \times N_z$ matrix.

2. Choose a target performance objective (e.g. GBW) indexed by I; $I \in \{1, 2, \ldots i, \ldots, N_f\}$ 3. Let $X_{-I}$ be all rows in Y except I. Let y be the $I^{th}$ row of Y. Therefore, y has the data of the target objective, and $X_{-I}$ has the data of the remaining objectives.

4. Build a set of CAFFEINE models that map $X_{-I}$ to y, trading off model error vs. model complexity.

5. Display the resulting model(s) to the designer.

CAFFEINE is a variant of GP symbolic regression (SR), which means it automatically generates template-free whitebox models to capture the mapping. To help ensure interpretable models, an issue for many GP SR approaches, CAFFEINE search is restricted to canonical functional forms. Furthermore, CAFFEINE is bi-objective, allowing it to generate a set of models which trade off model complexity for error.

CAFFEINE settings were the same as in T. McConaghy, T. Eeckelaert, G. Gielen, "CAFFEINE: Template-Free Symbolic Model Generation of Analog Circuits via Canonical Form Functions and Genetic Programming", Proc. DATE 2005, March 2005. The runtime was about 10 minutes a 2.5 GHz Linux machine.

Table 11 shows results for GBW. The gain was expected to be strongly related to the GBW, and it turns out that a simple linear relation between the two will get <9% training error. That is, a linear relation with gain will explain all but 9% of the variation of GBW. But for a better fit, i.e., to explain the variation with better resolution, more complex nonlinear relations are needed, leading to an inverse relationship of GBW with $\sqrt{gain}$. The slew rate objective is also needed for a reasonable model. Interestingly, dynamic range and power are not needed to get within 4.1% training error. Cross-examination with the scatterplots (FIGS. 14a-14b) confirms that the strongest tradeoffs are indeed among gain, GBW, and slew rate.

TABLE 11

WHITEBOX MODELS CAPTURING PERFORMANCE TRADEOFF

| Train error | Log(GBW) Expression |
|---|---|
| 8.7% | 10.28 − 0.049 * gain |
| 7.3% | 5.65 + 86.5/gain + 2.92e−11 * slewrate |
| 6.8% | 5.72 + 80.2/gain + 4.75e−06 * √slewrate |
| 5.7% | 7.30 + 47.76/gain − 3430/√slewrate |
| 4.1% | 4.48 + 24.9/√gain − 8.60e6/(gain$^2$ * √slewrate) |

Above was described MOJITO, a novel approach for EA-based trustworthy structural synthesis and expert knowledge extraction. MOJITO takes readily-transferable "general" expert domain knowledge as input: the domain's structural building blocks, hierarchically organized, which have been developed and refined over the years by domain experts. MOJITO's novel EA searches through combinations of these possible blocks to return a Pareto Optimal Set ("database") of trustworthy structures. From the database, MOJITO uses data mining to extract problem-specific expert domain knowledge capturing relations among structure, parameters, and performances: a specs-to-topology decision tree, global nonlinear sensitivity analysis, and analytical performance tradeoff models.

While the MOJITO approach is general, it is demonstrated in the problem domain of analog circuit topology synthesis, simultaneously searching across thousands of different one- and two-stage op amp topologies, and returning thousands of Pareto-optimal designs. Once the Pareto Optimal Set is generated for a given circuit type on a given process node, MOJITO enables an immediate-turnaround "specs-in, sized-topology-out" flow. To the inventor's knowledge, this is the first instance of a multi-objective analog topology synthesis approach having industrially palatable accuracy, setup requirements, runtime, generality, and guaranteed trustworthy results.

As will be understood by the skilled worker, it is not necessary to use a multi-objective search algorithm to benefit from the present invention. Other search algorithms, and evolutionary search algorithms, can be used to search a library of topologies defined with atomic, compound, and flexible blocks, as described above.

The following relates to an analog circuit design method that can produce an analog circuit design that is naturally robust to variations without requiring tuning and yet, scales with Moore's law, i.e., uses the smallest possible transistors.

The analog circuit design set out below leverages two advances in the field of analog design. These are: (i) because the tiniest transistors have become so small relative to a typical analog transistor, it is possible to potentially use far more transistors than a typical analog circuit, i.e. we can waste transistors, and (ii) recent developments in machine learning point to a new paradigm for designing analog machines—learning ensembles. The novel analog design approach described in the present disclosure, namely, Importance Sampled Circuit Learning Ensembles (ISCLEs), combines a lavish amount of tiny transistors into an ensemble of trustworthy circuits, found with boosting-style importance sampling and automated multi-topology sizing.

Two major sub-problems in machine learning are regression and classification, in which the aim is to find an input-output mapping that predicts well on unseen data. For decades, the prevailing approach was to come up with some single well-performing model, which almost always had the issue of overfitting, in which the model performed well on training data but generalized poorly to unseen data. However, a new approach has emerged in the last decade: ensembles of models, which combine the output of many learners. Ensembles are inherently less prone to overfitting because the errors made by sub-learners can be averaged out (assuming the sub-learners' outputs are not too correlated). In "bagging", each sub-learner learns the full input-output mapping. Alternatively, a series of "weak learners" can be "boosted" into a "strong learner" that captures the overall mapping (Y. Freund and R. E. Schapire, "A decision-theoretic generalization of on-line learning and an application to boosting." *J. Comp. & System Sci.*, 55(1), 119-139, 1997). Weak learning is much easier to do than strong learning of one model: each learner (weak learner) only needs to do better than random, rather than fully capture the mapping. An outer boosting algorithm takes care of combining the many weak learners together in order to get the target mapping. Boosting does importance sampling in model space, therefore earning the label Importance Sampled Learning Ensembles (ISLEs).

Figure 18:
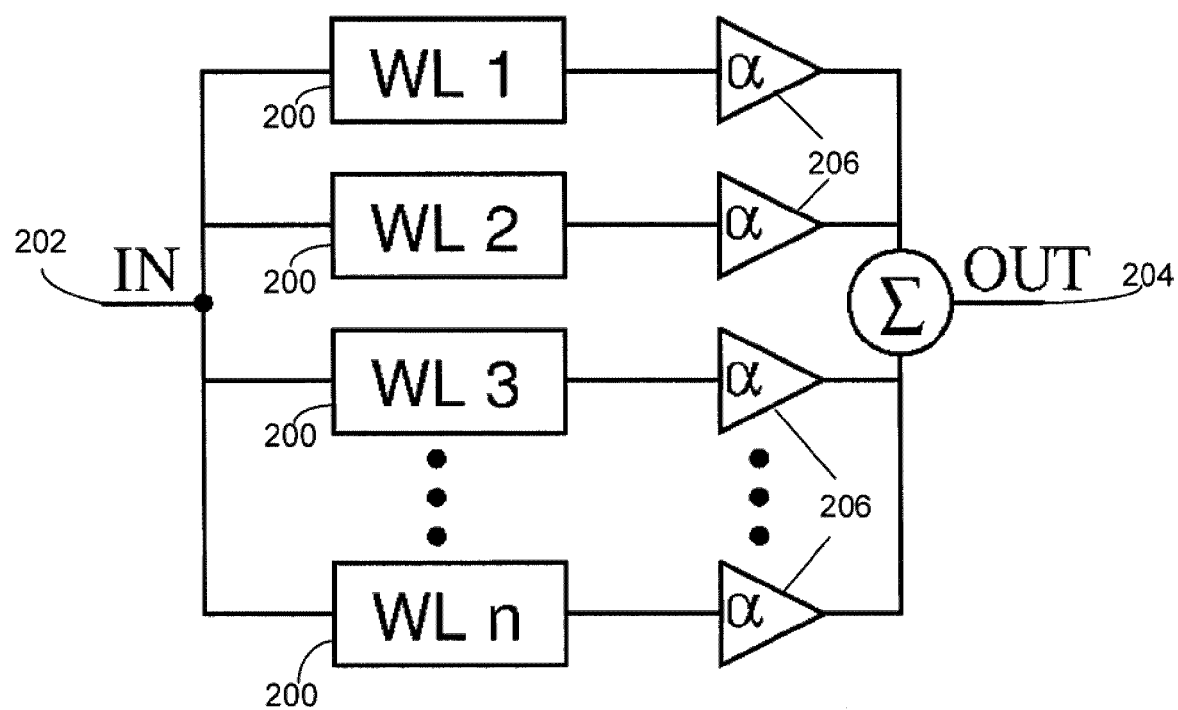
FIG. 18 shows an exemplary approach to weak learner boosting.

From a machine learning perspective, existing analog integrated circuit (IC) design approaches focus on some single "strong" circuit to realize the target functionality. In contrast, ISCLEs is an ensemble of "weak" circuits, boosted to collectively realize the target functionality. Crucially, these weak circuits each have small area (via near minimally-sized transistors) so that overall area is not prohibitive. An exemplary overall architecture is shown at FIG. 18, where weak learners (WL) 200 are connected to an input 202 at one end and connected at an output 204 at the other end. The learning rate (α) 206 for each WL 100 is shown as being the same for each WL 100; however, this need not be the case. An exemplary library of topologies, each topology being a weak learner, is shown at FIGS. 19a-19g. As such, in the present example, each weak learner 100 of FIG. 18 can be any one of the topologies of FIGS. 19a-19g.

Table 12 describes an exemplary high-level algorithm used in identifying and combining weak learners to obtain a desired analog funcitonality. The key input is an overall target waveform $y_{overall,target}$, and the output is an ensemble $EL_{chosen}$ to realize the target waveform. At each ISCLEs boosting iteration, a weak learner $WL_{cand}$ topology and sizing is chosen and, if it improves overall correlation, $r_{current}$, then it is added to the final ensemble with a weighting factor α, and the target waveform $y_{current,target}$ gets updated. Over time, the target waveform shrinks, zooming in on the hardest-to-capture parts of the mapping. That is, ISCLEs does importance sampling of circuit learning ensembles. The loop repeats until stopping criteria is hit, at which point the ensemble is returned. The whole process is automatic.

TABLE 12

ISCLEs Aglorithm

Input: $Y_{overall,target}$, $r_{target}$, α
Output: $EL_{chosen}$
$Y_{current,target} = Y_{overall,target}$
$r_{current} = 0.0$
$EL_{chosen} = \emptyset$
while $r_{current} < r_{target}$: #for each boosting iteration
    $WL_{cand}$ = find-weak-learner($y_{current,target}$)
    $EL_{cand} = EL_{chosen} + α • WL_{cand}$ #(as a circuit ensemble)
    $y_{cand}$ = simulate($EL_{cand}$)
    $r_{cand}$ = correlation($y_{overall,target}$, $y_{cand}$)
    if ($r_{cand} > r_{current}$): #improved
        $r_{current} = r_{cand}$
        $EL_{chosen} = EL_{cand}$
        $y_{current,target} = y_{overall,target} - y_{cand}$
return $EL_{chosen}$ The main boosting parameter is α (learning rate), which we set to 0.10, meaning that on each iteration, 10% of the newest weak learner's output is used to update the overall target waveform. This setting strikes a compromise between risk of overfitting (higher a), and slower convergence (lower α). Target correlation $r_{target}$ is set to 0.95. As will be understood by the skilled worker, α can be set to any suitable value.

A central challenge is to design a competent library of possible weak learners. Some applications may only need a simple inverter, and others may need more complex topologies. In the exemplary library shown at FIGS. 19a-19g, three weak learners: an inverter (FIGS. 19a-19d), an inverter with I-V amplifier (FIGS. 19e and 19f), and an inverter cross-coupled differential pair (FIG. 19g). Together, these form the library of possible topologies that traversed in multi-topology optimization.

Inverter learner: this is the simplest weak learner. A top-level inverter can instantiate as one of four possible sub-blocks shown in FIGS. 19 (a) to (d).

Figure 19A:
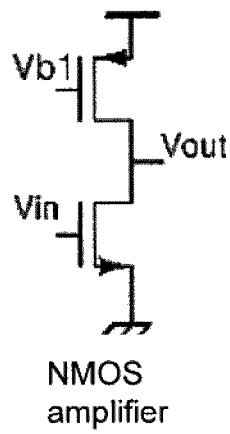
FIGS. 19a-19g show exemplary embodiments of weak learners that can be used in a weak learner library.
Figure 19B:
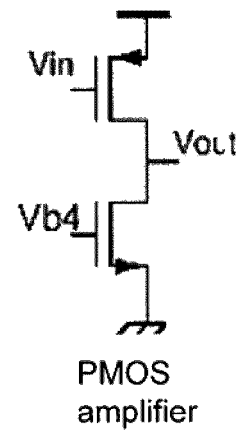
Figure 19C:
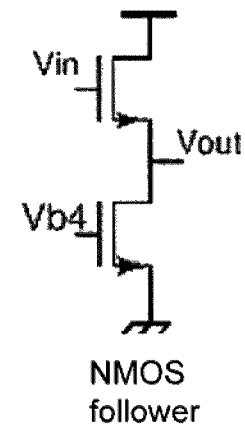
Figure 19D:
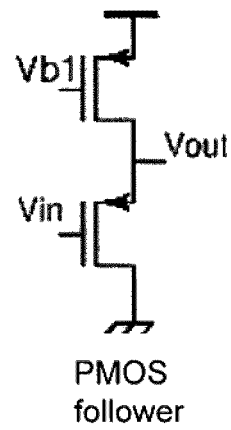
Figure 19E:
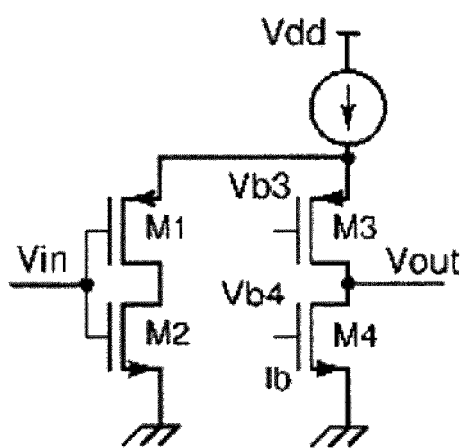
Figure 19F:
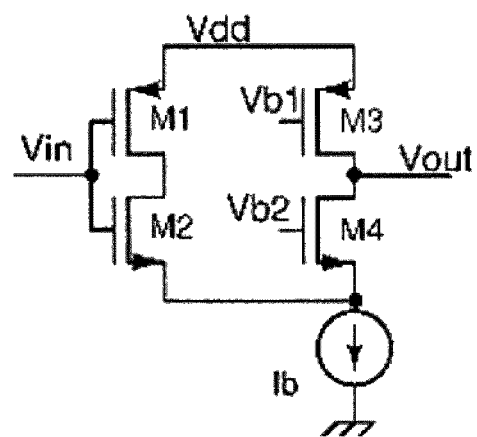
Figure 19G:
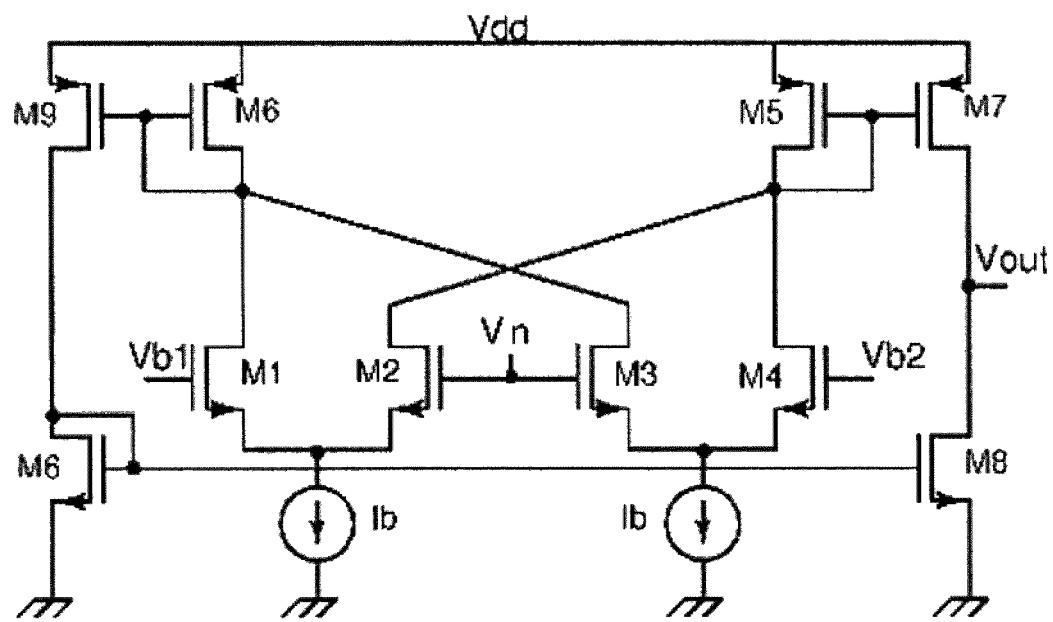
Figure 20:
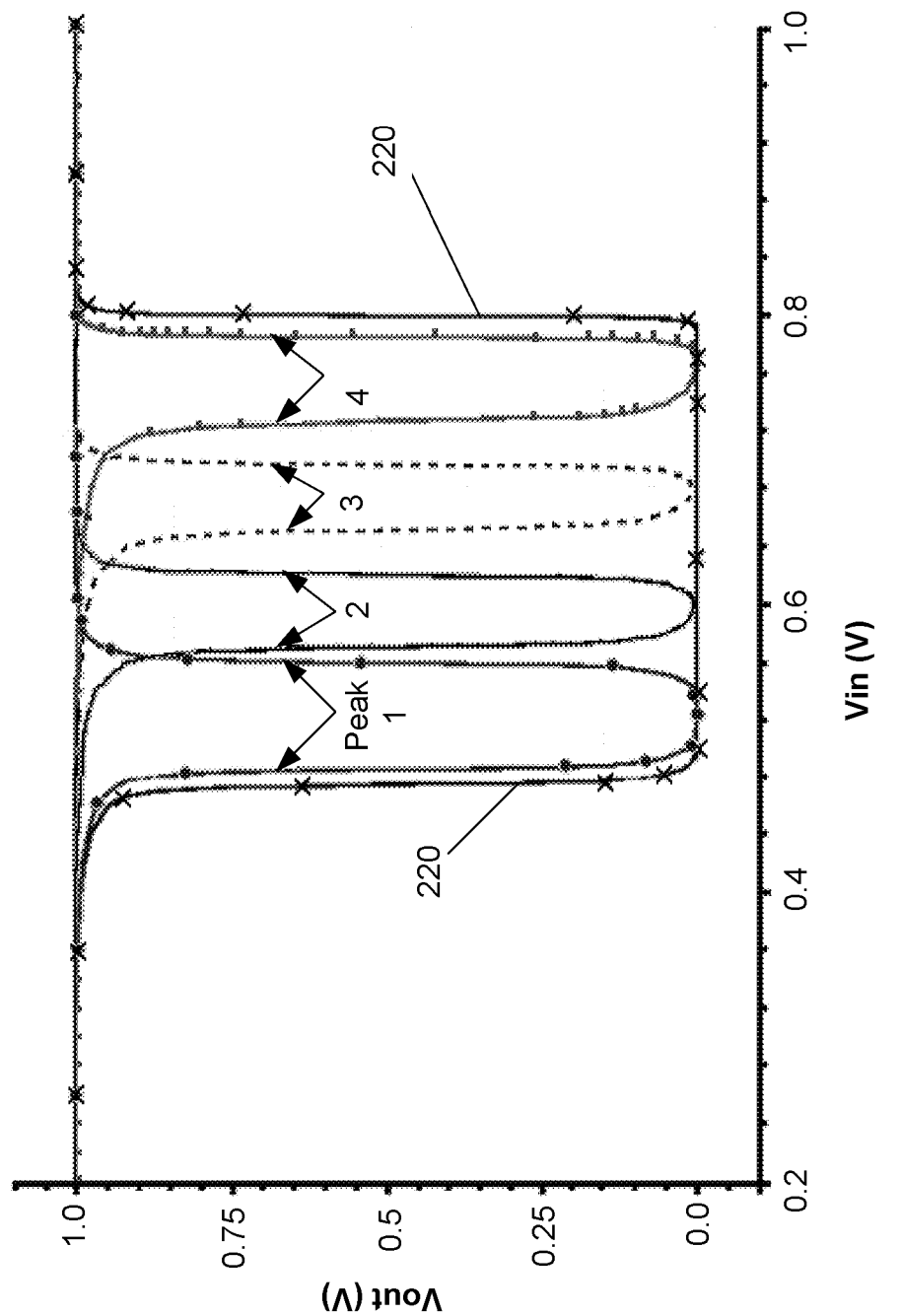
FIG. 20 shows negative voltage peaks of an I-V amplifier.

Inverter with I-V Amplifier: instantiations of this weak learner are shown at FIGS. 19e and 19f. Its core idea uses the fact that current flow in an inverter is not a monotonic function of the input voltage. While the input sweeps from 0 to Vdd, the current will increase because the NMOS is gradually turned on, but after a certain threshold point, the PMOS switches off and current will reduce to 0 again. This will form a current peak, and its position and width are determined by the sizing of the two transistors. If the aspect ratio of the NMOS is increased, the peak position will be lower, and vice versa. We then use an I-V amplifier to convert this current peak into a voltage peak; and by sizing it, we have controllable voltage peak waveforms. The peak's minimum width is limited by the finite gain and sensitivity of the I-V amplifier. A peak simulation result is shown at FIG. 20, which shows how different waveforms between any the transition point and the higher transition point are realizable by different transistor sizes.

Cross-Coupled Differential Amplifier: this weak learner circuit, shown at FIG. 19g, is composed of a cross-coupled differential pair and several current mirrors. The input signal is connected to one of the input pins of each differential pair. The other input pins are connected to different bias voltages $V_{b1}$ and $V_{b2}$. These two bias voltages set two fixed threshold points (D. Johns & K. Martin, "Analog Integrated Circuit Design", Wiley 1997). The size of input transistor pairs controls the threshold points, such that the output transfer curve 220 will be similar to FIG. 20.

Table 13 lists the parameters used for all weak learners. It is to be noted that the maximum device size is just 20 times the minimum feature size, which forces the building blocks to be as small as digital circuits. This enables analog circuits scaling.

TABLE 13

Parameters for Topology Choice & Sizing

| Weak Learner | Parameter Names | Parameter Range |
|---|---|---|
| Inverter Learner | $W_{in}, W_{load}, L_{in}, L_{load}$ | $[W_{min}, 20*W_{min}]$ $[L_{min}, 20*L_{min}]$ |
| Inverter with I-V Amplifier | $W_1, W_2, W_3, W_4,$ $W_5, L_1, L_2, L_3,$ $L_4, L_5$ | $[W_{min}, 20*W_{min}]$ $[L_{min}, 20*L_{min}]$ |
| Cross-Coupled Differential Pair | $W_1, W_2, W_3, W_4,$ $W_5, W_6, W_7, W_8,$ $L_1, L_2, L_3, L_4, L_5,$ $L_6, L_7, L_8$ | $[W_{min}, 20*W_{min}]$ $[L_{min}, 20*L_{min}]$ |

TABLE 13-continued

Parameters for Topology Choice & Sizing

| Weak Learner | Parameter Names | Parameter Range |
|---|---|---|
| Topology Choice | Choice_index | 1, 2, 3, 4, 5, 6, 7 |

Each weak learner is found with MOJITO searching the possible topologies and sizings. MOJITO views the search space as a parameterized grammar, then finds the optimal "sentences" with grammatical genetic programming. MOJITO's objective is to maximize the correlation between the current target waveform(s) (as specified by the boosting loop) and its candidate circuit's waveform(s). By optimizing on correlation rather than squared error, MOJITO's problem is easier because correlation ignores the difference in offset between waveforms; the outer boosting loop takes care of this with an offset voltage. MOJITO's constraints are device sizing constraints and device operating constraints (e.g. "keep transistor in saturation").

In the present example, MOJITO was configured to maximize search efficiency yet avoid getting stuck, using the following setup. At a given weak learner target, the population size was set to 10, and 50 generations were run. If the resulting circuit reduced the ensemble's overall error, then that weak learner was considered complete, and added to the ensemble. But if overall error did not improve, then the population size was doubled and MOJITO was re-run. In practice, we found that no doubling occurred in early iterations, but a few rounds of doubling occurred in later iterations. All other MOJITO settings were the same as described above.

The ISCLEs algorithm of Table 12 was applied to two different kinds of problems: a DC-DC sinusoidal function converter, and a 3-bit flash A/D converter.

The circuit simulator used was HSPICE™, using a 0.18 μm CMOS process technology. All runs were on a single Linux machine with a single-core 2.0 GHz Intel processor. Other settings are given in the sections above.

Figure 21A:
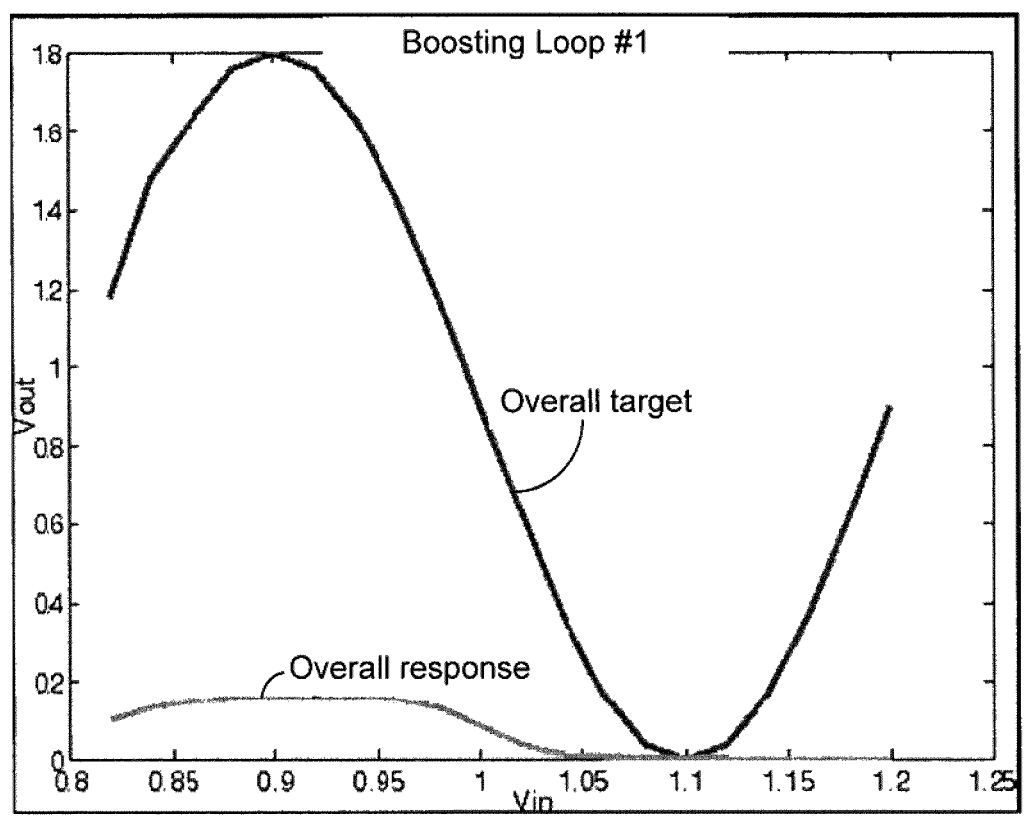
FIGS. 21a-21f show data at different stages of an exemplary ISCLEs' run for a DC-DC sinusoidal circuit, and a plot of error vs. iteration number.
Figure 21B:
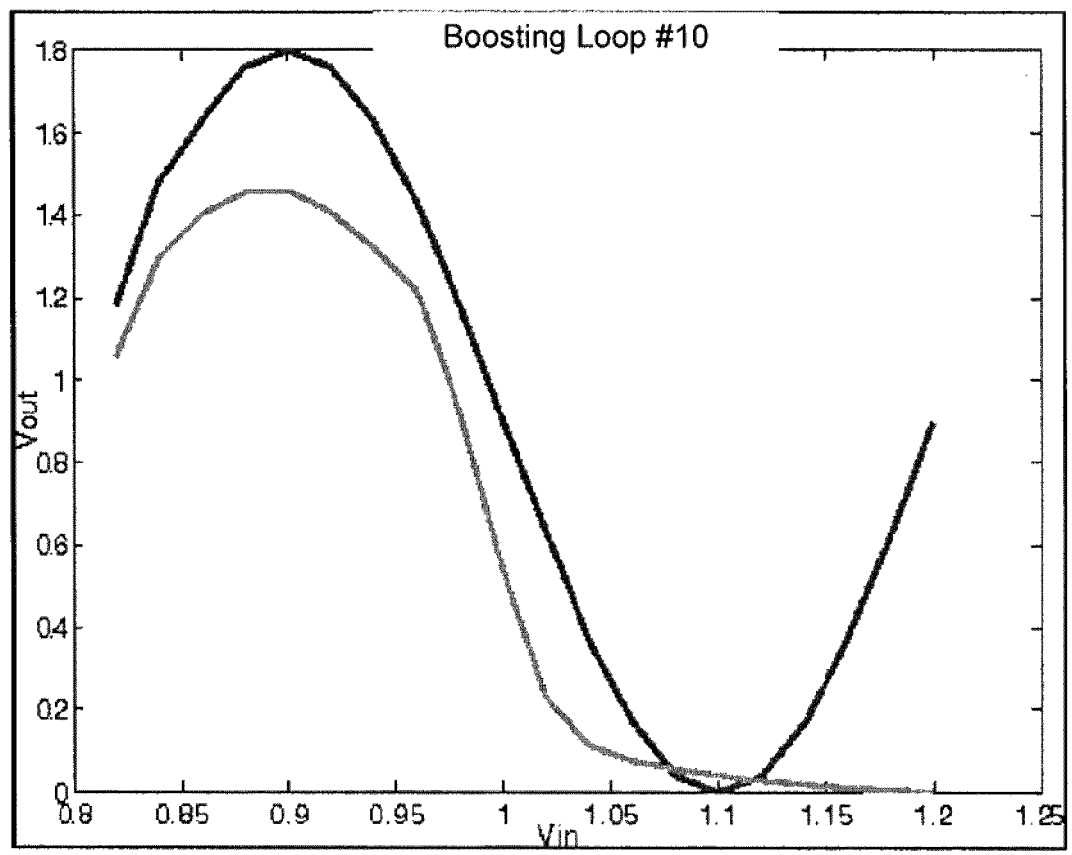
Figure 21C:
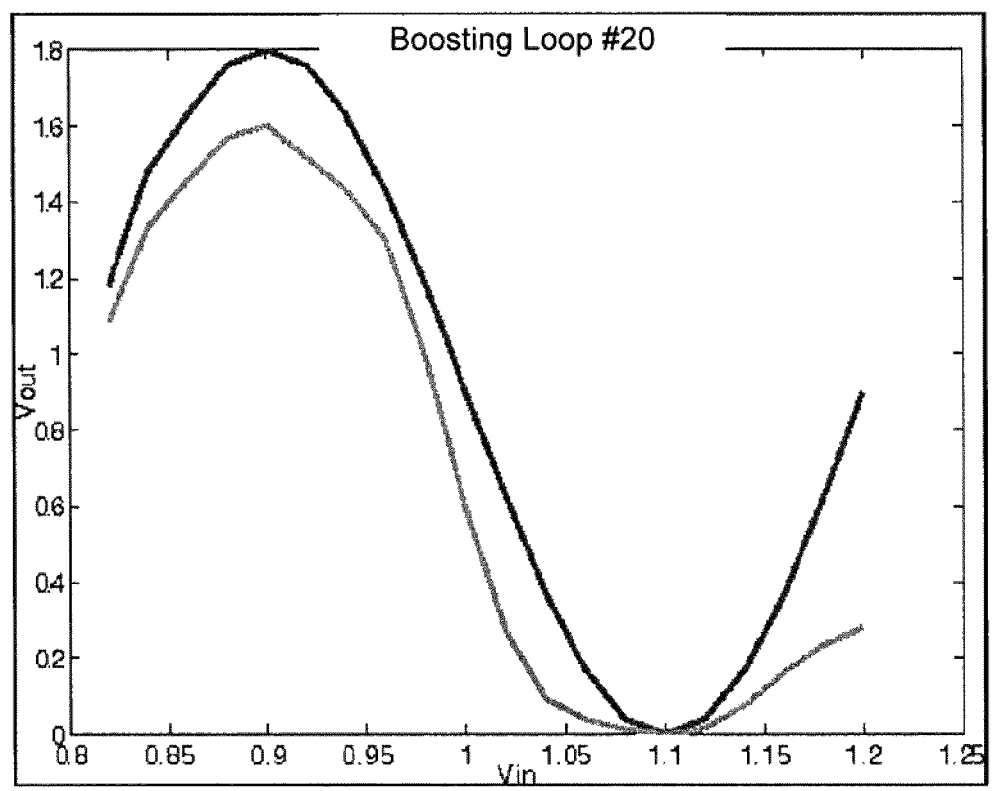
Figure 21D:
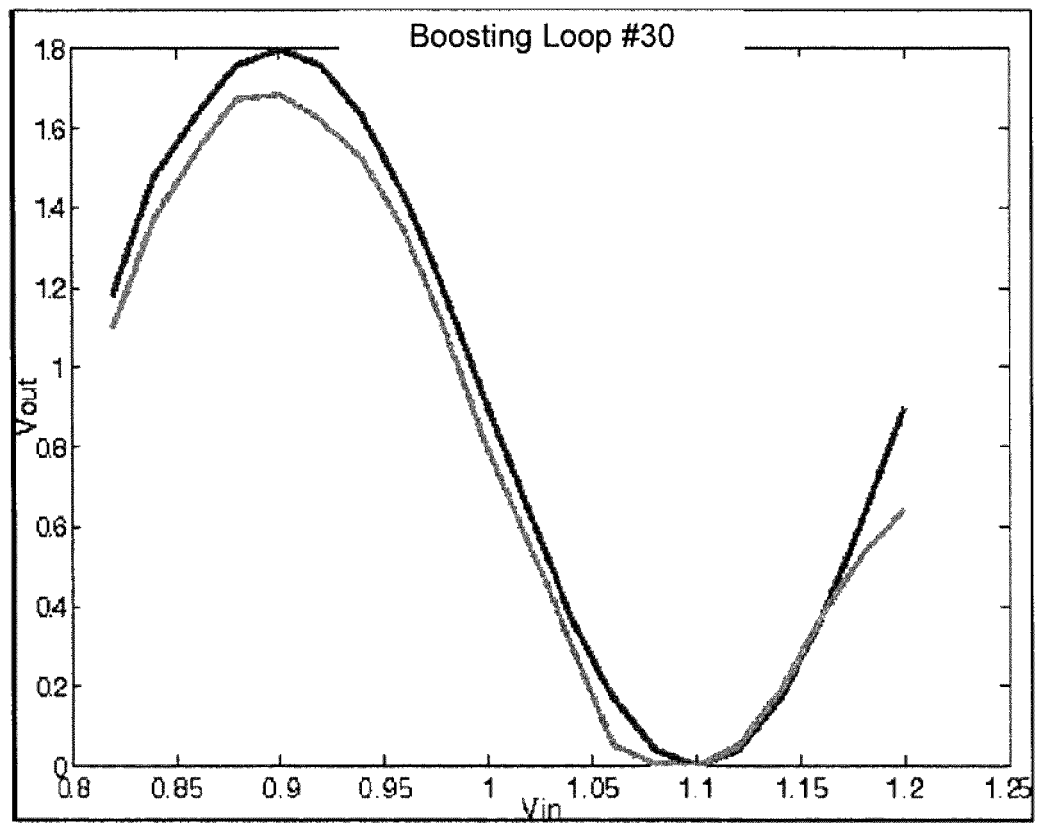
Figure 21E:
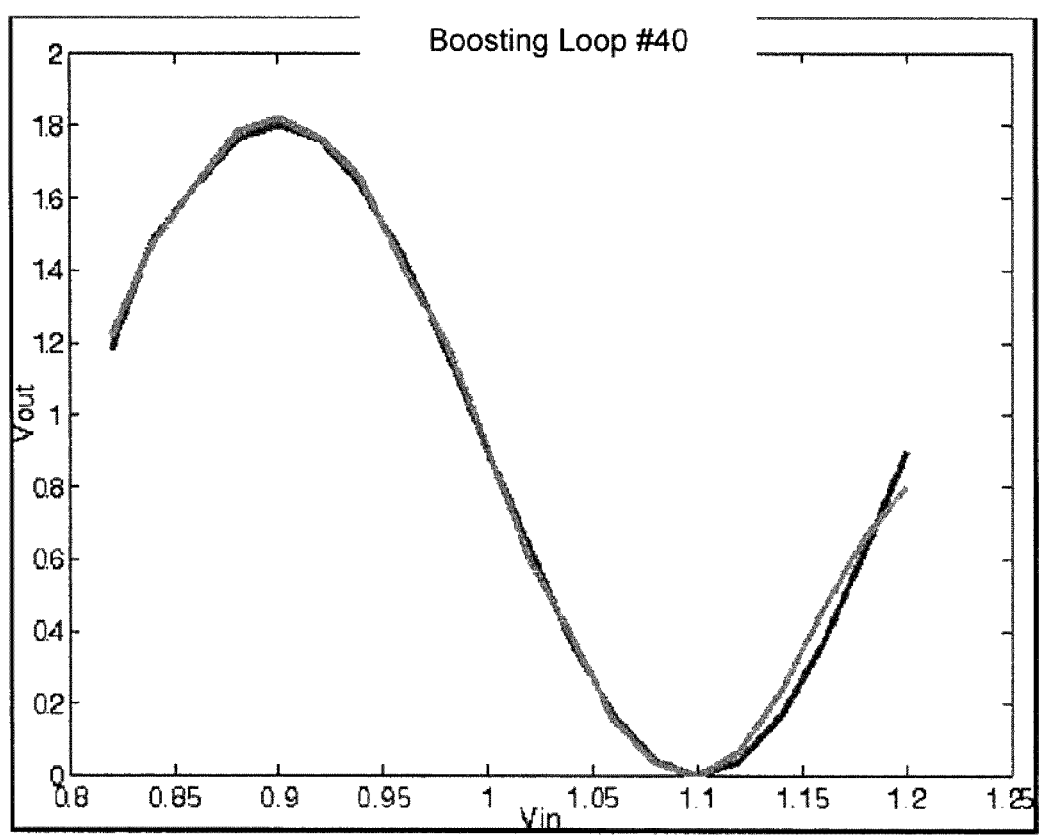
Figure 21F:
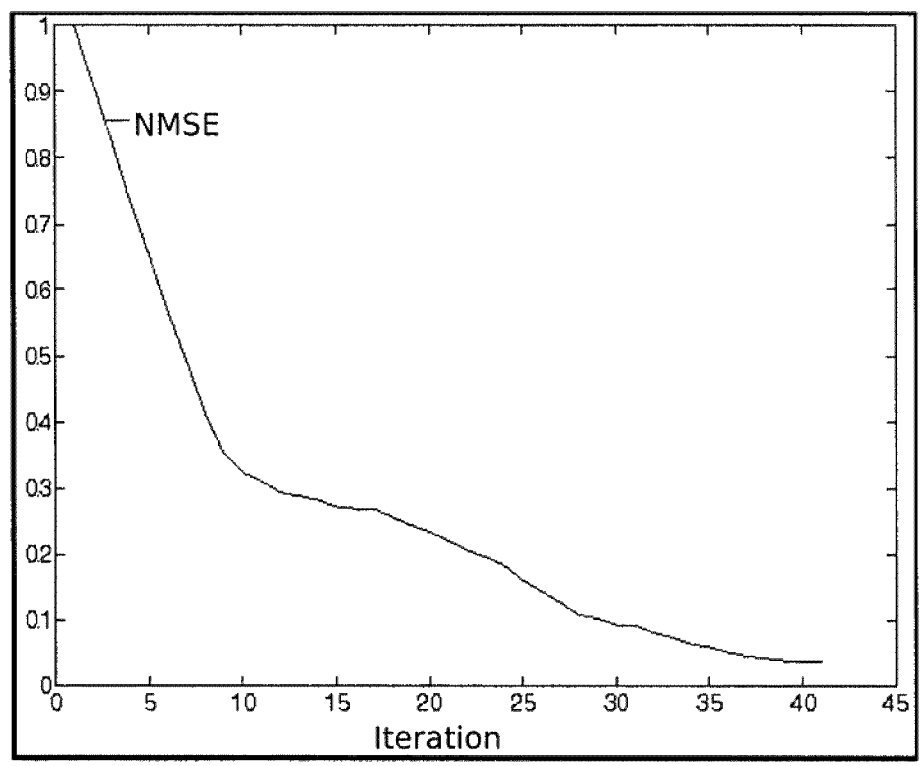

Sinusoidal waveform: FIGS. 21a-21e shows the result of 40 boosting iterations, resulting in an ensemble of 40 weak learners. FIGS. 21a to 21e show ensemble's output response waveform as it converges to match the target waveform. FIG. 21f shows the evaluation parameter NMSE (normalized mean squared error) vs. boosting iteration. We see that after 40 iterations, only a few percent error is remains between the target and ensemble circuit's responses. This example demonstrates that the core idea of ISCLEs—using boosting-style importance sampling to construct circuits—is sound.

3-bit Flash A/D Converter: the aim of this example is to target A/D conversion. In this case a 3-bit Flash architecture was targeted. Flash A/Ds are quite sensitive to process variations, due to the matching property of the resistor ladder and comparator. This problem was approached by designing one bit at a time. For each bit, the aim is to minimize the squared error difference between target DC response and synthesized circuit's DC response, for several different input DC values. Runtime for all three bits was two days.

Figure 22A:
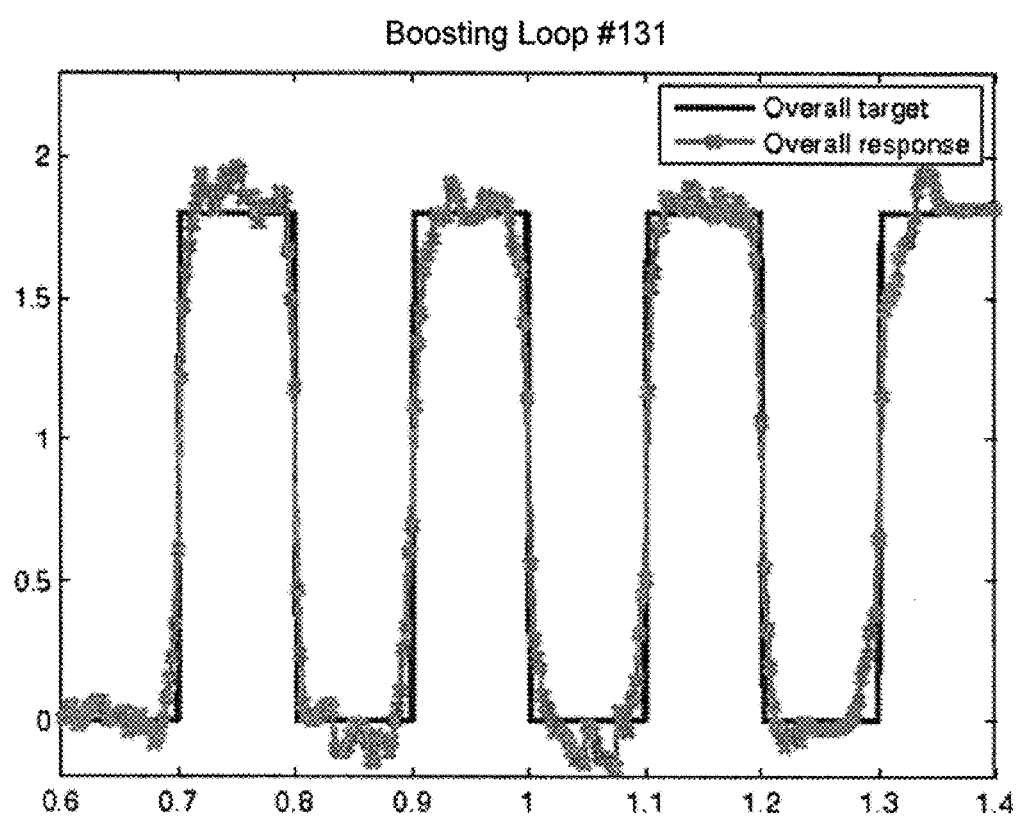
FIGS. 22a-22f show data of an exemplary ISCLEs' run for a three bit Flash ADC.
Figure 22B:
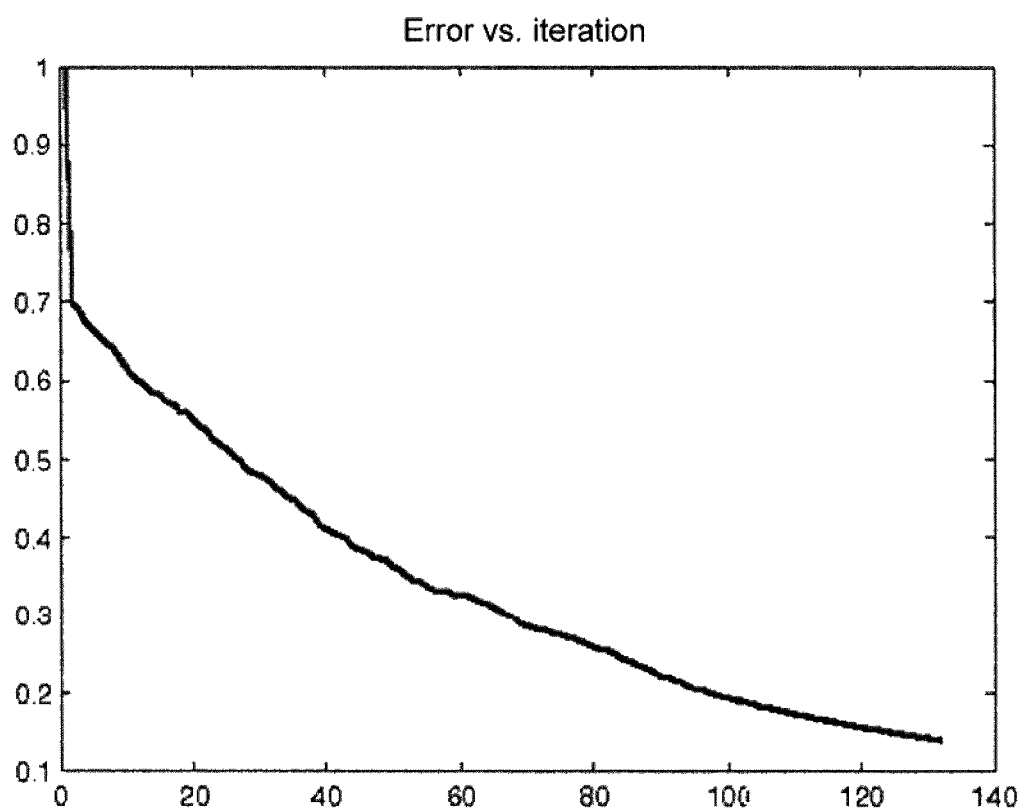
Figure 22C:
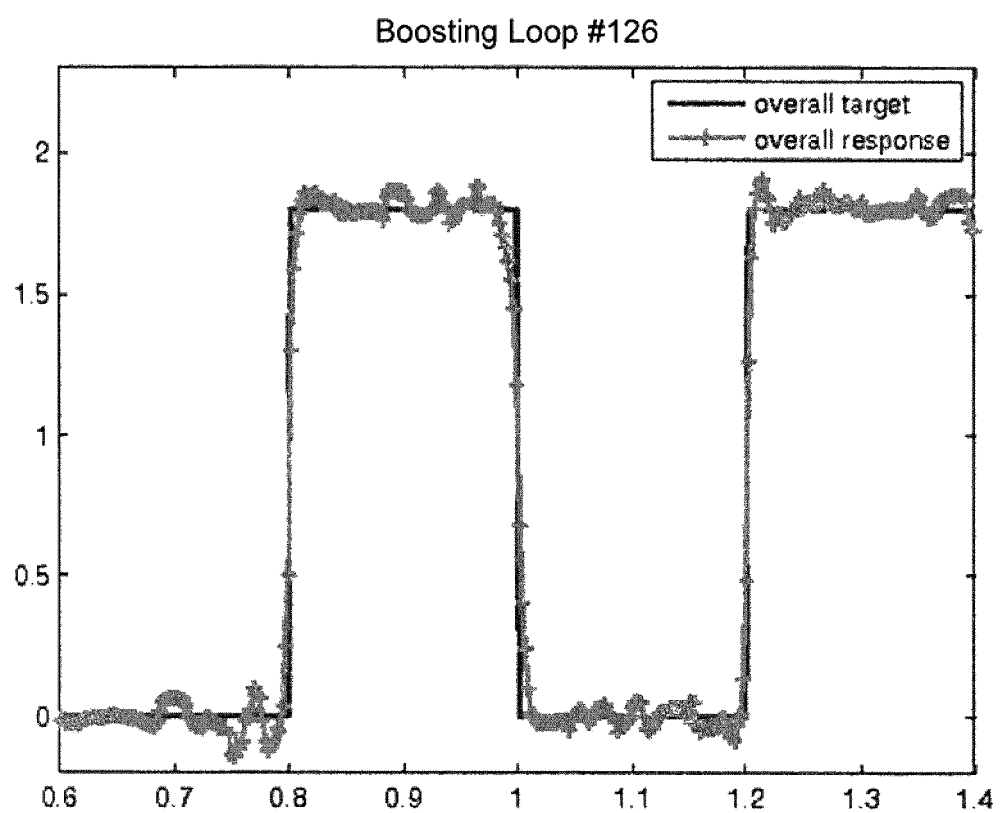
Figure 22D:
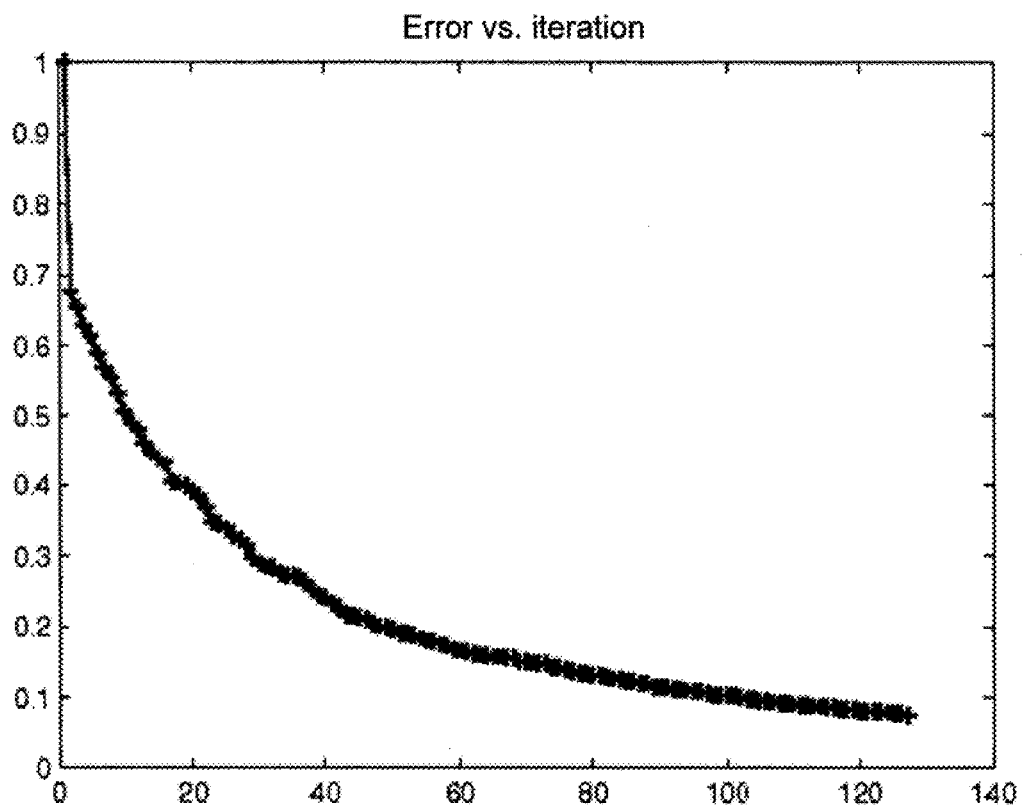
Figure 22E:
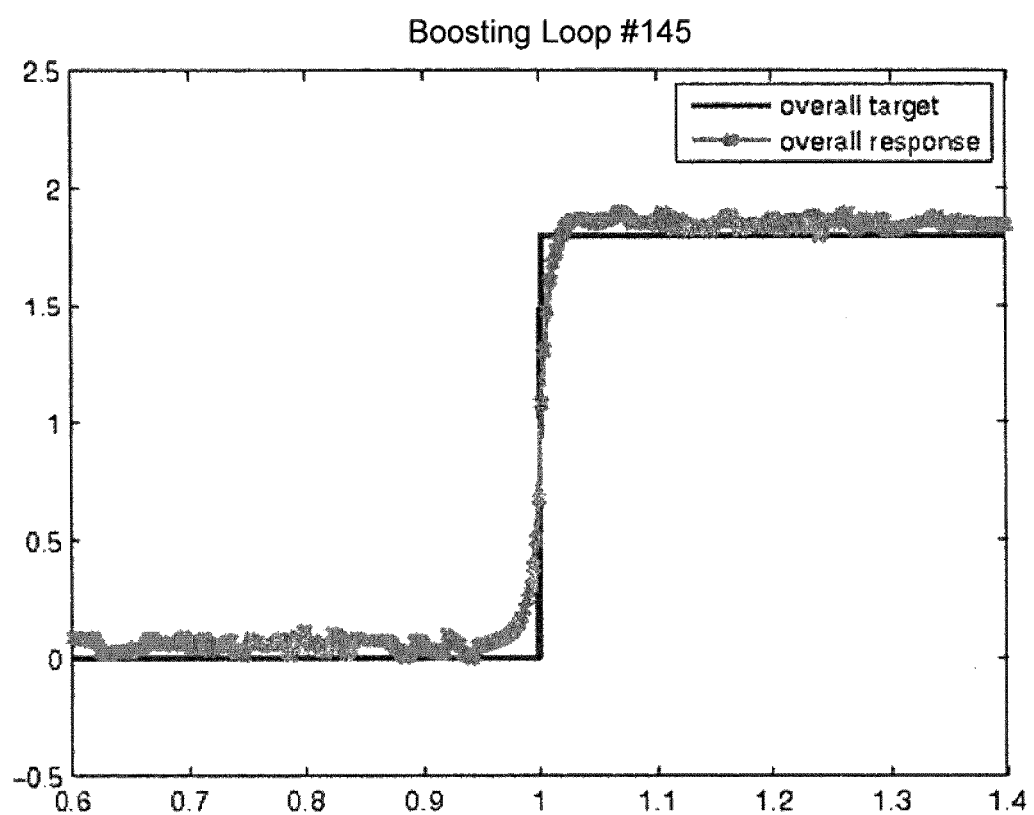
Figure 22F:
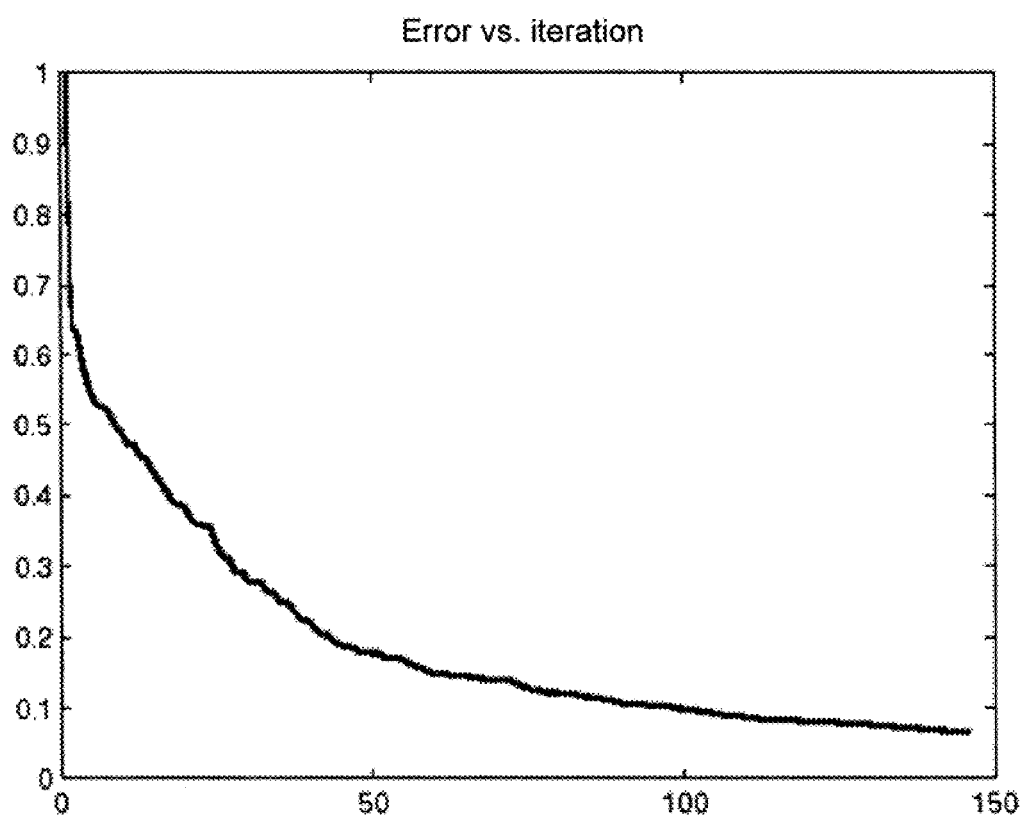

FIGS. 22a-f show the results. It is observed that all the waveforms of the three output bits match with their target waveform within certain error margin. At FIG. 22a, the lowest significant bit (LSB) shows the most complex input/output mapping, but ISCLES still achieved 13% error, having 131 weak learners. FIG. 22b shown the nmse related to the LSB. With respect to FIG. 22c, the 2nd LSB reached 9% error with 126 weak learners. FIG. 22d shown the nmse related to the 2nd LSB. With respect to FIG. 22e, the most significant bit (MSB) also reached 9% error with 145 weak learners. FIG. 22f shown the nmse related to the MSB. It is to be noted that for actual implementation, the bits' outputs are usually passed through an inverter that would rail the outputs to the high or low voltage value (i.e. Vdd and ground), thus making the DC-DC mapping tighter yet.

Figure 23:
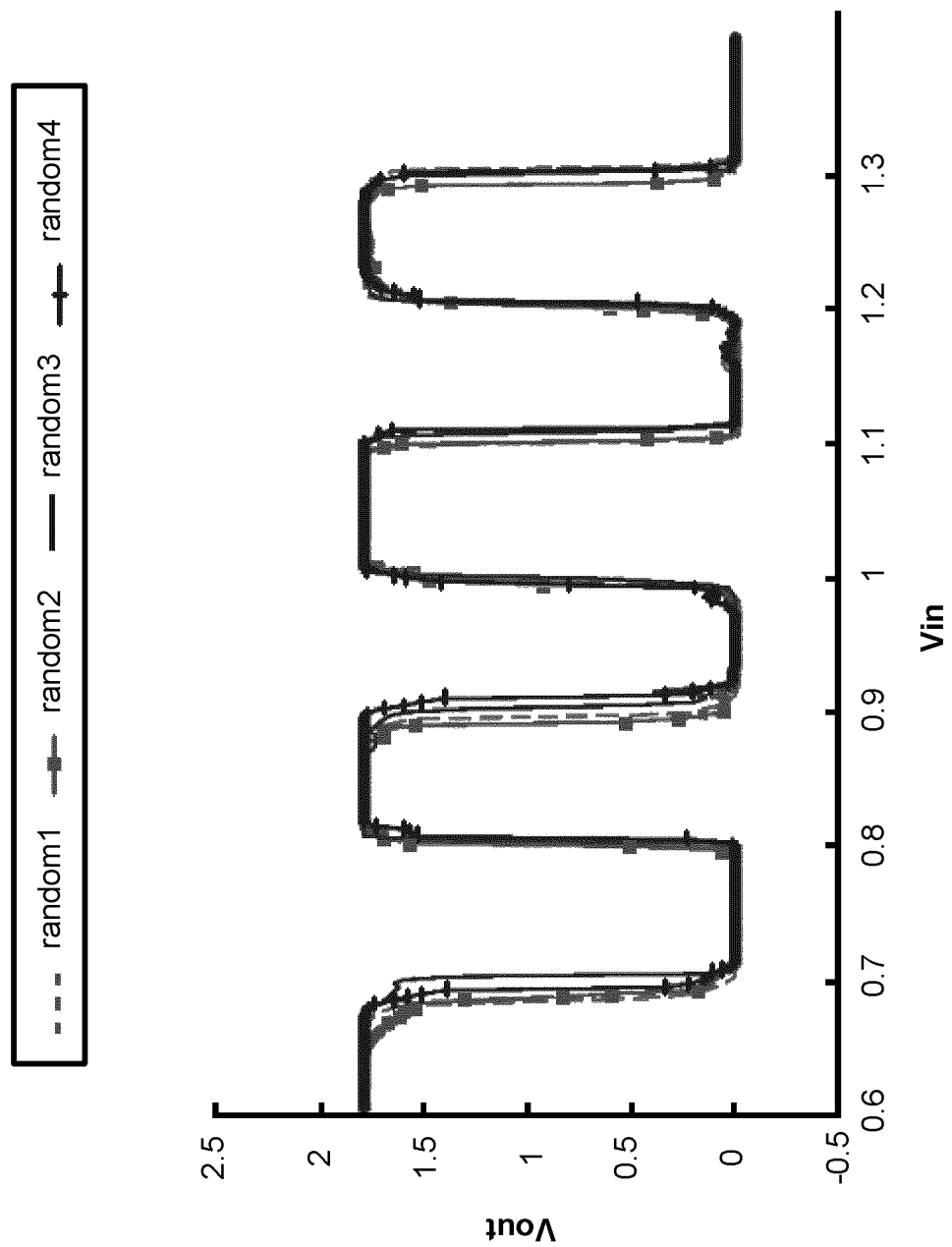
FIG. 23 shows a graph comparing standard and ISCLEs design approaches for a three bit ADC.

A/D Converter Simulation with Process Variation: it this example, ISCLEs' ability to tolerate process variation by injecting variation into devices' $V_{th}$ is tested. FIG. 23 shows four LSB Monte Carlo simulations with $A_{VT}$=5 mVμm ($A_{VT}$ being the variation of parameter $V_T$). Notably, the response only changes slightly, indicating ISCLEs' potential to tolerate process variations.

ISCLEs Scaling Potential: the following uses the A/D results to explore the potential of ISCLEs for scaling analog with Moore's Law. The effective number of bits (ENOB) of this 3-bit ADC @100 kHz is 2.78. The estimated active chip area is 14e-09 m$^2$ (in 180 nm CMOS) and 10e-09 m$^2$ (in 90 nm CMOS). The following calculation assumes that the area of a conventional A/D, which should tolerate resistor matching (1%) and $V_{th}$ variation (5 mVμm), and achieves the similar ENOB. By rough estimation this chip should be larger than 1e-09 m$^2$ (in 180 nm CMOS) and 0.8e-09 m$^2$ (in 90 nm CMOS). According to the ITRS, $A_{VT}$ will stop shrinking, but analog area will not shrink anymore. The chip will still slowly get smaller because of the shrinking of the digital part. With ISCLEs, mixed-signal chips will continue shrinking because the analog side uses minimally-sized transistors.

As such, the ISCLEs approach is provides a novel analog integrated circuit design method for robust design and with good technology scaling properties. It adapts boosting-style importance sampling from machine learning into the context of circuit design, by combining dozens of digitally-sized "weak learner" circuits to get an overall target analog functionality. To support the boosting framework, a library of weak learner topologies was designed; a topology is selected and sized at each iteration by multi-topology sizing.

ISCLEs was demonstrated on two problems: a sinusoidal function generator, and 3-bit A/D converter learning. By demonstrating resilience to process variations yet using minimally-sized devices, ISCLEs has promise as a way for analog circuits to scale with process technology.

As will be understood by the skilled worker, it is not necessary to use a multi-objective search algorithm in the ISCLEs method. Other search algorithms and evolutionary search algorithms, with single or multi-objective, can be can be used to search a library of topologies.

Figure 24A:
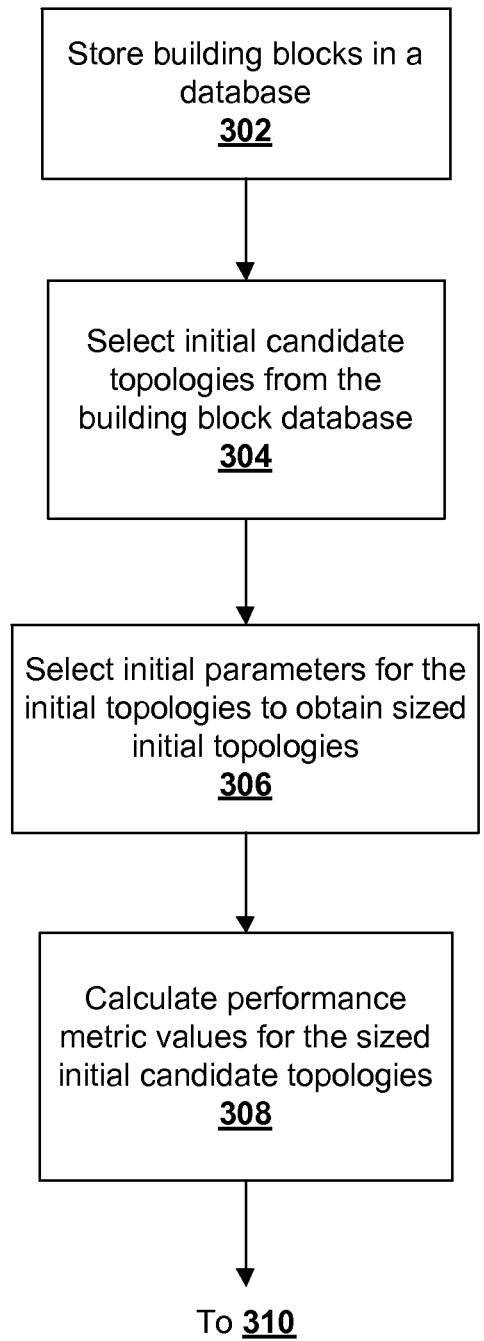

A flowchart of a method of selecting a structure and parameters of an electrical circuit component (ECC), according to certain examples of the present disclosure, is shown at FIGS. 24a and 24b. The ECC has design variables, and performance metrics; each performance metric is a function of at least one design variable. At action 302, an arrangement of pre-defined, hierarchically interconnected building blocks of the ECC is stored in a building block database. Each building block represents a sub-circuit of the ECC and each building block has respective input parameters. The building blocks include atomic blocks, compound blocks, and flexible blocks. Each individual compound block has at least one of a first atomic block, a first compound block and a first flexible block. Each individual flexible block has alternative building blocks selectable through a choice parameter of each individual flexible block. Each alternative block includes at least one of a second atomic block, a second compound block and a second flexible block. The arrangement of pre-defined, hierarchically interconnected building blocks represents candidate topologies of the ECC.

At action 304, candidate topologies are selected from the building block database to obtain initial candidate topologies. At action 306, initial parameters are selected for the initial topologies to obtain sized initial candidate topologies. Then, at action 308, performance metric values are calculated for the sized initial candidate topologies to obtain calculated performance metric values.

Subsequently, at action 310, in accordance with the calculated performance metric values, it is determined if the sized initial candidate topologies fail to meet pre-determined criteria. If the sized initial candidate topologies fail to meet a pre-determined criteria in accordance with a search algorithm then, at action 312, the candidate topologies are searched for other candidate topologies; at action 314, parameters are selected for the other candidate topologies to obtain sized other candidate topologies; at action 316, performance metric values are calculated for the sized other candidate topologies to obtain other calculated performance metric values. Subsequently, the method of FIGS. 24a and 24b proceeds back to action 310 where, in accordance with the other calculated performance metric values, it is determined if the sized other candidate topologies fail to meet the pre-determined criteria. When it is determined, at action 310, that the sized initial candidate topologies or the other candidate topologies do not fail to meet the predetermined criteria, the method proceeds to action 318 where sized candidate topologies, and their respective performance values, that do meet the pre-determined criteria are stored in an output database. At action 320, the sized candidate topologies that meet the pre-determined criteria are displayed for selection.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks. FIG. 24 shows an embodiment of a non-transitory computer-readable medium 500, which has recorded thereon instructions and statements 502 for execution by a computer 504 to carry out a method described above.

Figure 25:
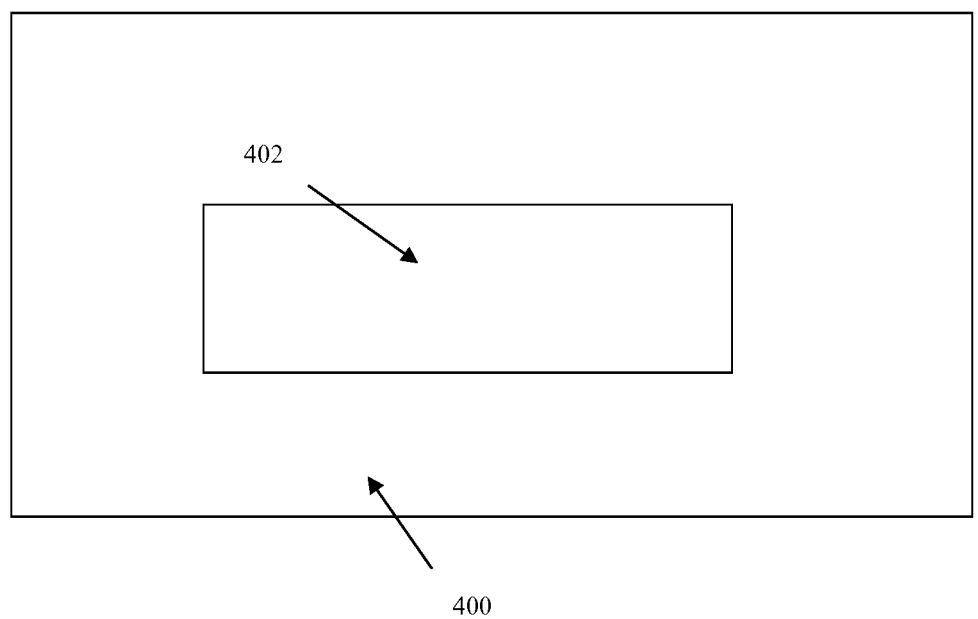
FIG. 25 shows an exemplary computer-readable medium.

An example of a non-transitory computer-readable medium is shown in FIG. 25. The computer readable medium (400) comprises statements and instructions (402) for execution by a computer to carry out a method in accordance with the present disclosure.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A non-transitory computer-readable memory having recorded thereon statements and instructions for execution by a computer to carry out a method of selecting a structure and parameters of an electrical circuit component (ECC), the ECC having design variables, the ECC further having performance metrics, each performance metric being a function of at least one design variable, the method comprising steps of:
   (a) storing an arrangement of pre-defined, hierarchically interconnected building blocks of the ECC into a building block database, each building block representing a sub-circuit of the ECC, each building block having respective input parameters, the building blocks including atomic blocks, compound blocks, and flexible blocks, each individual compound block having at least one of a first atomic block, a first compound block and a first flexible block, each individual flexible block having alternative building blocks selectable through a choice parameter of each individual flexible block, each alternative block including at least one of an second atomic block, a second compound block and a second flexible block, the arrangement of pre-defined, hierarchically interconnected building blocks representing candidate topologies of the ECC;
   (b) selecting candidate topologies from the building block database to obtain initial candidate topologies;
   (c) selecting initial parameters for the initial topologies to obtain sized initial candidate topologies;
   (d) calculating performance metric values for the sized initial candidate topologies to obtain calculated performance metric values;
   (e) in accordance with the calculated performance metric values, determining if the sized initial candidate topologies fail to meet pre-determined criteria;
   (f) while the sized initial candidate topologies fail to meet a pre-determined criteria, in accordance with a search algorithm:
      (i) searching the candidate topologies for other candidate topologies;
      (ii) selecting parameters for the other candidate topologies to obtain sized other candidate topologies;
      (iii) calculating performance metric values for the sized other candidate topologies to obtain other calculated performance metric values; and
      (iv) in accordance with the other calculated performance metric values, determining if the sized other candidate topologies fail to meet the pre-determined criteria;
   (g) storing, in an output database, sized candidate topologies, and their respective performance values, that do meet the pre-determined criteria; and
   (h) displaying, for selection, the sized candidate topologies that meet the pre-determined criteria.

2. The non-transitory computer-readable memory of claim 1, wherein the input parameters of a building block comprised within a parent compound block are a function of the input parameters of the parent compound block.

3. The non-transitory computer-readable memory of claim 1, wherein the input parameters of a building block comprised within a parent flexible block are a function of the input parameters of the parent flexible block.

4. The non-transitory computer-readable memory of claim 1, wherein the atomic blocks include a resistor, a wire, a capacitor, a four-port NMOS device, a four-port PMOS device, and a direct current voltage source.

5. The non-transitory computer-readable memory of claim 1, wherein the compound blocks include a three-port MOS device, the three-port MOS device having a flexible four-port MOS device and a first wire, the wire connecting two ports of the four-port MOS device, the flexible four-port MOS device having a four-port PMOS device and a four-port NMOS device.

6. The non-transitory computer-readable memory of claim 5, wherein the compound blocks include a two-port MOS diode, the two-port MOS diode including the three-port MOS device and a second wire, the second wire connecting two ports of three-port MOS device.

7. The non-transitory computer-readable memory of claim 5, wherein the compound blocks include a biased MOS device, the biased MOS device including the three-port MOS device, a direct current voltage source, and a second wire, the second wire connecting the direct current voltage source to a port of the three-port MOS device.

8. The non-transitory computer-readable memory of claim 1, wherein the search algorithm is an evolutionary search algorithm.

9. The non-transitory computer-readable memory of claim 8, wherein the evolutionary search algorithm has associated thereto a mutation operator and a crossover operator.

10. The non-transitory computer-readable memory of claim 9, wherein the crossover operator operates on a first sized candidate topology and a second sized candidate topologies by identifying a first sub-block in the first sized candidate topology and a corresponding second sub-block in the second sized candidate topology and by swapping the input parameters of the first sub-block with those of the second sub-block.

11. The non-transitory computer-readable memory of claim 1, wherein the pre-determined criteria is a single-objective criteria.

12. The non-transitory computer-readable memory of claim 1, wherein the pre-determined criteria is a multiple-objective criteria.

13. The non-transitory computer-readable memory of claim 1, wherein the arrangement of pre-defined, hierarchically interconnected building blocks of the ECC is stored in the building block database using a hardware description language.

14. The non-transitory computer-readable memory of claim 13, wherein the hardware description language includes one of VDL-AMS and Verilog-AMS.

15. The non-transitory computer-readable memory of claim 1, wherein the arrangement of pre-defined, hierarchically interconnected building blocks of the ECC is stored in the building block database using a programming language.

16. The non-transitory computer-readable memory of claim 1, wherein the sized candidate topologies contained in the output database form a pareto-optimal set.

17. The non-transitory computer-readable memory of claim 16, wherein the pre-determined criteria include specifications of the ECC, the method further comprising steps of:
   accessing the sized candidate topologies contained in the output database to obtain accessed sized topologies; and automatically generating a decision tree of specifications to topology in accordance with the accessed sized topologies.

18. The non-transitory computer-readable memory of claim 17, wherein automatically generating a decision tree includes automatically generating a CART tree.

19. The non-transitory computer-readable memory of claim 18, further comprising a step of displaying the CART tree.

20. The non-transitory computer-readable memory of claim 1, further comprising steps of:
- selecting, from the output database, a sized candidate topology to obtain a selected sized candidate topology;
- selecting a building block from the selected sized candidate topology to obtain a selected building block;
- randomly altering the selected building block to obtain a randomly altered selected building block;
- generating an additional sized altered candidate topology by making a copy of the selected sized candidate topology and by substituting therein the selected building block with the randomly altered selected building block;
- determining if the additional sized altered candidate topology meet the pre-determined criteria; and
- if the sized altered candidate topologies meet the pre-determined criteria, storing the sized altered candidate topologies in the output database.

* * * * *